(12) United States Patent
Onishi et al.

(10) Patent No.: US 8,670,578 B2
(45) Date of Patent: Mar. 11, 2014

(54) PIEZOELECTRIC ACTUATOR AND ELECTRONIC DEVICE

(75) Inventors: Yasuharu Onishi, Tokyo (JP);
Masatake Takahashi, Tokyo (JP);
Yasuhiro Sasaki, Tokyo (JP); Shigeo Satou, Tokyo (JP)

(73) Assignee: NEC Corporation, Tokyo (JP)

( * ) Notice: Subject to any disclaimer, the term of this patent is extended or adjusted under 35 U.S.C. 154(b) by 162 days.

(21) Appl. No.: 12/735,995

(22) PCT Filed: Mar. 5, 2009

(86) PCT No.: PCT/JP2009/054218
§ 371 (c)(1),
(2), (4) Date: Aug. 31, 2010

(87) PCT Pub. No.: WO2009/110575
PCT Pub. Date: Sep. 11, 2009

(65) Prior Publication Data
US 2011/0002485 A1   Jan. 6, 2011

(30) Foreign Application Priority Data

Mar. 7, 2008 (JP) .................................. 2008-058765

(51) Int. Cl.
*H04R 25/00* (2006.01)
*H04R 3/00* (2006.01)

(52) U.S. Cl.
USPC ............................ 381/173; 381/190; 381/114

(58) Field of Classification Search
USPC .......... 381/190, 173, 114, 145, 337, 152, 163
See application file for complete search history.

(56) References Cited

U.S. PATENT DOCUMENTS

| | | | | |
|---|---|---|---|---|
| 3,721,840 A | * | 3/1973 | Yamada | 310/334 |
| 4,430,529 A | * | 2/1984 | Nakagawa et al. | 381/190 |
| 7,167,570 B2 | * | 1/2007 | Kobayashi | 381/190 |
| 2005/0129261 A1 | * | 6/2005 | Ito et al. | 381/190 |
| 2006/0159295 A1 | * | 7/2006 | Onishi et al. | 381/190 |
| 2007/0189560 A1 | * | 8/2007 | Uenishi et al. | 381/191 |

FOREIGN PATENT DOCUMENTS

| | | | |
|---|---|---|---|
| JP | 61-168971 A | | 7/1986 |
| JP | 1-144371 A | | 6/1989 |
| JP | 2000-140759 A | * | 5/2000 |
| JP | 2001-17917 A | | 1/2001 |
| JP | 2001-339791 A | | 12/2001 |
| JP | 2006-81998 A | | 3/2006 |
| JP | 2006-253350 A | | 9/2006 |

* cited by examiner

*Primary Examiner* — Alexander Talpalatski
*Assistant Examiner* — Mangtin Lian
(74) *Attorney, Agent, or Firm* — McGinn Intellectual Property Law Group, PLLC

(57) ABSTRACT

A piezoelectric actuator 60 includes a piezoelectric element 10 expanding and contracting according to a state of an electric field, a pedestal 20, a vibration film 30, and a support member. In the vibration mode of the divided vibration occurring in the piezoelectric actuator in a high frequency band, one or more reinforcement members 50 are selectively disposed on an upper surface or a lower surface of the piezoelectric element 10, in a region where a node of divided vibration occurs. With such configurations, the vibration mode can be changed in the piezoelectric element 10. Therefore, in the frequency sound pressure level characteristics, the divided vibration causing hills or valleys (peaks or dips) can be effectively suppressed, thus enabling the achievement of flatness of frequency sound pressure level characteristics and of reproduction of excellent sound.

20 Claims, 38 Drawing Sheets

51-11,(51-12~51-16)
61-11,(61-12~61-16)
31-11
11-11
41-11
21-11

51-11,(51-12~51-16)
11-11
21-11
41-11
31-11
61-11,(61-12~61-16)

PIEZOELECTRIC ACTUATOR AND ELECTRONIC DEVICE

TECHNICAL FIELD

The present invention relates to a piezoelectric actuator to generate vibration by using a piezoelectric element and to an electronic device employing the piezoelectric actuator.

BACKGROUND TECHNOLOGY

Conventionally, as a driving source of an acoustic component such as a speaker, an electromagnetic actuator, owing to its easy handling, is widely used. The electromagnetic actuator is made up of a permanent magnet and a voice coil and vibration is generated by an action of a magnetic circuit of a stator using the permanent magnet. In an electromagnetic speaker using the electromagnetic actuator as a vibration source, a sound is produced by a vibration plate having low stiffness such as an organic film, which is connected to a vibration section of the electromagnetic actuator in a fixed manner. In recent years, demands for mobile phones, laptop personal computers, or a like are increasing, which also causes a gradually increased demand for a small-sized and power-saving type actuator. However, in the case of the electromagnetic actuator, it is necessary to allow large amounts of current to flow through a voice coil at time of operation, which causes a problem to occur in terms of power consumption and its configuration to be unsuitable structurally for achieving miniaturization and thinning. Additionally, in the electromagnetic actuator, in order to prevent a failure caused by a magnetic field leaked from the voice coil, magnetic shielding is required for application to an electronic device, which causes its configuration to be unsuitable for application to a small-sized electronic device such as a mobile phone. Furthermore, the miniaturization of the electromagnetic actuator causes a wiring material making up the voice coil to become small in size and, as a result, a resistance value of the wiring material increases, which produces a possibility of overheating of the voice coil.

To solve the above problems, as a thin-type vibration component other than the electromagnetic actuator, a piezoelectric actuator using a piezoelectric element such as piezoelectric ceramic as a driving source is being developed which has features of being small-sized, lightweight, power-thrifty, and non-leakage of the magnetic field. The conventional piezoelectric actuator is so configured as to produce mechanical vibration by movements of a piezoelectric element and has a structure in which the piezoelectric ceramic element (hereinafter, simply referred to as a piezoelectric element) is bonded to a pedestal.

By referring to FIGS. 57 and 58, basic configurations of the piezoelectric actuator manufactured according to related art are described below. FIG. 57 is a perspective view of the piezoelectric actuator according to the related art. FIG. 58 is a cross-sectional view schematically showing a mode of vibration occurring in the piezoelectric actuator in FIG. 57. As shown in FIG. 57, the piezoelectric actuator 550 includes the piezoelectric element 510 made of a piezoelectric ceramic, a pedestal 524 to which the piezoelectric element 510 is fixed, and a frame-like support member 527 to support a peripheral portion of the pedestal 524. By configuring as above, the piezoelectric element 510, when an AC current is applied thereto, performs an expanding and contracting movement. As shown in FIG. 58, the pedestal 524 is deformed, according to the expanding and contracting movements described above, into a convex mode shape (shown by a solid line) or into a concave mode shape (shown by a broken line) by using junction portions 524a at both sides of the pedestal 524 as their fulcrums. Thus, the pedestal 524 vibrates in up and down directions as shown in FIG. 58 using the junction portion 524a at both sides of the pedestal 524 as fixed ends and using the central portion of the pedestal as an antinode.

The piezoelectric actuator generally has a feature of being advantageous to achieving its thinning, however, also another aspect of being inferior in acoustic performance when compared with the electromagnetic actuator. This is attributable to the fact that, though a large amplitude can be obtained at a frequency close to a resonant frequency when compared with the case of the electromagnetic actuator owing to high stiffness and a high mechanical Q value (mechanical quality coefficient) of the piezoelectric element itself, the amplitude at a frequency other than the resonant frequency is small. Moreover, when the amplitude of vibration of the piezoelectric actuator is small, the sound pressure becomes also low, which means that sufficient sound pressure cannot be obtained in a wide frequency band (range) required for reproduction of music or the like. Also, the conventional piezoelectric actuator presents a problem that the occurrence of divided vibration caused by intrinsic resonance (high-order intrinsic resonance in particular) determined by its outer shape and stiffness of its materials causes a lowering of flatness of frequency characteristics of sound pressure level.

The divided vibration described here is a phenomenon in which the piezoelectric actuator, when vibrating, vibrates in a region divided at a local node of vibration at a non-uniform phase at an intrinsic resonant frequency. In other words, this is the phenomenon in which the vibration plate of the piezoelectric actuator does not vibrate in an integral manner as a whole, but vibrates partially in a random manner. FIG. 59 is a concept diagram showing the state of the occurrence of divided vibration in the piezoelectric actuator. Moreover, FIG. 60 is a schematic diagram to explain the state of divided vibration. That is, as shown in FIG. 60, when divided vibration occurs in the vibration plate of the piezoelectric actuator, a node of vibration occurs at the midpoint between fixed points at both sides and one vibration plate vibrates at a non-uniform phase. The occurrence of the divided vibration of this kind causes various inconveniences that sound other than an acoustic signal inputted into the piezoelectric actuator is produced and that sound pressure attenuates by phase interference in vibration regions (that is, divided region) whose phases differ from one another and, furthermore, peaks and dips (that is, hills and valleys) occur, thus causing a lowering of flatness of sound pressure level frequency characteristics, thus resulting in degradation of acoustic characteristics.

As technology to solve problems as described above, a piezoelectric actuator has been disclosed (for example, Patent References 1 and 2) in which a peripheral portion of a pedestal is so configured as to be supported by a beam which is relatively easily deformable to increase the vibration amplitude of the actuator. For the same purpose, another technology has been also disclosed (for example, Patent Reference 3) in which a plate spring having slits inserted along a circumference of the peripheral portion of a pedestal is fabricated to obtain a large vibration amplitude. Still another technology has been disclosed (Patent Reference 4) in which a peripheral portion of a pedestal is bonded to a support member with a bending-type supporter being interposed between the pedestal and support member and the range of frequency characteristics is made broad.

Patent Reference 1: Japanese Patent Application Laid-open No. Sho61-168971

Patent Reference 2: Japanese Patent Application Laid-open No. 2000-140759

Patent Reference 3: Japanese Patent Application Laid-open No. 2001-017917

Patent Reference 4: Japanese Patent Application Laid-open No. 2001-339791

DISCLOSURE OF THE INVENTION

Problems to be Solved by the Invention

However, the conventional piezoelectric actuators disclosed in the above Patent References 1 to 3 are intended to be mainly used as a vibrator for checking an incoming call to be installed on a mobile phone or a like and use for reproduction of music or voice as a speaker is not considered at all. That is, when the vibrator is used for checking an incoming call, the purpose is achieved only by expanding an amplitude of a specified frequency, however, if the vibrator is to be used as a speaker, characteristics in a wide frequency band should be taken into consideration. In a wide band of frequencies of, for example, 100 Hz to 10 kHz, which are required for reproduction of music, sound pressure level exceeding a predetermined level and frequency sound pressure level should be made flat.

The piezoelectric actuator disclosed in Patent Reference 4 has a configuration in which a pedestal restraining a piezoelectric actuator is bonded to a bending-type support member with the aim of causing displacement to occur in both directions of thickness and diameter of a piezoelectric ceramic. By using the bending-type supporter, reduction in stress dispersion and mechanical Q value in a characteristic region is made possible. By configuring as above, it is made possible to decrease warping and to lower basic resonant frequencies, however, vibration energy is dispersed due to the occurrence of vibration in the diameter and thickness directions. As a result, amounts of vibration in a direction of acoustic radiation required for reproduction of sound attenuation. Moreover, in sound pressure level frequency characteristics, hills and valleys (peaks and dips) occur in a high frequency band, thus presenting various problems in terms of acoustic characteristics.

Thus, when the piezoelectric actuator is to be used as an acoustic element to reproduce voice or music, not only to increase an amplitude only at a limited specified frequency, but to increase amounts of vibration within a range of desired frequency and to realize flatness of sound pressure level frequency characteristics are important. Moreover, the piezoelectric actuator has a disadvantage in that, though the amounts of vibration are large owing to its high stiffness and high mechanical Q value, the amounts of vibration attenuate rapidly in a band of a frequency other than a resonant frequency and, therefore, sufficient sound pressure level cannot be obtained at a frequency close to a resonant frequency (at a basic resonant frequency in particular). Moreover, the conventional piezoelectric actuator according to the related art has a disadvantage in that, high-order intrinsic resonance attributable to its shape and/or stiffness causes divided vibration to occur, resulting in decreasing flatness of sound pressure level frequency characteristics. Therefore, as methods for realizing excellent acoustic characteristics of the piezoelectric actuator, following measures are available:

(1) To decrease the basic resonant frequency of a piezoelectric actuator itself and to improve a sound pressure level in a low frequency band. (2) To achieve flatness of frequency sound pressure level characteristics by suppressing divided vibration.

The present invention has been made in light of the problems described above and has an object to provide a piezoelectric actuator which can provide large vibration amplitude and can reproduce excellent sound in a wide frequency band and an electronic device using the same.

Means for Solving Problem

To solve the above problems, the piezoelectric actuator according to the present invention has a piezoelectric element that expands and contracts according to the state of an electric field in which a reinforcement member to change a vibration mode of the piezoelectric element is placed on a part of a surface of the piezoelectric element corresponding to a vibration region thereof.

Effects of the Invention

With configurations of the piezoelectric actuator according to the present invention, a region where a node of vibration occurs is selectively reinforced at time of divided vibration and, therefore, flatness of frequency sound pressure level characteristics can be realized, thus enabling the achievement of excellent acoustic characteristics. The piezoelectric actuator according to the present invention is so configured that a pedestal to which a piezoelectric element is bonded is connected to a support member with a vibration film having stiffness lower than that of the pedestal interposed between the pedestal and support member and, as a result, large-amplitude vibration can be obtained and, when the piezoelectric actuator is used as an acoustic element, sound can be reproduced in a wide frequency band.

More specifically, the piezoelectric actuator according to the present invention is so configured to have the piezoelectric element that expands and contracts according to the state of an electric field and, in the vibration mode of the divided vibration occurring in the piezoelectric actuator in a high frequency band, by disposing selectively one or more reinforcement members in a region where a node of the divided vibration occurs, the vibration mode can be changed to effectively suppress the divided vibration. In the piezoelectric actuator configured as above, in the frequency sound pressure level characteristics, the divided vibration causing hills or valleys (peaks or dips) can be suppressed, thus enabling the achievement of flatness of frequency sound pressure level characteristics and of reproduction of excellent sound. Moreover, by disposing the reinforcement member by considering the vibration mode, peaks and dips occurring at a specified frequency can be selectively suppressed and adjustment for desired acoustic characteristics is made possible. Since a region where a node of vibration occurs and stress concentrates at time of vibration is reinforced, shock stability at time of drop is improved and reliability is made high. Since only part of the piezoelectric actuator is reinforced, changes in components or members of the piezoelectric actuator are not required, thus realizing ease of manufacturing. Furthermore, acoustic characteristics can be improved at low costs and the industrial application value of the piezoelectric actuator according to the present invention is high.

BRIEF DESCRIPTION OF DRAWINGS

FIG. 4A shows a bending-type vibration mode and FIG. 4B shows a piston-type vibration mode.

FIG. 9A is a top view of the piezoelectric actuator divided to a half and FIG. 9B is its vertical cross-sectional view.

FIG. 11A is its top view and FIG. 11B is its vertical cross-sectional view.

FIG. 12A is its top view and FIG. 12B is its vertical cross-sectional view.

FIG. 13A is its top view and FIG. 13B is its vertical cross-sectional view.

FIG. 14A is its top view and FIG. 14B is its vertical cross-sectional view.

FIG. 15A is its top view and FIG. 15B is its vertical cross-sectional view.

FIG. 18A is its top view and FIG. 18B is its vertical cross-sectional view.

FIG. 19A is its top view and FIG. 19B is its vertical cross-sectional view.

FIG. 20A is its top view and FIG. 20B is its vertical cross-sectional view.

FIG. 21A is its top view and FIG. 21B is its vertical cross-sectional view.

FIG. 22A is its top view and FIG. 22B is its vertical cross-sectional view.

FIG. 23A is its top view and FIG. 23B is its vertical cross-sectional view.

FIG. 24A is its top view and FIG. 24B is its vertical cross-sectional view.

FIG. 25B is its vertical cross-sectional view.

FIG. 26A is its top view and FIG. 26B is its vertical cross-sectional view.

FIG. 27A is its top view and FIG. 27B is its vertical cross-sectional view.

FIG. 28A is its top view and FIG. 28B is its vertical cross-sectional view.

FIG. 29A is its top view and FIG. 29B is its vertical cross-sectional view.

FIG. 31A is its top view and FIG. 31B is its vertical cross-sectional view.

Figure 1:
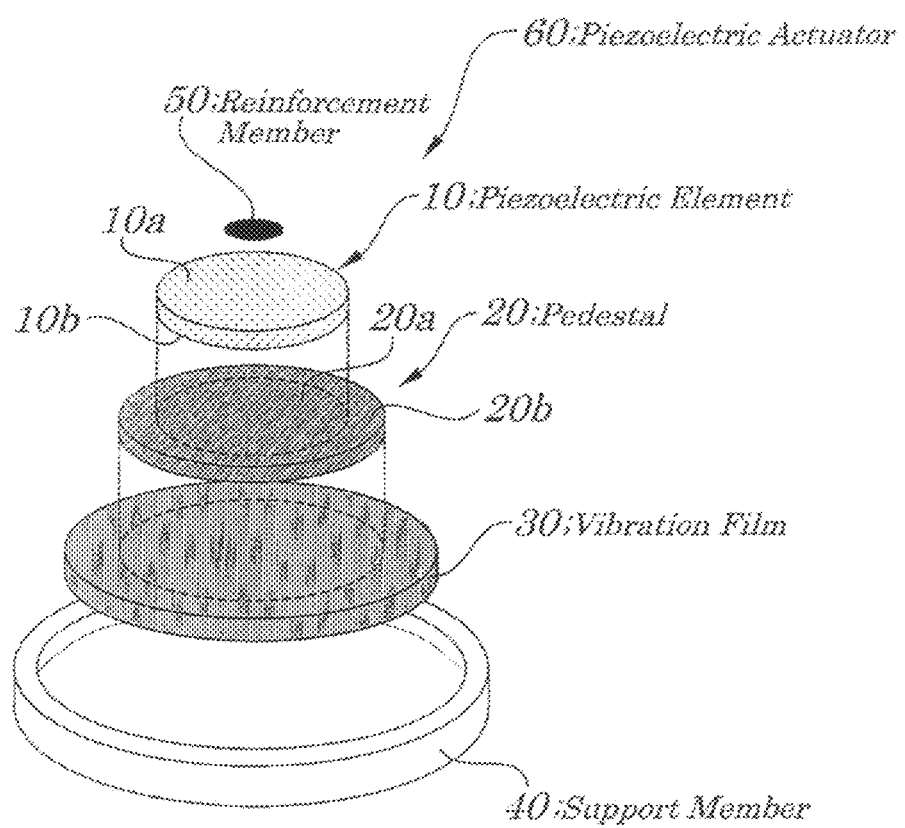
FIG. 1 is an exploded perspective view showing disassembled configurations of a piezoelectric actuator according to a first exemplary embodiment of the present invention.

EXPLANATION OF CHARACTERS 10, 11, and 12: Piezoelectric element
10a and 10b: Main surfaces
13: Piezoelectric plate
14: Electrode layer
14a: Upper electrode of piezoelectric element
14b: Lower electrode of piezoelectric element
15: Piezoelectric layer
20 and 21: Pedestal
20a: Restrained portion
20b: Non-restrained portion
30 and 31: Vibration film
40 and 41: Support member
50 and 51: Reinforcement member
60 and 61: Piezoelectric actuator
70: Mobile phone
$A_{30}$: Connecting region

BEST MODE OF CARRYING OUT THE INVENTION

Hereinafter, exemplary embodiments of the present invention are described by referring to drawings. Moreover, in each of the exemplary embodiments described below, same reference numbers are assigned to same composing elements and duplicated descriptions about these will be simplified or omitted.

First Exemplary Embodiment

Figure 2:
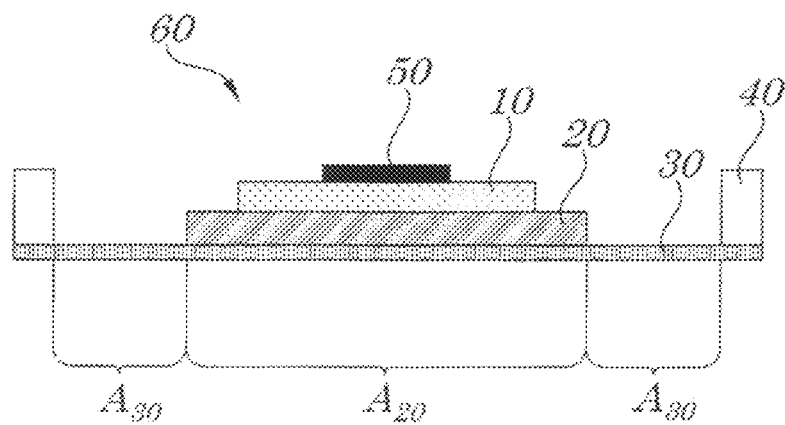
FIG. 2 is a vertical cross-sectional view of the piezoelectric actuator.

FIG. 1 is an exploded perspective view showing configurations of a piezoelectric actuator according to the first exemplary embodiment of the present invention. FIG. 2 is a vertical cross-sectional view of the piezoelectric actuator shown in FIG. 1. As shown in FIGS. 1 and 2, the piezoelectric actuator 60 of this embodiment is so configured that a piezoelectric element 10 having a circular shape serving as a vibration source, a pedestal 20 supporting the piezoelectric element 10, and a vibration film 30 supporting the pedestal 20 are stacked in layers in this order. All of the piezoelectric element 10, pedestal 20, vibration film 30, support member 40, and reinforcement member 50 are circular in shape and three components (that is, the piezoelectric element 10, pedestal 20, and vibration film 30) out of these are concentrically disposed so as to share a same center. Further, the peripheral portion of the vibration film 30 is connected to the support member 40 formed so that its cross section is of a square frame shape and the support member 40 is disposed centering on the border between the pedestal 20 and vibration film (not shown) of the piezoelectric element 10.

Figure 3A:
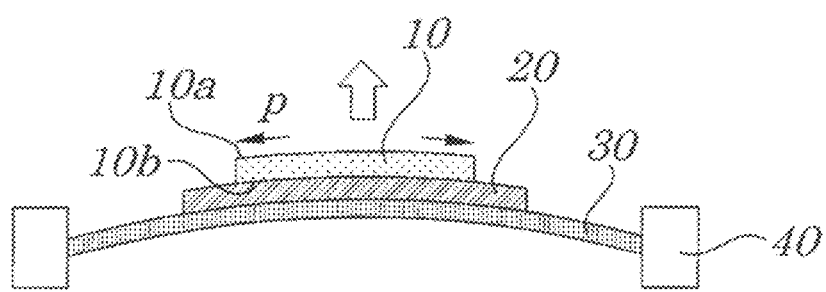
FIGS. 3A and 3B are diagrams explaining an operating principle of the piezoelectric actuator.
Figure 3B:
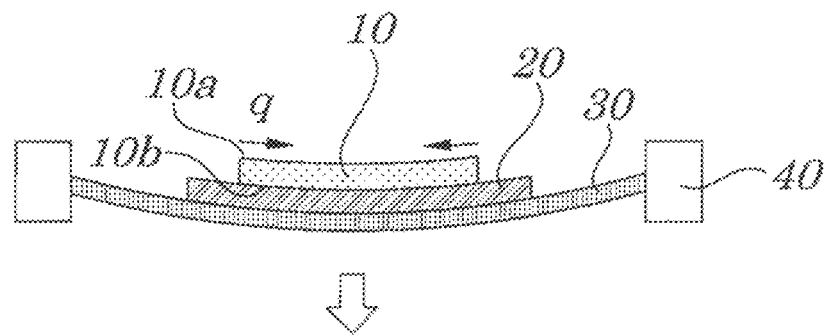

As described in further detail, the piezoelectric element 10 is made up of a piezoelectric plate (piezoelectric ceramic) having two main surfaces 10a and 10b being parallel and opposite to each other and an upper electrode layer (not shown) and a lower electrode layer (not shown) are formed respectively on the main surfaces 10a and 10b of the piezoelectric plate. The polarization direction of the piezoelectric plate with the piezoelectric element 10 is not limited to any direction, however, in this embodiment, the polarization direction of the piezoelectric plate is upward (in the upward and downward directions of the thickness of the piezoelectric element 10) as shown in FIGS. 3A and 3B. The piezoelectric element 10 configured as above, when an alternating electric field is applied to the upper electrode layer and the lower electrode layer, performs expanding and contracting movements (diameter expanding movements) in a radial direction in a manner in which its main surfaces 10a and 10b simultaneously expands or contracts. That is, as shown in FIG. 3 in which the operating principle of the piezoelectric actuator is explained, the piezoelectric element 10 performs repeated movements including a motion in a first deformation mode (see FIG. 3A) in which its main surfaces 10a and 10b expand and a motion in a second deformation mode (see FIG. 3B) in which its main surfaces 10a and 10b contract.

The pedestal 20 has the function of converting the above expanding and contracting movements of the piezoelectric element 10 into the up and down vibration movements as shown in FIGS. 3A and 3B. Therefore, the pedestal 20 is made up of an elastic body (that is, materials having expanding and contracting properties) including metal materials (for example, aluminum alloys, phosphor bronze, titanium, titanium alloys, iron-nickel alloys, copper-nickel alloys, magnesium alloys) or resin materials (for example, epoxy resin, acrylic resin, polyimide resin, polycarbonate resin, polyethylene terephthalate, polyester resin, polypropylene resin) and any material having stiffness lower than that of the ceramic material making up the piezoelectric element 10 can be widely used. On the upper surface of the pedestal 20 is fixed the main surface 10b (lower electrode layer) of the piezoelectric element 10, which makes the pedestal 20 restrain the piezoelectric element 10. In FIG. 1, on the pedestal 20, the region where the piezoelectric element 10 is bonded thereto is shown as a restrained portion 20a and the region other than the restrained portion 20a (including the restrained portion 20a) is shown as a non-restrained portion 20b.

The vibration film 30 is a film member employed to increase the vibration amplitude of the piezoelectric actuator and made of a material having stiffness lower than that of the pedestal 20. The materials for the pedestal 20 and vibration film 30 may be combined, for example, the pedestal 20 may be made of a metal material and the vibration film 30 may be made of a resin material (including a urethane resin, polyethylene terephthalate resin, polyester resin, polypropylene resin, or the like). Moreover, the pedestal 20 and vibration film 30 may be made of the same material and the vibration film 30 may be made relatively stiff by making the thickness of the vibration film 30 be small relatively. Furthermore, as a material for the vibration film 30, other than the above materials, paper, carbon fiber, or the like may be used. Also, the thickness of the vibration film 30, in the case of using the resin as its material, may be, for example, 5 μm or more and 500 μm or less. Particularly, the thickness of the vibration film 30, in the case of using a flat sheet as its material, is preferably 5 μm or more and 150 μm or less.

In the case of using the piezoelectric actuator as an acoustic element, in many cases, an organic film or the like is bonded to a vibration part (for example, pedestal 20) of the piezoelectric actuator so as to produce sound. Unlike the conventional case, according to the present exemplary embodiment, the vibration film 30 formed to increase the amplitude functions, as it is, as a vibration film. In other words, the vibration film 30 has not only a function of serving as the vibration film in the acoustic element described in the related art but also a function of increasing the vibration amplitude of the piezoelectric actuator. The configuration of the piezoelectric actuator according to the present exemplary embodiment differs from that of the related art (for example, Patent Reference 1). According to the configuration of the related art, the vibration amplitude is attempted to be increased by constructing a beam. According to the present invention, the vibration film 30, instead of the beam, is provided which enables large sound to be obtained. The acoustic element may be configured by bonding a common vibration film to a plurality of piezoelectric actuators each having a different resonant frequency so as to obtain an integrated one acoustic element. This enables ranges where sounds have a low sound pressure level to be complemented, thus achieving an acoustic element that can obtain high sound pressure at a wider range of frequencies.

The support member 40 is a member constructing, for example, an enclosure of the piezoelectric actuator and its material is not limited to any material and, therefore, a resin material or metal material may be employed. The reinforcement member 50 is a member to suppress divided vibration and a preferable effect by the use of the reinforcement member 50 can be increased by selecting a region where a node of vibration occurs. The materials for the reinforcement member 50 include metal materials (for example, an aluminum alloys, phosphor bronze, titanium, titanium alloy, iron-nickel alloys, copper-nickel alloys, magnesium alloys), resin materials (for example, epoxy resin, acrylic resin, polyimide resin, polycarbonate resin, polyethylene terephthalate, polyester, polypropylene), or the like. The materials are not limited to these. Moreover, the bonding between the piezoelectric element 10 and pedestal 20, between the pedestal 20 and vibration film 30, between the vibration film 30 and support member 40, and between the reinforcement member 50 and piezoelectric element 10 is made possible by using, for example, an epoxy-based bonding agent. There is no limitation to the thickness of each of the bonding agent layers at time of using the bonding agent. However, if the thickness is too large, an amount of vibration energy to be absorbed by the bonding agent layers increases, making it impossible to obtain a sufficient vibration amplitude. Therefore, it is preferable that the thickness of each of the bonding agent layers is 20 μm or less.

As shown in FIG. 2, the piezoelectric actuator 60 is so configured that its piezoelectric element 10 is placed on its pedestal 20 in a fixed manner and the pedestal 20 is supported through the vibration film 30 by the support member 40 with the pedestal 20 interposed between the vibration film 30 and support member 40. In the configuration (FIG. 57) of the related art, the pedestal 524 is directly supported by the support member 527. This is the different point between the present exemplary embodiment and related art. According to the present exemplary embodiment, the pedestal 20 is configured so as to be supported with the vibration film 30 interposed therebetween and, therefore, a larger vibration amplitude can be obtained when compared with the configuration of the related art and the mode of vibration comes near to a piston-type movement (described later by referring to FIG. 4B). Here, by referring to FIGS. 3A and 3B, a vibration generating mechanism of the piezoelectric actuator is also described. FIG. 2 shows a neutral state in which a voltage is not applied to the piezoelectric element 10 and when a predetermined voltage (electric field) is applied to the piezoelectric element 10, as shown by the arrow p in FIG. 3A, the piezoelectric element 10 is deformed in the direction in which its areas expand. Here, the lower surface (main surface 10*b*) of the piezoelectric element 10 is restrained by the pedestal 20 and, owing to the restrained effect, a difference occurs in amounts of deformation between the upper surface and lower surface of the piezoelectric element 10 and, as a result, the configuration of the piezoelectric element 10 gets into a convex-type deformation mode, as shown in FIG. 3A. In the deformation mode, the piezoelectric element 10, pedestal 20, and the vibration film 30 supporting the pedestal 20 are in a curved state in a manner in which all of them become convex as shown in FIG. 3A.

Then, when an electric field reversed to the above is applied to the piezoelectric element 10, as shown by the arrow q in FIG. 3B, the piezoelectric element 10 deforms in the direction in which its area decreases. Due to the restrained effect, a difference occurs in amounts of deformation between the upper surface and lower surface of the piezoelectric element 10 and, as a result, the configuration of the piezoelectric element 10 gets into a concave-type deformation mode, as shown in FIG. 3B. In the deformation mode, on the contrary to the above, the piezoelectric element 10, pedestal 20, and the vibration film 30 are in a curved state in a manner in which all of them become concave as shown in FIG. 3B.

The piezoelectric actuator 60 of the present exemplary embodiment, by repeatedly and alternately changing its deformation mode between the convex-type and concave-type deformation mode, makes its piezoelectric element 10, its pedestal (restrained member) 20, and its vibration film 30 move in upward and downward directions. The piezoelectric actuator 60 of the present exemplary embodiment and the piezoelectric actuator according to the related art (see FIG. 57), when compared with each other, are common in their motions. That is, the movement of the piezoelectric element is transferred to the pedestal 20, which excites upward and downward vibrations of these piezoelectric actuators. However, the motion of the piezoelectric actuator 60 of the present invention differs from that of the piezoelectric actuator according to the related art in that the pedestal 20 (and piezoelectric element 10) is supported through the vibration film 30 with the pedestal 20 interposed between piezoelectric element 10 and the vibration film 30 and this difference enables the effect described below to be obtained. In other words, the vibration film 30 is made of the member having stiffness lower than that of the pedestal 20 and, as a result, the vibration film 30 is liable to be deformed. Therefore, in the present invention, unlike the related art in which the peripheral portion of the pedestal 524 is directly supported by the support member 527, a larger vibration amplitude can be obtained.

Moreover, the piezoelectric actuator 60 of the present invention is configured to exist in a manner to be elongated in the horizontal direction (that is, in a manner to be parallel to the main surface of the piezoelectric element 10). Therefore, the inconvenience caused by inducing a large-scale actuator as a whole is less liable to occur. Furthermore, transfer of such a large driving force to the vibration film 30 causes the increase in amounts of vibration of the piezoelectric actuator 60. In the present exemplary embodiment, the reinforcement member 50 is disposed (put) on part of the vibration portion of the piezoelectric actuator 60. Particularly, the reinforcement member 50 is disposed selectively in a region where a node of divided vibration occurs and, by placing (putting) the reinforcement member 50, the divided vibration can be suppressed, thereby achieving the flatness of the frequency sound pressure level. Hereinafter, the relation among the divided vibration, acoustic characteristics, and the mode of divided vibration are described together.

Figure 5:
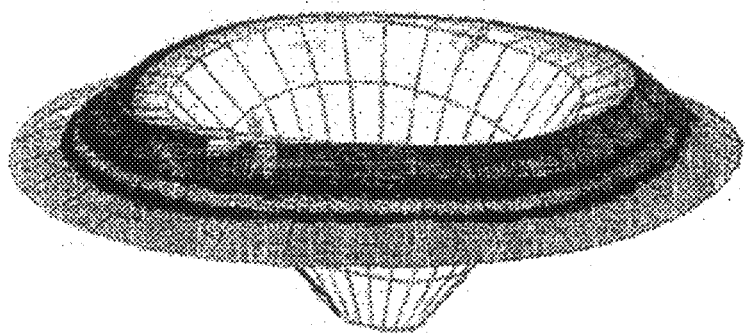
FIG. 5 is a diagram showing a mode of divided vibration of the piezoelectric actuator.
Figure 6A:
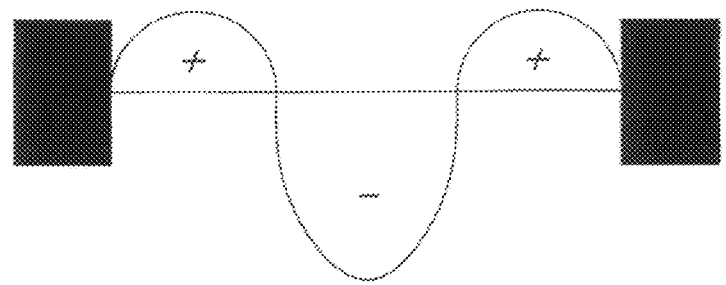
FIGS. 6A and 6B are diagrams showing the mode of divided vibration of the piezoelectric actuator.
Figure 6B:
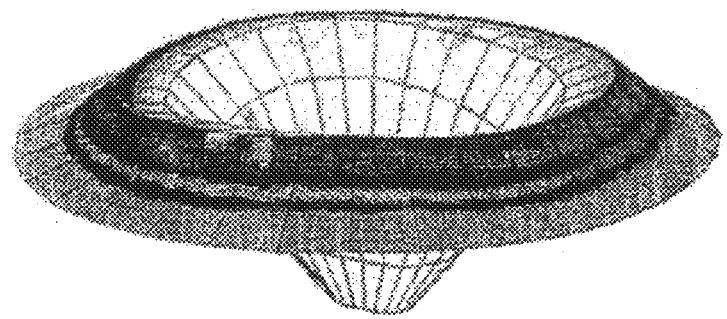

First, the relation between the divided vibration and acoustic characteristics is described. As shown in FIG. 5 illustrating the mode of divided vibration, the divided vibration occurs due to the superimposition of high-order vibration modes occurring after a basic resonant mode and, while the divided vibration occurs, there exists a large number of vibration modes in which upside-down motions occur on a radiation surface in a mixed manner. At the time of the occurrence of the vibration of the above type, unlike in the case of a piston-type movement in which a translational motion in the same direction (vibration mode occurring at a basic resonant mode) is produced on a surface as a whole, the efficiency rate of converting an input acoustic signal into an acoustic vibration greatly changes after and before the frequency at which the divided vibration occurs, which causes sound other than the acoustic signal to be generated, sound not to be generated at a predetermined frequency, sound to be emphasized, reproduced sound to be distorted, thus resulting in the occurrence of peaks and dips causing roughness of frequency sound pressure level characteristics. For example, as shown in FIGS. 6A and 6B illustrating the mode of vibration, the vibration configuration where modes of vibrations each having a different phase (identical phase and reverse phase) exist in a mixed manner is formed (see FIG. 6A). Therefore, in the piezoelectric actuator 60, the vibration film 30 has a distorted shape. In the acoustic radiation in the divided vibration, phase interference occurs in the vibration modes existing in the radiation face each in a mixed manner and having a different phase, resulting in the cancellation of the radiation sound. This means that sound attenuates and dips occur.

Figure 7:
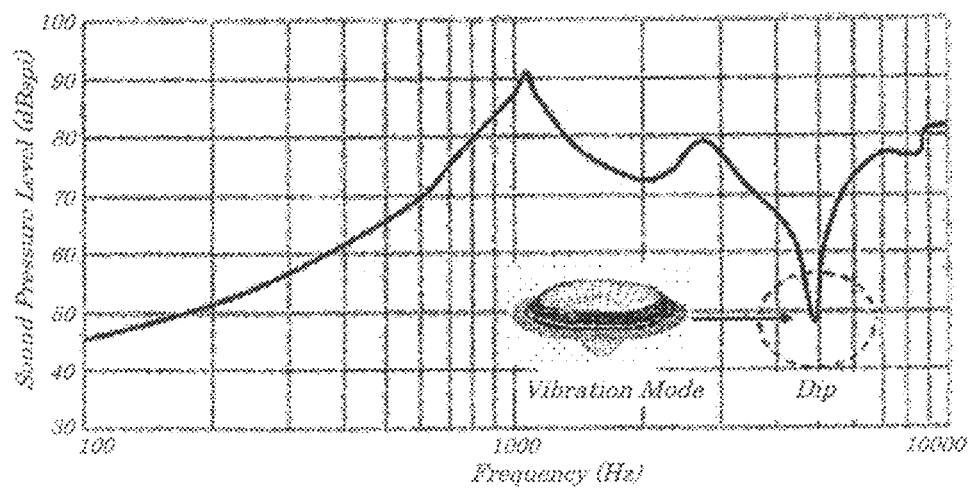
FIG. 7 is a diagram provided for explanation according to the first exemplary embodiment and showing acoustic characteristics of a generally-used piezoelectric actuator.

FIG. 7 is a diagram to explain the first exemplary embodiment and a characteristic diagram showing a relation between acoustic characteristics and vibration modes of the piezoelectric actuator 60 appearing when the divided vibration occurs. As shown in FIG. 7, in the range of frequencies between 100 Hz to about 1000 Hz, with the increase of the frequency, the sound pressure level normally rises. However, approximately at the frequency exceeding 1000 Hz, the divided vibration occurs, and approximately at the frequency exceeding 1000 Hz, peak (hills) start to occur and approximately at the frequency of 5000 Hz, dipps (valleys) occur. Therefore, how the divided vibration is suppressed is indispensible to the achievement of flat frequency sound pressure level characteristics.

Figure 8:
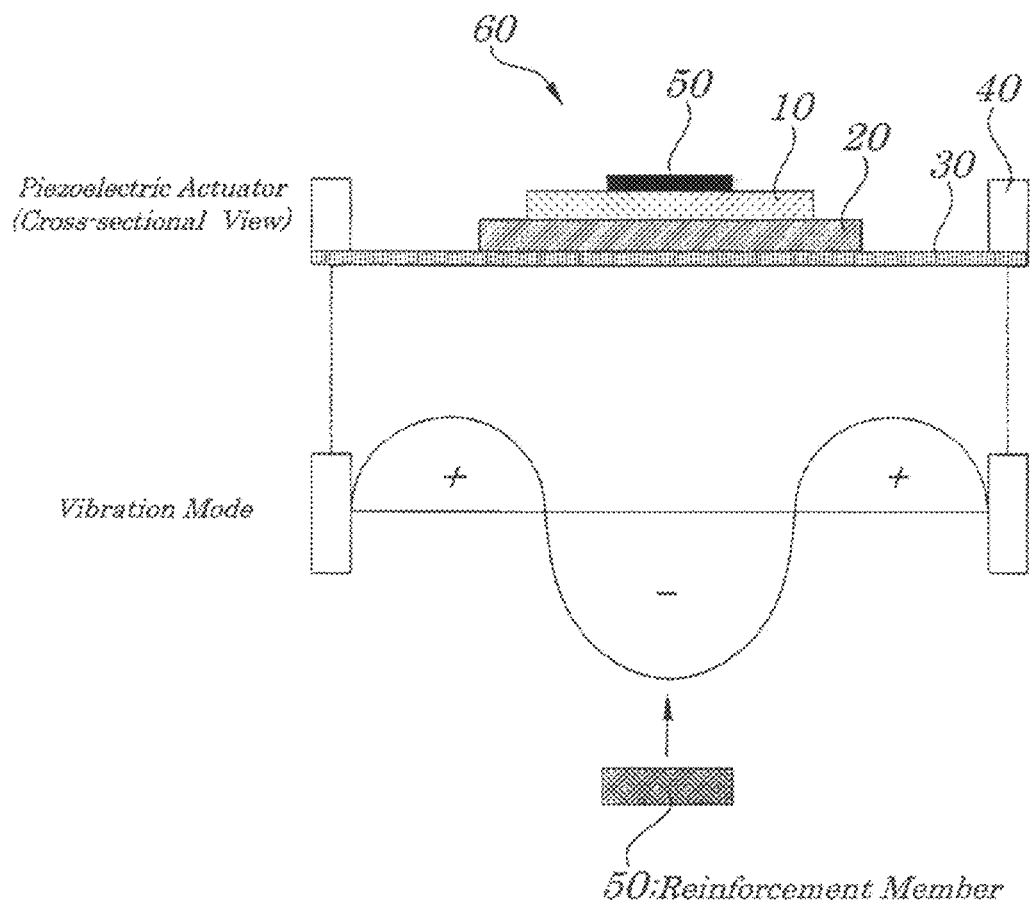
FIG. 8 is a vertical cross-sectional view showing configurations and vibration mode of the piezoelectric actuator according to the first exemplary embodiment of the present invention.

FIG. 8 is a vertical cross-sectional showing the configuration of the piezoelectric actuator according to the first exemplary embodiment and its vibration mode. According to the present invention, as shown in FIG. 8, by selectively displacing the reinforcement member 50 at a region where the node of vibration occurs, the cancellation of the radiation sound at the time of the occurrence of the divided vibration is suppressed to improve acoustic characteristics. Moreover, in the band (range) of the high frequency exceeding the basic resonance frequency, sound is radiated by the divided vibration and, therefore, it is essential to improve the acoustic radiation efficiency by changing the vibration mode.

Next, the relation between the vibration mode and frequency characteristic of the piezoelectric actuator 60 is described. The use itself of using a piezoelectric actuator as an acoustic element is already disclosed in related-art Patent References 1 to 3 explained above. However, the acoustic element disclosed in these related-art References refers to a buzzer or a vibrator. If the acoustic element is used only as the buzzer or vibrator, the simple improvement of the sound pressure at a specified frequency is enough, however, when the acoustic element is to be used as a speaker, it is necessary to consider the vibration mode of the piezoelectric actuator by taking its frequency characteristic into consideration.

Figure 4A:
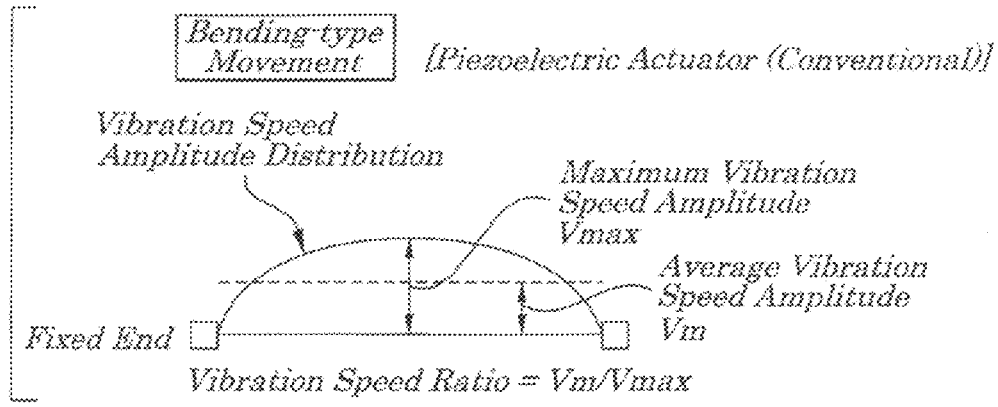
FIGS. 4A and 4B are schematic diagrams explaining a vibration mode of the piezoelectric actuator.
Figure 4B:
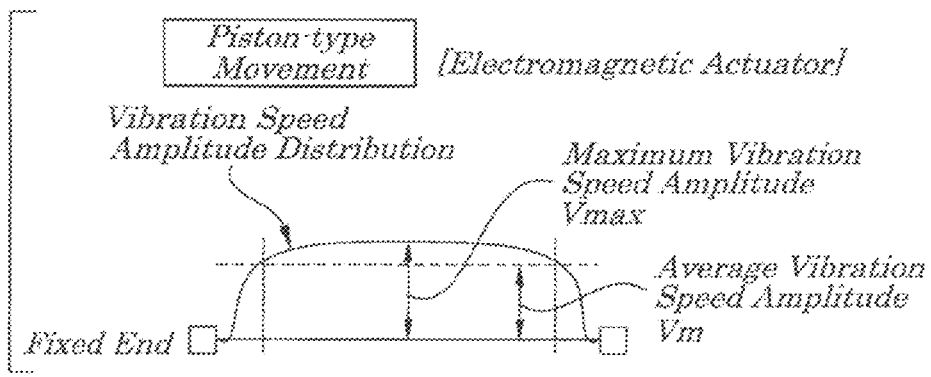
Figure 57:
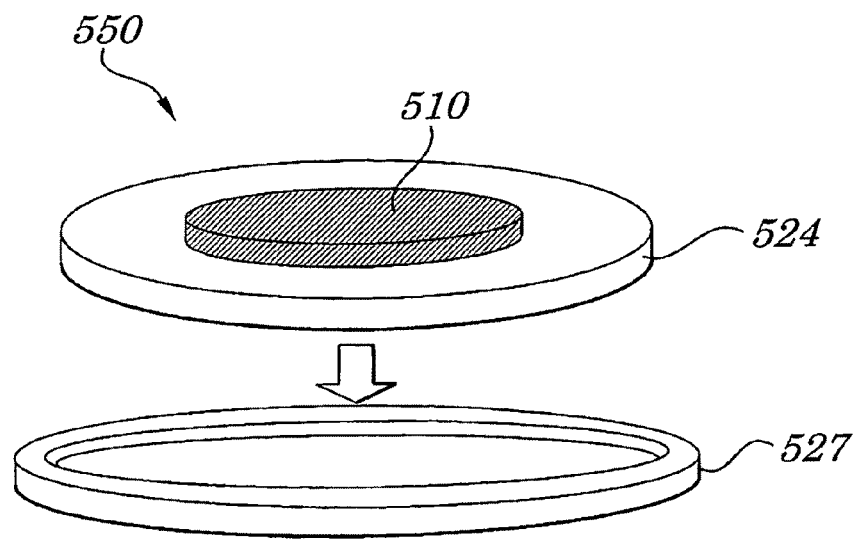
FIG. 57 is a perspective view showing configurations of a piezoelectric actuator according to a related art in which its peripheral portion of a pedestal is directly connected to a support material.
Figure 58:
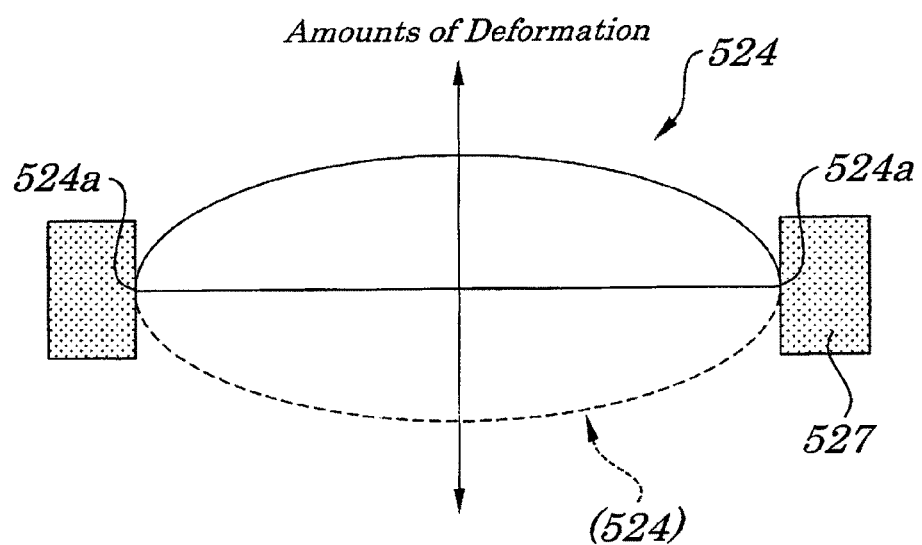
FIG. 58 is a vertical cross-sectional view schematically showing a mode of vibration of the piezoelectric actuator according to the related art.
Figure 59:
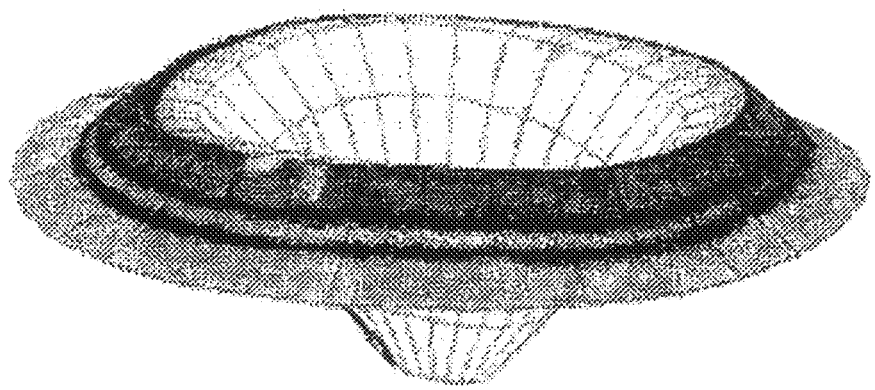
FIG. 59 is a diagram showing a mode of divided vibration, which is used for explaining the related art.
Figure 60:
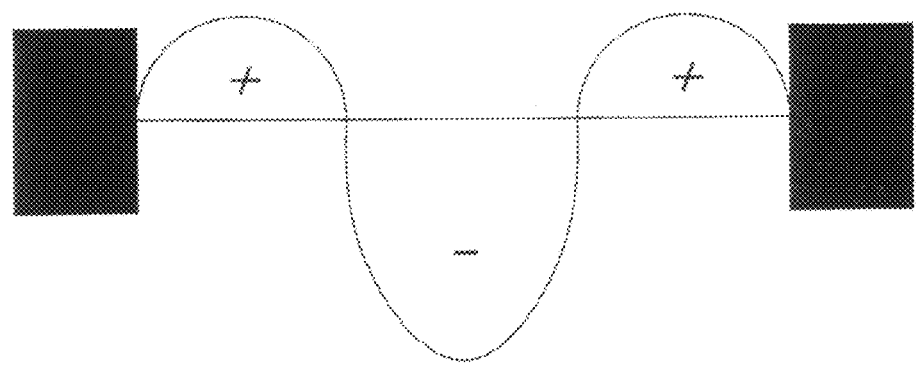
FIG. 60 is a diagram explaining a mode of divided vibration, which is used for explaining the related art.

FIG. 4A is a diagram showing the vibration mode of the piezoelectric actuator according to the related art as shown in FIGS. 57 and 58 and FIG. 4B is a diagram showing the vibration mode of an electromagnetic actuator. In the piezoelectric actuator according to the related art as shown in FIG. 4A, no reinforcement member is provided and, therefore, the vibration amplitude distribution line forms a bended shape in a central portion shown, as an example, by the symbol $A_{20}$ in FIG. 2, where a reciprocal movement occurs in up and down directions as shown in FIG. 4A which generates the vibration mode providing a bending-type movement. In the electromagnetic actuator as shown in FIG. 4B, while the vibration amplitude distribution line keeps an almost flat shape in the central portion $A_{20}$, a reciprocal movement in up and down directions occurs shown in FIG. 4B which generates the vibration mode providing the piston-type movement. It is known that, in order to improve frequency characteristics, vibration mode providing the piston-type movement is desirously performed with the flat shape kept in the central portion $A_{20}$ as long as possible.

Next, features of the bending-type movement (a) and the piston-type movement (b) are described by referring to FIGS. 4A and 4B. As shown in FIG. 4A, in the vibration mode providing the bending-type movement occurring in the piezoelectric actuator according to the related art, the vibration amplitude distribution line of the piezoelectric ceramic forms a mountain shape and provides the maximum displacement bending point in the central portion and, therefore, a large amplitude can be obtained in its central portion, however, in a portion nearer to a fixed end, the displacement in vibration attenuates relatively. In the vibration mode providing the piston-type movement, as shown in FIG. 4B, the vibration amplitude distribution line in the vibration mode of the piezoelectric ceramic forms a trapezoidal shape providing the maximum displacement bending point in a portion near to the fixed end and the amplitude of vibration rises sharply in the portion near to the fixed end. When amounts of vibration displacement in these two vibration modes (that is, bending-type and piston-type movements) are compared, the maximum vibration amount on an acoustic radiation surface in the bending-type movement is advantageous than that in the piston-type movement. However, in the case of the vibration mode providing the piston-type movement, the average vibration amount is larger at the fixed end when compared with the vibration mode showing the bending-type movement and, therefore, the piston-type movement is advantageous than the bending-type movement. Moreover, ordinarily, the sound pressure is defined by the amount of volume excluded on the radiation surface and, therefore, when the average vibration amount is large, the sound pressure is high and it is preferable that the piston-type vibration mode is promoted to improve the sound pressure level. Each of the piston-type movement and bending-type movement can be defined by a rate of an average displacement amount to maximum displacement amount and, in the expression shown by (average vibration/maximum vibration amount), as the obtained value comes nearer to 1, the vibration mode providing the piston-type movement is promoted. Details of these will be explained later in the evaluation 5 of examples of the present invention.

According to the configurations of the present exemplary embodiment, as shown in FIG. 2, the region in which the pedestal is bonded is the region corresponding to $A_{20}$ and, outside the region $A_{20}$, the connecting region $A_{30}$ being lower in stiffness (that is, being liable to be deformed) than the region $A_{20}$ occurs. As a result, relatively large deformation occurs in the connecting region $A_{30}$ which enables the vibration mode, as a whole, to provide the movement resembling the piston-type movement. Moreover, the configuration in which the connecting region $A_{30}$ serving as the peripheral portion of the region $A_{20}$ in which the pedestal 20 is bonded is made up of the member having low-stiffness leads to a low resonant frequency of the vibration plate (referring to the layered body made up of the pedestal 20 and vibration film 30) when compared with the configurations of the related art in which the pedestal 20 is connected directly to the support member. The lowering of the resonant frequency of the vibration plate also leads to the improvement of frequency characteristics of an acoustic element as described below.

An acoustic element is relatively difficult to produce sufficiently large sound at a frequency less than the basic resonant frequency f0 and, therefore, only the sound in a frequency band exceeding the resonant frequency f0 is used as a reproducible sound in many cases. Concretely, in the case where the resonant frequency f0 of the piezoelectric actuator is in a high frequency band (for example, 2 kHz), more simply, only the sound having a frequency of 2 kHz or more can be produced by the acoustic element.

On the other hand, it is preferable that the frequency band required for reproducing music by using a mobile phone is 1 kHz to 10 kHz. Therefore, the piezoelectric actuator is suitable for mobile phones or the like and, particularly, the actuator, if it is advantageous in miniaturization, provides a very high value in use. However, in the piezoelectric actuator, a ceramic having high stiffness is used as the material for the piezoelectric element and, as a result, the basic resonant frequency is high and low sound is difficult to be produced. Moreover, it can be though that, by increasing an element in size, apparent stiffness of the piezoelectric element is lowered to decrease the basic resonant frequency. However, as described above, the piezoelectric actuator, since it is widely installed in small-sized electronic devices such as mobile phones, from the view point of preventing electronic devices from increasing in scale, is preferably configured so that low sound is easily produced without changing the element size.

In conclusion, in order to reproduce high-quality sound in a wider frequency band in mobile phones or the like, three points are of importance which include the improvement of a sound pressure level in a low frequency band by setting the basic resonant frequency f0 of the piezoelectric actuator at a low level, the achievement of flatness in frequency sound pressure level characteristics, that is, the suppression of the occurrence of sharp peaks and dips of the sound pressure level in a predetermined frequency band, and the improvement of a sound pressure level in a band of a frequency other than the basic resonant frequency. The suppression of the divided vibration is an effective means to achieve the frequency sound pressure level characteristics. Moreover, lowering of stiffness in the vibration plate is an effective means to decrease the basic resonant frequency f0.

According to the configurations of the present exemplary embodiment, by disposing the reinforcement member 50 in a portion in which a node of vibration occurs, the occurrence of the divided vibration, sharp peaks and dips in the sound pressure level occurring at the time of the divided vibration can be suppressed and the flatness of the frequency sound pressure level can be achieved. Moreover, by using the vibration film 30 having stiffness lower than that of the pedestal 20 as the member to connect the pedestal 20 and support member 40 and by changing a shape of the support member 40, an area occupied by the vibration film having low stiffness can be increased, thus resulting in the decrease in the basic resonant frequency. Therefore, in the piezoelectric actuator according to the present exemplary embodiment, a sufficient vibration amplitude can be obtained in a wide frequency band and, when used as an acoustic element, excellent frequency characteristics can be realized.

Furthermore, the piezoelectric actuator according to the present exemplary embodiment has advantages, in addition to the above, as described below. First, acoustic characteristics of the piezoelectric actuator can be easily adjusted by changing, as appropriate, the shape and materials for the reinforcement member 50. Owing to these, unlike in the conventional case, the configuration change of the piezoelectric ceramic, elastic member, and vibration film is not required to adjust the acoustic characteristics, which is advantageous to the improvement of manufacturing stability and to reduction in manufacturing costs. Moreover, the reinforcement member 50 is selectively disposed in a node of vibration where stress concentration occurs at the time of drop, thus enabling shock stability to be improved at the time of drop.

Furthermore, conventionally, in order to decrease the basic resonant frequency of a piezoelectric actuator, the piezoelectric element is made thin in some cases. However, in the piezoelectric actuator according to the present exemplary embodiment, even if the piezoelectric element having a relatively high thickness is used, by adjusting the material for the vibration film, relation between the support member and restrained member, by selecting the shape of the reinforcement member, and by using an inertia effect, it is possible to decrease the basic resonant frequency. In general, when a thin electric element is to be manufactured, cracking, warping, or the like occur at the stage of baking of ceramics, which increases relative costs. Unlike in the conventional case, according to the piezoelectric actuator according to the present exemplary embodiment, there is no need for preparing such a thin piezoelectric actuator, which suppresses the increase in manufacturing costs.

Also, the piezoelectric actuator according to the present exemplary embodiment can be used as a sound source for electronic devices (for example, a mobile phone, notebook type personal computer, small-sized game device, or the like). Conventionally, when the piezoelectric actuator using ceramics is dropped, breakage occurs in the piezoelectric element in some cases. On the other hand, in many cases, a user erroneously drops the portable-type electronic device as described above while in use and, therefore, it has been thought that the piezoelectric actuator according to the related art is not suitable for the portable-type devices. However, in the piezoelectric actuator according to the present exemplary embodiment, the pedestal 20 having the piezoelectric element 10 in a fixed manner is supported by the support member 40 having low stiffness with the vibration film 30 interposed between the pedestal 20 and support member 40 and, therefore, even when the piezoelectric actuator is dropped, the shock is absorbed by the shock attenuation property of the vibration film and the piezoelectric element 10 is difficult to be broken. Thus, the piezoelectric actuator according to the present exemplary embodiment can be suitably used for portable electronic devices.

Second Exemplary Embodiment

Figure 9A:
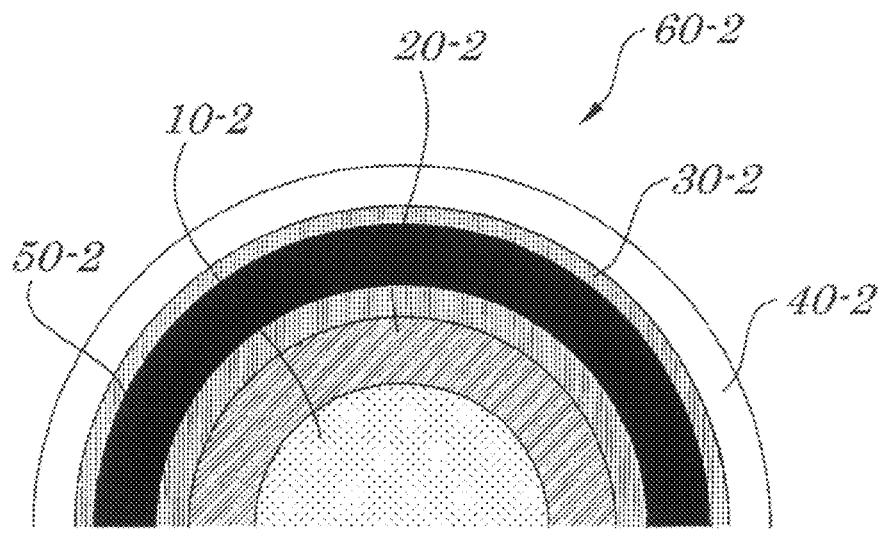
FIGS. 9A and 9B are diagrams showing configurations of the piezoelectric actuator according to a second exemplary embodiment of the present invention.
Figure 9B:
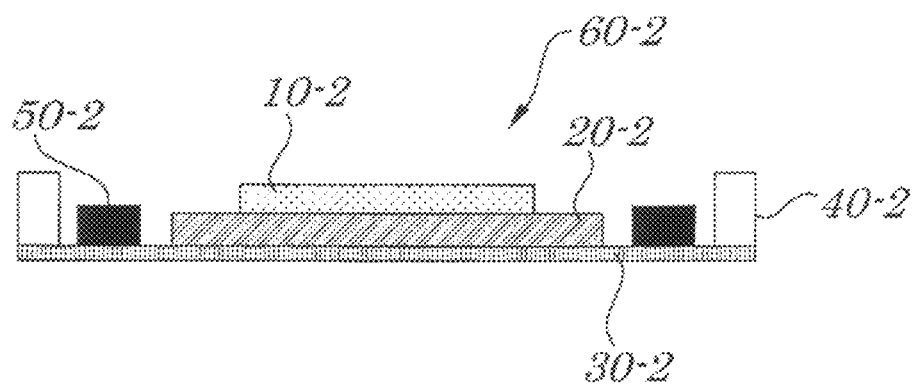

Configurations of a piezoelectric actuator according to the present exemplary embodiment are not limited to those shown in the first exemplary embodiment and the piezoelectric actuator according to the second exemplary embodiment may have the configuration shown in FIGS. 9A and 9B. FIG. 9A is a top view showing configurations of the piezoelectric actuator according to the second exemplary embodiment of the present invention and FIG. 9B is a vertical cross-sectional view of the piezoelectric actuator. In the piezoelectric actuator 60-2 shown in FIGS. 9A and 9B, a hollow reinforcement member 50-2 is bonded to a vibration film 30-2.

Figure 10:
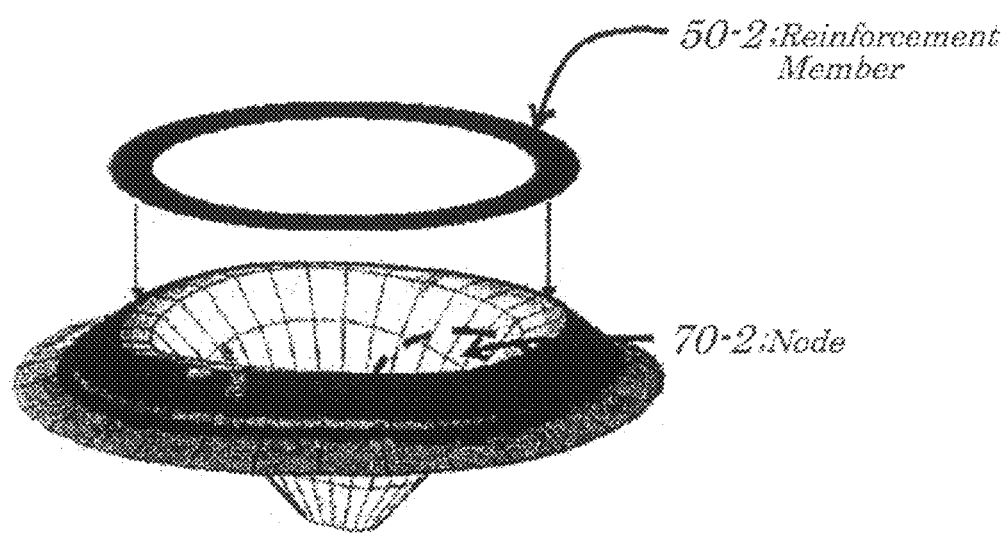
FIG. 10 is a diagram schematically showing a placement position of a reinforcement member in the piezoelectric actuator.

FIG. 10 is a diagram schematically showing the placement position of the reinforcement member 50-2 in the piezoelectric actuator 60-2 according to the second exemplary embodiment shown in FIGS. 9A and 9B. That is, in the vibration mode for divided vibration shown in FIG. 10, the reinforcement member 50-2 is disposed to reinforce the node portion 70-2 where a node of vibration occurs. The reinforcement member 50-2 is made of phosphor bronze and configurations other than the reinforcement member 50-2 are the same as in the first exemplary embodiment. Thus, in the second exemplary embodiment, so long as the reinforcement member 50-2 is disposed in the portion where a node of vibration occurs, there is no limitation to its shape and/or its placement position. By configuring the piezoelectric actuator 60-2 of the second exemplary embodiment as above, divided vibration can be suppressed and, as a result, frequency sound pressure level characteristics can be flattened.

Third Exemplary Embodiment

Figure 11A:
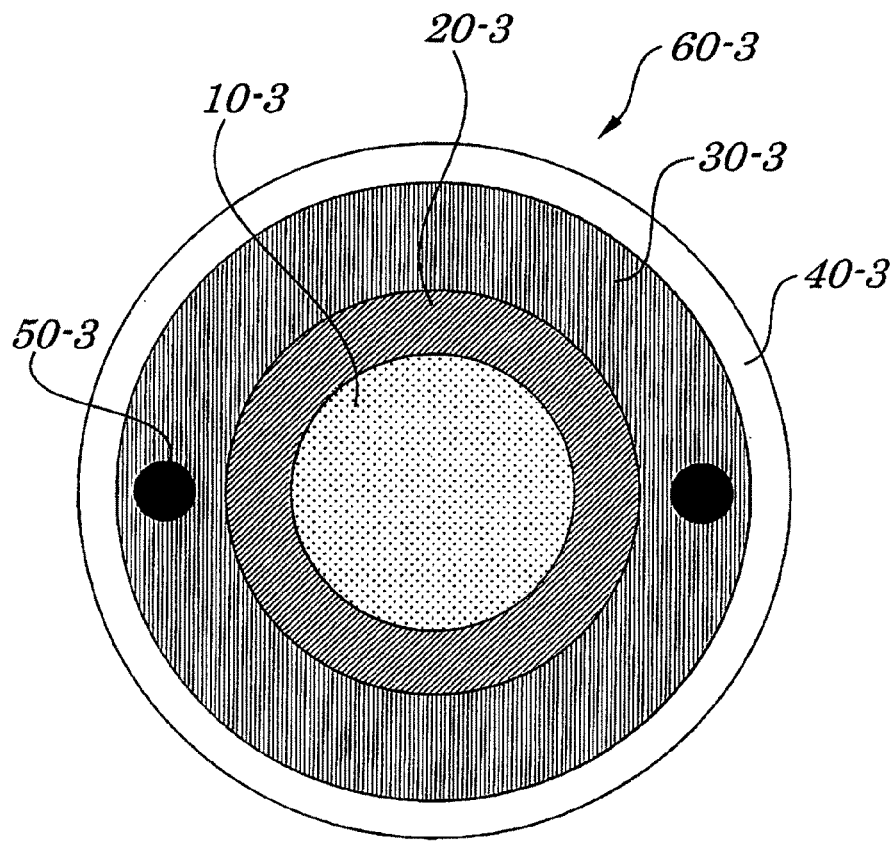
FIGS. 11A and 11B are diagrams showing configurations of a piezoelectric actuator according to a third exemplary embodiment of the present invention.
Figure 11B:
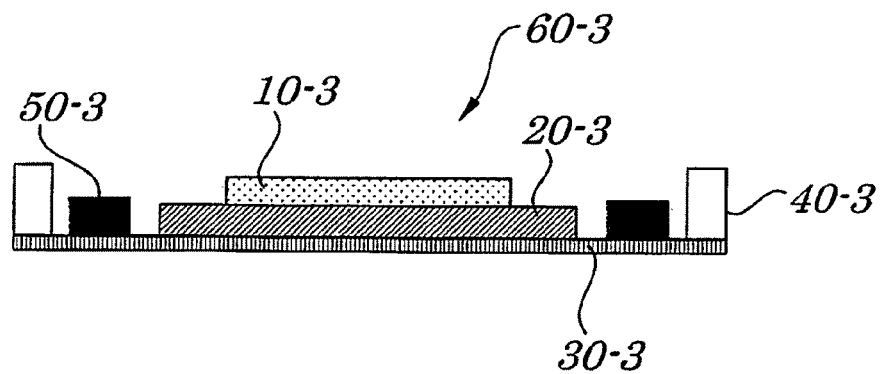

Configurations of the piezoelectric actuator according to the present exemplary embodiment are not limited to those shown in the first and second exemplary embodiments and the piezoelectric actuator according to the third exemplary embodiment may also have the configuration shown in FIGS. 11A and 11B. That is, FIG. 11A is a top view showing configurations of the piezoelectric actuator according to the third exemplary embodiment of the present invention and FIG. 11B is a vertical cross-sectional view of the piezoelectric actuator 60-3. In the piezoelectric actuator 60-3 shown in FIGS. 11A and 11B, two reinforcement members 50-3 are disposed in a manner to be symmetric about the midpoint of the piezoelectric actuator 60-3. The reinforcement members 50-3 are made of phosphor bronze and the configurations other than the reinforcement members 50-3 are the same as in the first exemplary embodiment. Thus, in the third exemplary embodiment, so long as the reinforcement members 50-3 are disposed in the portion where a node of vibration occurs, there is no limitation to its shape, its placement position, and/or its number of pieces. Particularly, by displacing a plurality of reinforcement members 50-3 in a divided manner, it is made possible to raise working accuracy of the reinforcement members 50-3 and to facilitate the manufacturing of the piezoelectric actuator 60-3, thus resulting in a decrease in costs of the piezoelectric actuator 60-3.

Fourth Exemplary Embodiment

Figure 12A:
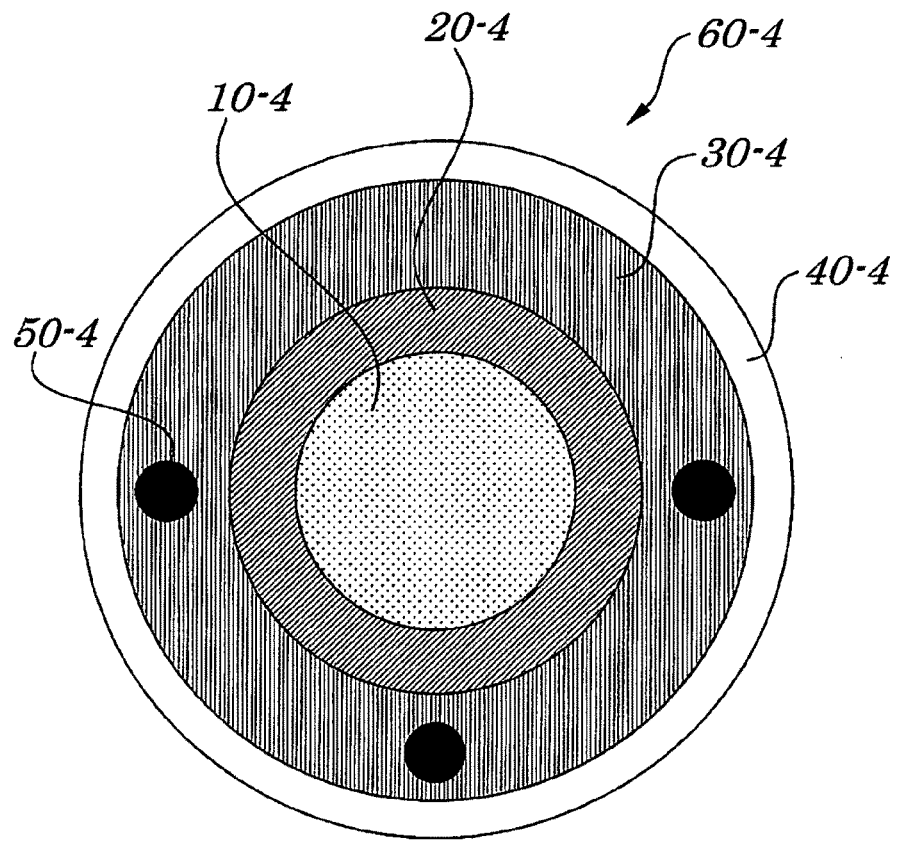
FIGS. 12A and 12B are diagrams showing configurations of a piezoelectric actuator according to a fourth exemplary embodiment of the present invention.
Figure 12B:
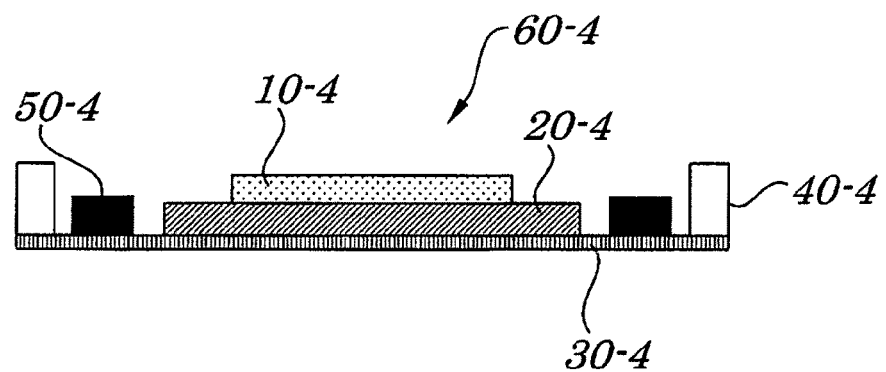

Configurations of the piezoelectric actuator according to the present exemplary embodiment are not limited to those shown above and the piezoelectric actuator according to the fourth exemplary embodiment may also have the configuration shown in FIGS. 12A and 12B. That is, FIG. 12A is a top view showing configurations of the piezoelectric actuator 60-4 of the fourth exemplary embodiment of the present invention and FIG. 12B is a vertical cross-sectional view of the piezoelectric actuator 60-4. In the piezoelectric actuator 60-4 shown in FIGS. 12A and 12B, three reinforcement members 50-4 are disposed in a manner to be symmetric about the midpoint of the piezoelectric actuator 60-4. The reinforcement members 50-4 are made of phosphor bronze and the configurations other than the reinforcement members 50-4 are the same as in the first exemplary embodiment. Thus, in the fourth exemplary embodiment, so long as the reinforcement members 50-4 are disposed in the portion where a node of vibration occurs, there is no limitation to its number of pieces. The reinforcement members 50-4 may have any shape including a spherical shape, rectangular parallelepiped shape, or cubic shape. Particularly, by disposing the reinforcement members 50-4 in a manner to be asymmetric, the divided vibration can be effectively suppressed, whereby the area and number of pieces of the reinforcement members 50-4 can be reduced. Moreover, by placing the reinforcement members 50-4 in a manner to be asymmetric, the regularity in the vibration region can be decreased at the time of the occurrence of divided vibration, thus resulting in the suppression of the attenuation of sound pressure level caused by phase interference.

Fifth Exemplary Embodiment

Figure 13A:
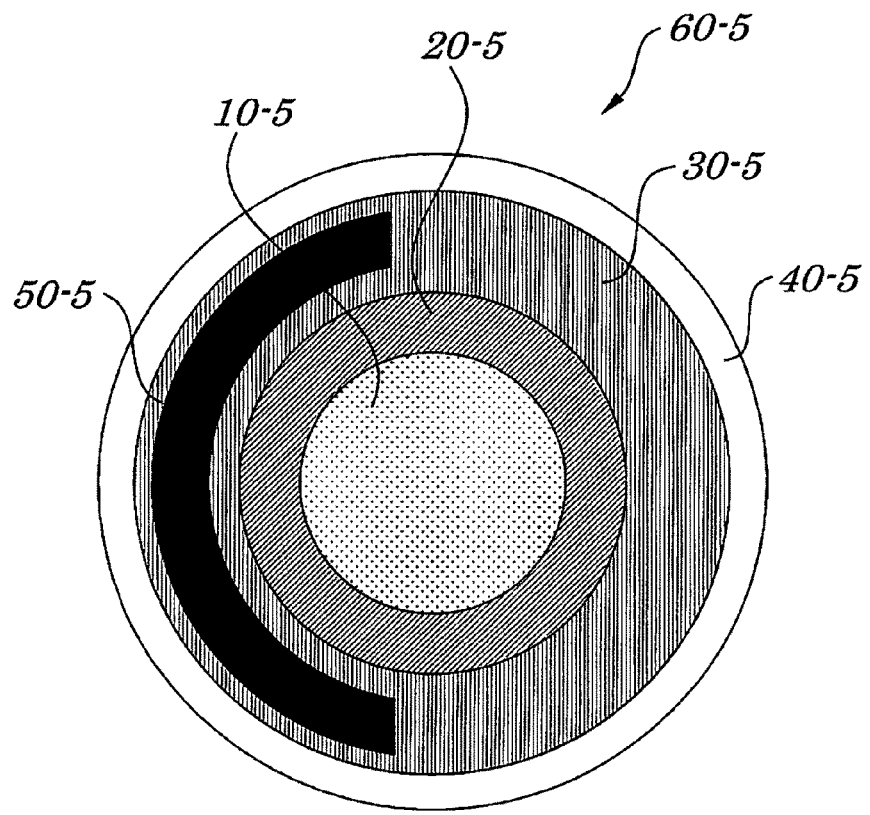
FIGS. 13A and 13B are diagrams showing configurations of a piezoelectric actuator according to a fifth exemplary embodiment of the present invention.
Figure 13B:
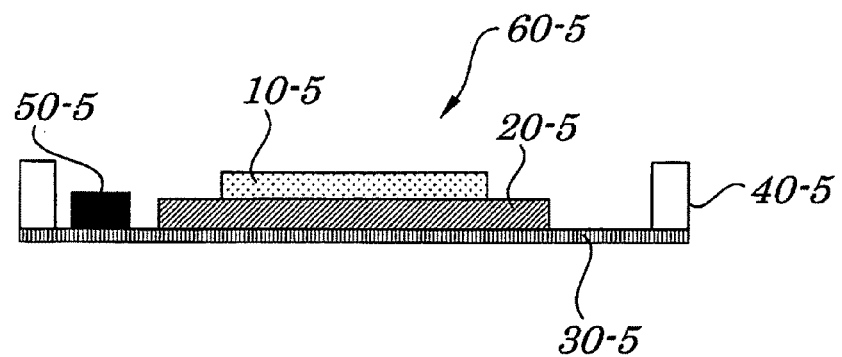

Configurations of the piezoelectric actuator according to the present exemplary embodiment are not limited to those shown above and the piezoelectric actuator according to the fifth exemplary embodiment may also have the configuration shown in FIGS. 13A and 13B. That is, FIG. 13A is a top view showing configurations of the piezoelectric actuator 60-5 of the fifth exemplary embodiment of the present invention and FIG. 13B is a vertical cross-sectional view of the piezoelectric actuator 60-5. In the piezoelectric actuator 60-5 shown in FIGS. 13A and 13B, a semicircular and hollow reinforcement member 50-5 is bonded to a vibration film 30-5. The reinforcement member 50-5 is made of phosphor bronze and the configurations other than the reinforcement member 50-5 are the same as in the first exemplary embodiment. Thus, in the fifth exemplary embodiment, so long as the reinforcement member 50-5 is disposed in the portion where a node of vibration occurs, there is no limitation to its number of pieces and/or its placement position. By configuring the piezoelectric actuator 60-5 of the fifth exemplary embodiment as above, the divided vibration can be suppressed and flat frequency sound pressure level characteristics can be realized. By configuring the piezoelectric actuator 60-5 of the sixth exemplary embodiment as above, the divided vibration can be suppressed and flat frequency sound pressure level characteristics can be realized.

Sixth Exemplary Embodiment

Figure 14A:
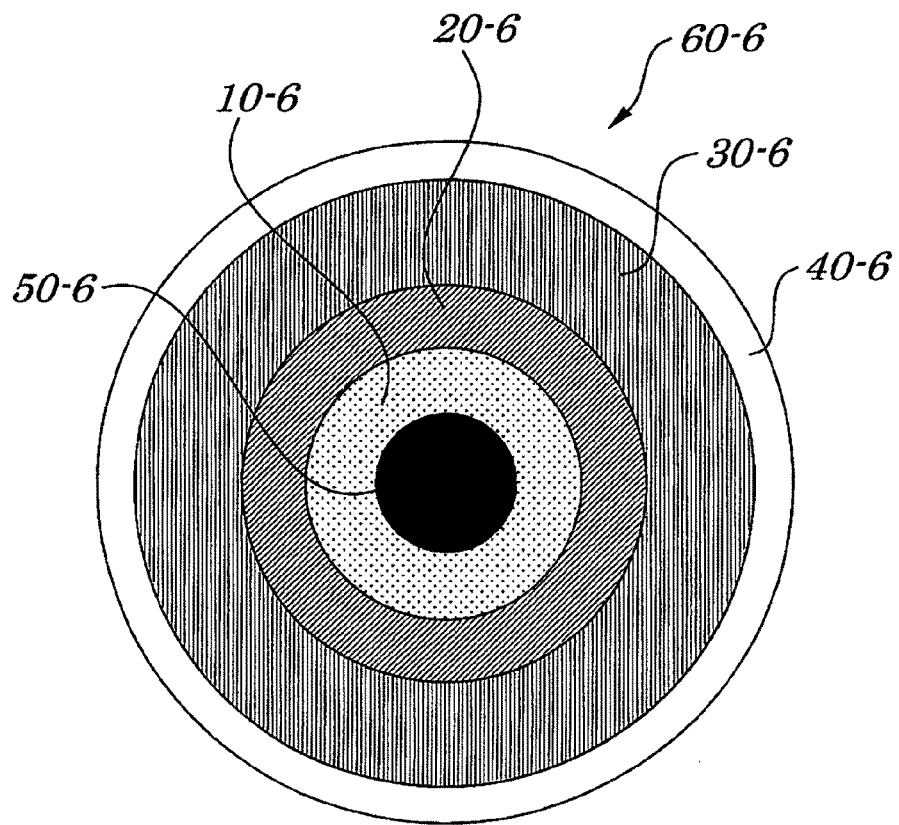
FIGS. 14A and 14B are diagrams showing configurations of a piezoelectric actuator according to a sixth exemplary embodiment of the present invention.
Figure 14B:
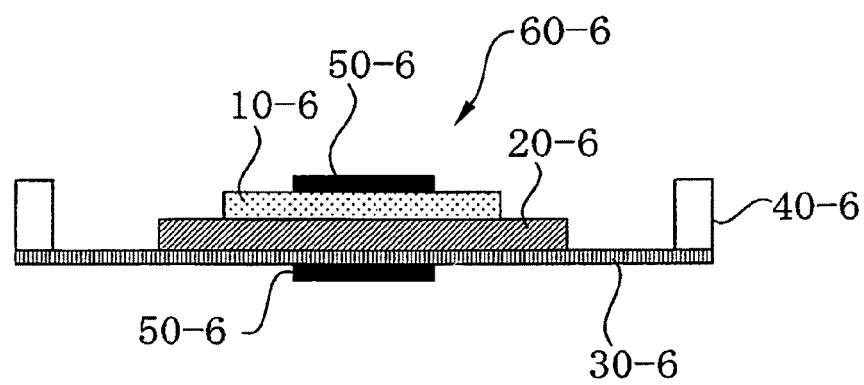

Configurations of the piezoelectric actuator according to the present exemplary embodiment are not limited to those shown above and the piezoelectric actuator according to the sixth exemplary embodiment may also have the configuration shown in FIGS. 14A and 14B. That is, FIG. 14A is a top view showing configurations of the piezoelectric actuator 60-6 of the sixth exemplary embodiment of the present invention and FIG. 14B is a vertical cross-sectional view of the piezoelectric actuator 60-6. In the piezoelectric actuator 60-6 shown in FIGS. 14A and 14B, two reinforcement members 50-6 are disposed with one on the upper side and another on the lower side and with the piezoelectric element 10-6 and vibration film 30-6 being interposed between the upper reinforcement member 50-6 and lower reinforcement member 50-6, that is, the upper reinforcement member 50-6 is placed on the piezoelectric element 10-6 and the upper reinforcement 50-6 is disposed under the vibration film 30-6. Moreover, the reinforcement members 50-6 are made of phosphor bronze and the configurations other than the reinforcement members 50-6 are the same as in the first exemplary embodiment. Thus, in the sixth exemplary embodiment, so long as the reinforcement members 50-6 are disposed in the portion where a node of vibration occurs, there is no limitation to its shape and/or its placement position. By configuring the piezoelectric actuator 60-6 of the sixth exemplary embodiment as above, the divided vibration can be suppressed and flat frequency sound pressure level characteristics can be realized.

Seventh Exemplary Embodiment

Figure 15A:
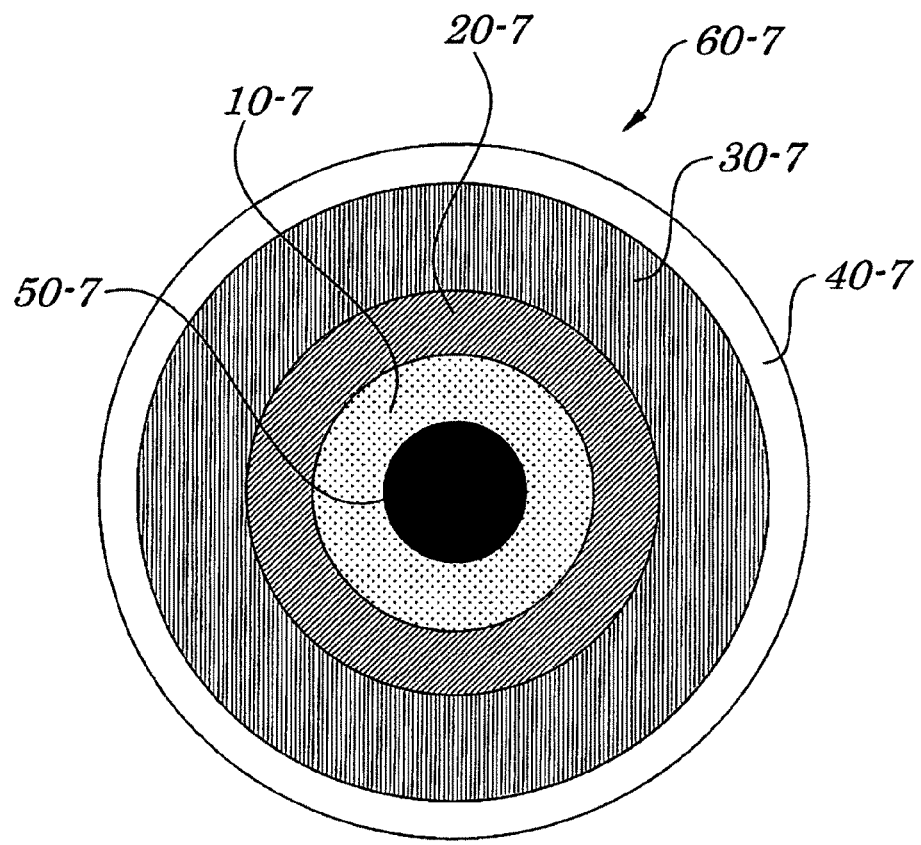
FIGS. 15A and 15B are diagrams showing configurations of a piezoelectric actuator according to a seventh exemplary embodiment of the present invention.
Figure 15B:
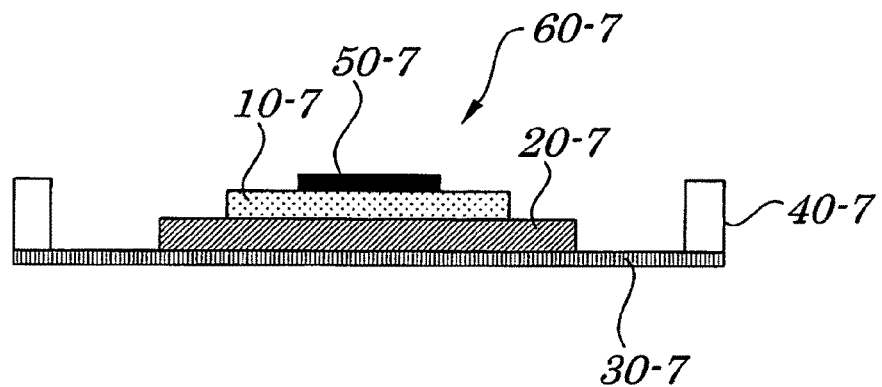

Configurations of the piezoelectric actuator according to the present exemplary embodiment are not limited to those shown above and the piezoelectric actuator according to the seventh exemplary embodiment may also have the configuration shown in FIGS. 15A and 15B. That is, FIG. 15A is a top view showing configurations of the piezoelectric actuator 60-7 of the seventh exemplary embodiment of the present invention and FIG. 15B is a vertical cross-sectional view of the piezoelectric actuator 60-7. In the piezoelectric actuator 60-7 shown in FIGS. 15A and 15B, the reinforcement member 50-7 is made of a urethane film and the configurations other than the reinforcement member 50-7 are the same as in the first exemplary embodiment. Thus, in the seventh exemplary embodiment, so long as the reinforcement member 50-7 is disposed in the portion where a node of vibration occurs, the material for the reinforcement member 50-7 is not limited to any particular material. Particularly, when a resin material such as the urethane film is used as the material for the reinforcement member 50-7, working becomes easy when compared with a metal material which improves manufacturing stability of the piezoelectric actuator 60-7. By configuring the piezoelectric actuator 60-7 of the seventh exemplary embodiment as above, the divided vibration can be suppressed and flat frequency sound pressure level characteristics can be realized.

Next, the evaluation of the characteristics of each of the above piezoelectric actuators is performed by using examples 1 to 31 and first comparative example to fifth comparative example. Evaluation items for each characteristic are as follow.

(Evaluation 1) Measurement of basic resonant frequency: The basic resonant frequency occurring at the time of inputting an AC voltage of 1 V is measured.

(Evaluation 2) Measurement of sound pressure level frequency characteristics: The sound pressure level occurring at the time of inputting an AC voltage of 1V is measured by a microphone disposed at a position being a predetermined distance away from the piezoelectric element. Moreover, the predetermined distance is 10 cm unless otherwise stated explicitly and the range of frequencies to be measured is from 10 Hz to 10 kHz.

Figure 16:
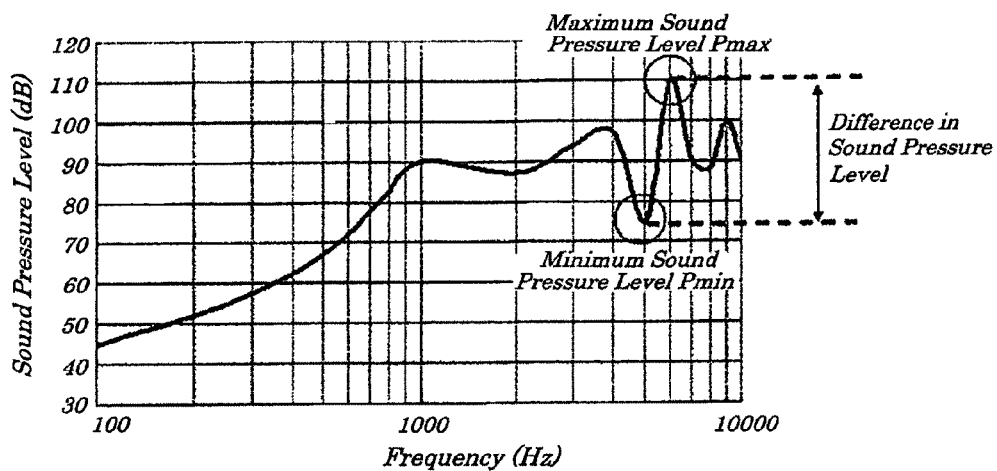
FIG. 16 is a diagram explaining a method for measuring flatness of sound pressure level characteristics.

(Evaluation 3) Measurement of sound pressure level frequency characteristics: The sound pressure level occurring at the time of inputting an AC voltage of 1V is measured by a microphone disposed at a position being a predetermined distance away from the piezoelectric element. In the measuring range of frequencies from 2 kHz to 10 kHz out of 10 Hz to 10 kHz, based on a difference in sound pressure levels between the maximum sound pressure level Pmax and the minimum sound pressure level Pmin, the flatness of the sound pressure level frequency characteristics is measured. If the result of the measurement shows that the sound pressure level difference (the difference between the maximum sound pressure level Pmax and minimum sound pressure level Pmin) is within 20 dB, the result is judged as ○ (PASS) and, if the result of the measurement shows that the sound pressure level difference exceeds 20 dB, the result is judged as X (FAIL). The predetermined distance is 10 cm unless otherwise stated explicitly (see FIG. 16).

(Evaluation 4) Measurement of maximum vibration speed amplitude: The maximum vibration speed amplitude Vmax occurring at the time of the occurrence of resonance is measured (see FIGS. 4A and 4B).

Figure 17:
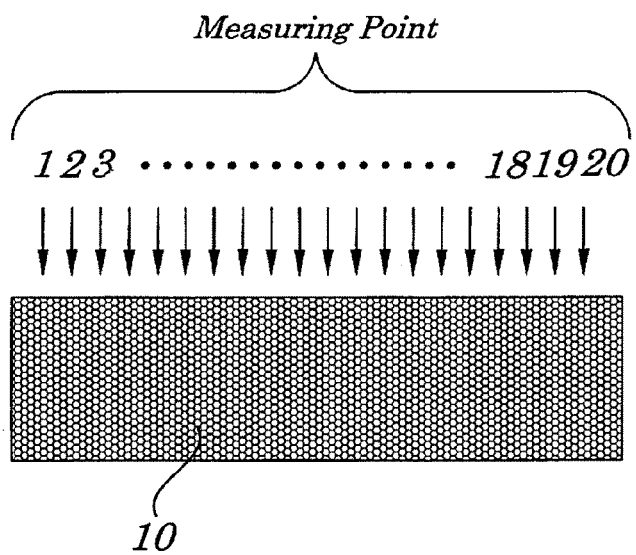
FIG. 17 is a diagram explaining a measurement point of an average vibration speed amplitude.

(Evaluation 5) Measurement of average vibration speed amplitude: The vibration speed amplitudes are measured at measurement points 20 uniformly divided in a longitudinal direction as shown in FIG. 17 and the average value of these measured amplitudes is calculated.

(Evaluation 6) Vibration mode: The "vibration speed ratio" is defined as average vibration speed amplitude Vm/maximum speed amplitude Vmax as shown in FIGS. 4A and 4B and the vibration mode is judged based on the vibration speed ratio. That is, when the vibration speed ratio is small, the bending-type movement (mountain-type movement) as shown in FIG. 4A occurs and when the vibration speed ratio is large, the reciprocal movement (piston-type movement) as shown in FIG. 4B occurs and, therefore, in the present exemplary embodiment, the 0.8 being the vibration speed ratio is used as a threshold value and, when the vibration ratio is less than 0.8, the movement is judged as the bending-type movement and, when the vibration ratio is 0.8 or more, the movement is judged as the piston-type movement.

(Evaluation 7) A drop shock stability test is performed by letting a mobile phone mounting a piezoelectric actuator naturally drop 50 cm from right above five times. Specifically, breakage such as cracking occurred after the drop shock test was visually checked and sound pressure characteristics occurring after the drop test were measured. Based on the results from the tests, if the sound pressure level difference (that is, the difference between the sound pressure level occurring before the test and sound pressure level occurring after the test) is within 3 dB, the result is judged as ○ (PASS) and, if the sound pressure level exceeds 3 dB, the result is judged as X (FAILS).

First Example

Figure 18A:
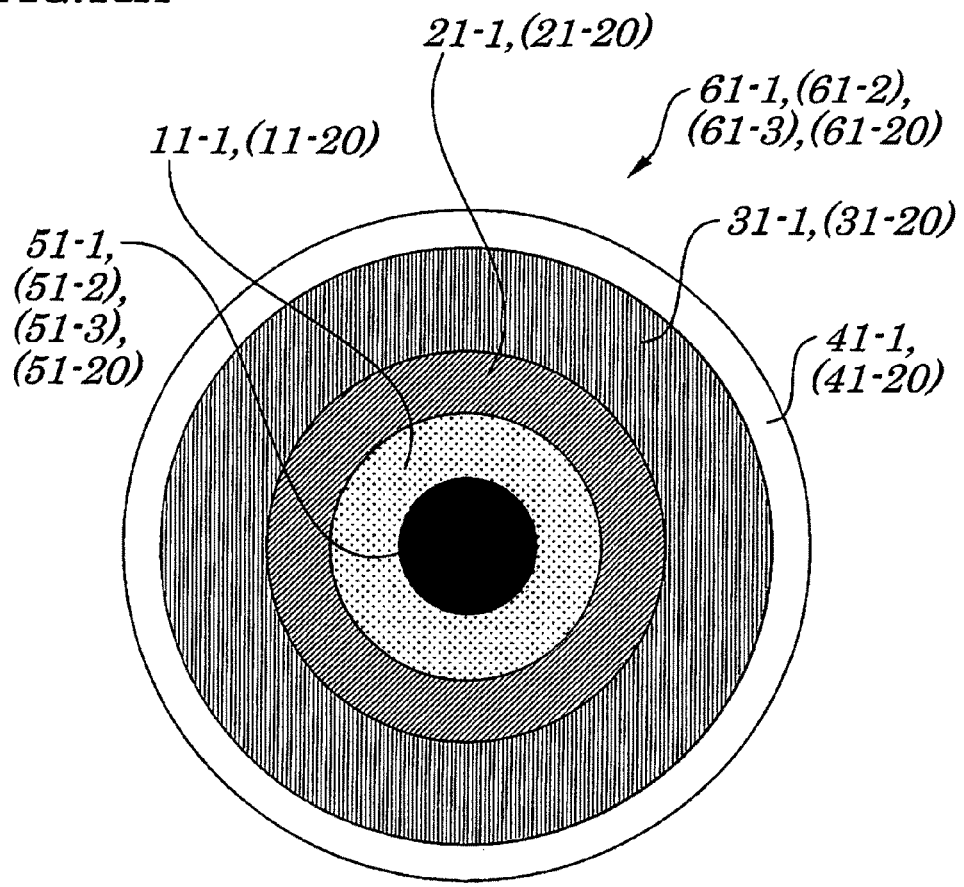
FIGS. 18A and 18B are diagrams showing configurations of a first example of the present invention.
Figure 18B:
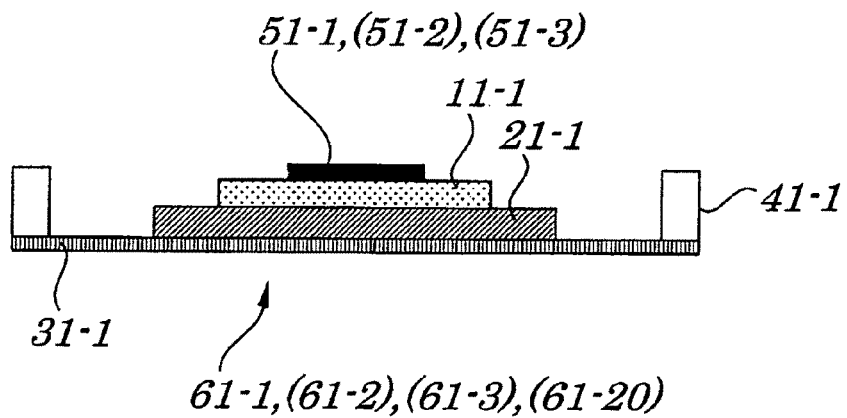

FIGS. 18A and 18B are diagrams showing configurations of the piezoelectric actuator 61-1 according to the first example; FIG. 18A is its top view and FIG. 18B is its vertical cross-sectional view. That is, as the first example as shown in FIGS. 18A and 18B, the piezoelectric actuator 61-1 exemplifying the first exemplary embodiment (see FIGS. 1 and 2) was fabricated. The piezoelectric actuator 61-1 does not differ essentially from the piezoelectric actuator according to the first exemplary embodiment, however, in the first example, the reinforcement member 51-1 is so configured as to be bonded to an upper surface of the central portion of the piezoelectric element 11-1.

Concrete configuration of each component making up the piezoelectric actuator 61-1 is as follows. The piezoelectric element 11-1 was constructed by forming the upper electrode layer and lower electrode layer each being 8 μm in thickness on both surfaces of the piezoelectric plate being 16 mm in outer diameter and 50 μm (0.05 mm) in thickness. The pedestal 21-1 was constructed by using phosphor bronze being 18 mm in outer diameter and 30 μm (0.03 mm) in thickness. The vibration film 31-1 was constructed by using a urethane-based film being 21 mm in outer diameter and 80 μm (0.03 mm) in thickness. The support member 41-1 was constructed by using SUS304 being 21 mm in outer diameter, being 20×20 mm in inner diameter of a frame drawing portion, and being 1.5 mm in thickness. The reinforcement member 51-1 was constructed by using phosphor bronze being 3 mm in outer diameter and 0.05 mm in thickness.

Moreover, the piezoelectric element 11-1, pedestal 21-1, and vibration film 31-1 were concentrically disposed. The piezoelectric plate of the piezoelectric element 11-1 was made of lead zirconate titanate-based ceramic and the electrode layer was made of silver/paradigm alloy (weight ratio of 70%:30%). The piezoelectric element 11-1 was manufactured by a green sheet method in which the ceramic was baked at 1100° C. for 2 hours in the air and, then, polarization-based processing was performed on a piezoelectric material layer. An epoxy-based bonding agent was used for bonding between the piezoelectric element 11-1 and pedestal 21-1, between the pedestal 21-1 and vibration film 31-1, support member 41-1 and vibration film 31-1, and reinforcement member 51-1 and piezoelectric ceramic.

[Measurement Result]
Basic resonant frequency: 954 Hz
Maximum vibration speed amplitude: 215 mm/s
Vibration speed ratio: 0.83
Vibration mode: Piston-type
Sound pressure level (1 kHz): 91 dB
Sound pressure level (3 kHz): 86 dB
Sound pressure level (5 kHz): 95 dB
Sound pressure level (10 kHz): 86 dB
Flatness of sound level frequency characteristics: ○
Drop shock stability: ○

Figure 33:
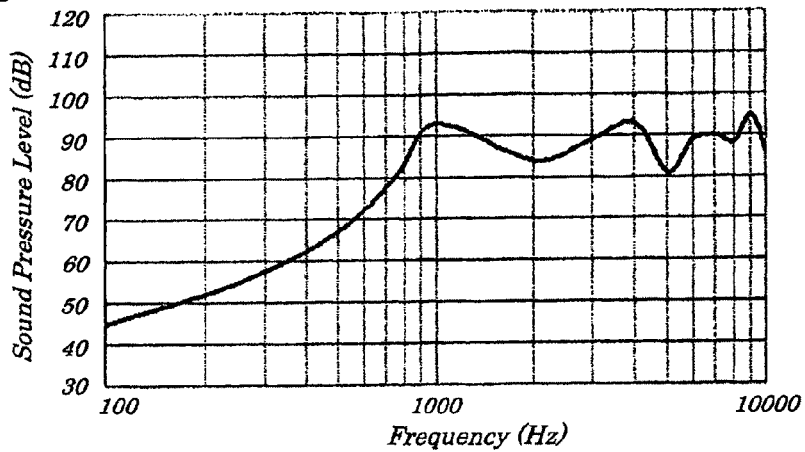
FIG. 33 is a diagram showing acoustic characteristics of the first example.

As is apparent from the measurement results, according to the piezoelectric actuator 61-1 of the example, the sound pressure level frequency characteristics are flat and neither dips nor peaks are observed. The vibration amplitude is large at the basic resonant frequency of 1 kHz or less and the piezoelectric actuator 61-1 takes the piston-type vibration mode and it has been demonstrated that the piezoelectric actuator 61-1 has the sound pressure level exceeding 80 dB in a wide frequency band from 1 to 10 kHz (see acoustic characteristic diagram of the first example in FIG. 33). Also, the thickness of the piezoelectric actuator 61-1 (that is, the thickness of the support member 41-1) is 1.5 mm and, therefore, sufficient thinning has been achieved.

First Comparative Example

Figure 19A:
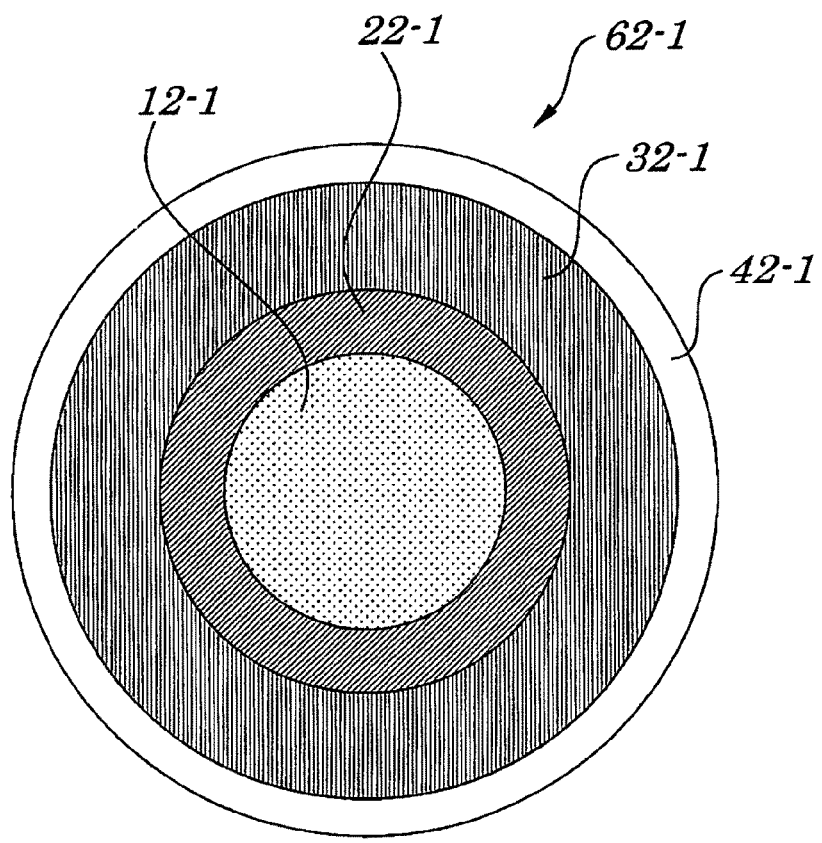
FIGS. 19A and 19B are diagrams showing configurations of a first comparative example corresponding to the first example.
Figure 19B:
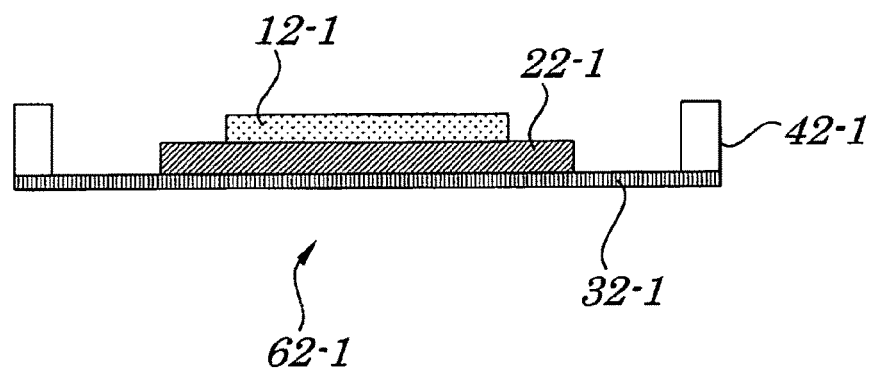

FIGS. 19A and 19B are diagrams showing the piezoelectric actuator according to the first comparative example to the first example; FIG. 19A is its top view and FIG. 19B is a vertical cross-sectional view. That is, as the first comparative example to the first example, as shown in FIGS. 19A and 19B, the piezoelectric actuator 62-1 to which the reinforcement member is not bonded was fabricated. The piezoelectric actuator 62-1 has the same configurations as in the first example other than the placement of the reinforcement member. The materials for the piezoelectric element 12-1, pedestal 22-1, and support member 42-1 are the same as those for the piezoelectric element 11-1, pedestal 21-1, and support member 41-1 of the above first example.

Concrete configurations of each component of the piezoelectric actuator 62-1 are as follow.
Piezoelectric element 12-1: Same configurations as the first example.
Pedestal 22-1: Same configurations as in the first example.
Vibration film 32-1: Same configurations as in the first example.
Support member 42-1: Same configurations as in the first example. The above piezoelectric element 12-1, pedestal 22-1, vibration film 32-1, and support member 42-1 were disposed concentrically.

Figure 34:
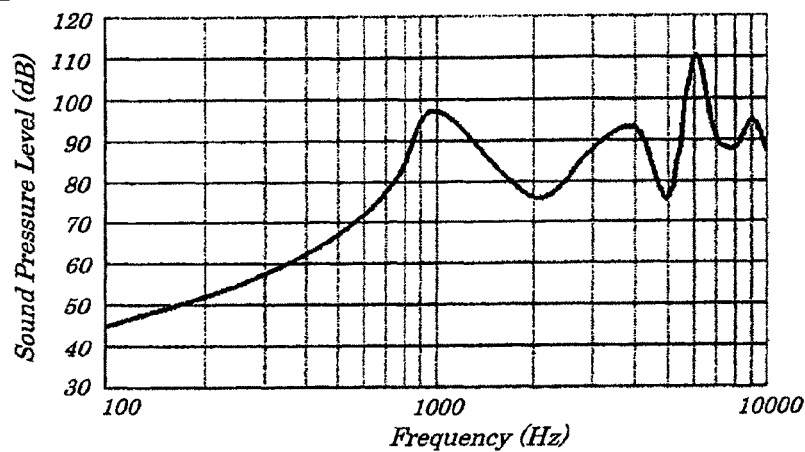
FIG. 34 is a diagram showing acoustic characteristics of the first comparative example corresponding to the first example.

[Measurement Result]
Basic resonant frequency: 954 Hz
Maximum vibration speed amplitude: 235 mm/s
Vibration speed ratio: 0.79
Vibration mode: bending-type
Sound pressure level (1 kHz): 97 dB
Sound pressure level (3 kHz): 88 dB
Sound pressure level (5 kHz): 76 dB
Sound pressure level (10 kHz): 87 dB
Flatness of sound level frequency characteristics: X
Drop shock stability: X
(see the acoustic characteristic diagram of the comparative example in FIG. 34)

Second Example

As the second example, the piezoelectric actuator 61-2 as shown in FIGS. 18A and 18B was fabricated. In the piezoelectric actuator 61-2 of the second example, only the shape of its reinforcement member 51-2 was changed and configurations other than the reinforcement member 51-2 were the same as in the first example.

Concrete configurations of each component of the piezoelectric actuator 61-2 are as follow.
Piezoelectric element 11-1: Same configurations as in the first example.
Pedestal 21-1: Same configurations as in the first example.
Vibration film 31-1: Same configurations as in the first example.
Support member 41-1: Same configurations as in the first example.
Reinforcement member 51-1: Constructed by using phosphor bronze being 5 mm in outer diameter and 0.05 mm in thickness.

[Measurement Result]
Basic resonant frequency: 1005 Hz
Maximum vibration speed amplitude: 205 mm/s
Vibration speed ratio: 0.84
Vibration mode: piston-type
Sound pressure level (1 kHz): 90 dB
Sound pressure level (3 kHz): 88 dB
Sound pressure level (5 kHz): 92 dB
Sound pressure level (10 kHz): 90 dB
Flatness of sound level frequency characteristics: ○
Drop shock stability: ○

Figure 35:
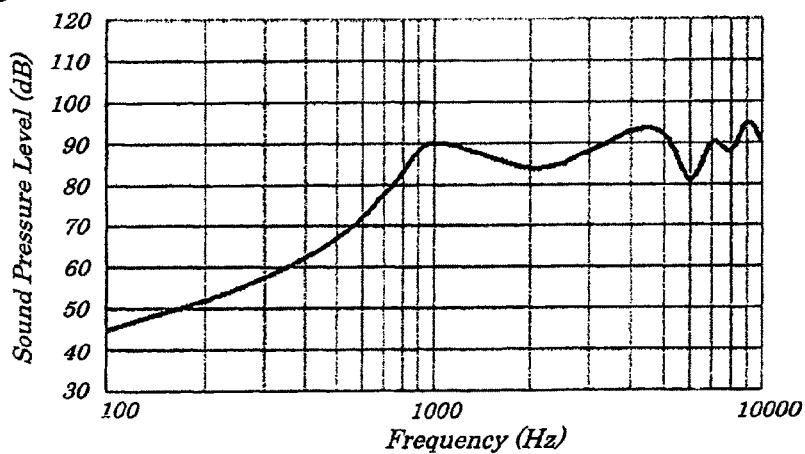
FIG. 35 is a diagram showing acoustic characteristics of the second example.

As is apparent from the measurement results, in the second example, the piezoelectric actuator 61-2 has the same equivalent characteristics as in the first example and regardless of the outer shape of its reinforcement member 51-2, the sound pressure level frequency characteristics are flat and neither dips nor peaks are observed. Moreover, the vibration amplitude is large at the basic resonant frequency of 1 kHz or less and the piezoelectric actuator 61-2 takes the piston-type vibration mode and it has been demonstrated that the piezoelectric actuator 61-2 has the sound pressure level exceeding 80 dB in a wide frequency band from 1 to 10 kHz (see acoustic characteristic diagram of the second example in FIG. 35). Also, the thickness of the piezoelectric actuator 61-3 (that is, the thickness of the support member 41-2) is 1.5 mm and, therefore, sufficient thinning has been achieved.

Third Example

As the third example, the piezoelectric actuator 61-3 as shown in FIGS. 18A and 18B was fabricated. In the piezoelectric actuator 61-3 of the third example, only the shape of its reinforcement member 51-3 was changed and configurations other than the reinforcement member 51-3 were the same as in the first example.

Concrete configurations of each component of the piezoelectric actuator 61-3 are as follow.
Piezoelectric element 11-1: Same configurations as in the first example.
Pedestal 21-1: Same configurations as in the first example.
Vibration film 31-1: Same configurations as in the first example.
Support member 41-1: Same configurations as in the first example.
Reinforcement member 51-3: Constructed by using phosphor bronze being 7 mm in outer diameter and 0.05 mm in thickness.
[Measurement Result]
Basic resonant frequency: 1035 Hz
Maximum vibration speed amplitude: 205 mm/s
Vibration speed ratio: 0.81
Vibration mode: piston-type
Sound pressure level (1 kHz): 88 dB
Sound pressure level (3 kHz): 85 dB
Sound pressure level (5 kHz): 87 dB
Sound pressure level (10 kHz): 90 dB
Flatness of sound level frequency characteristics: ○
Drop shock stability: ○

Figure 36:
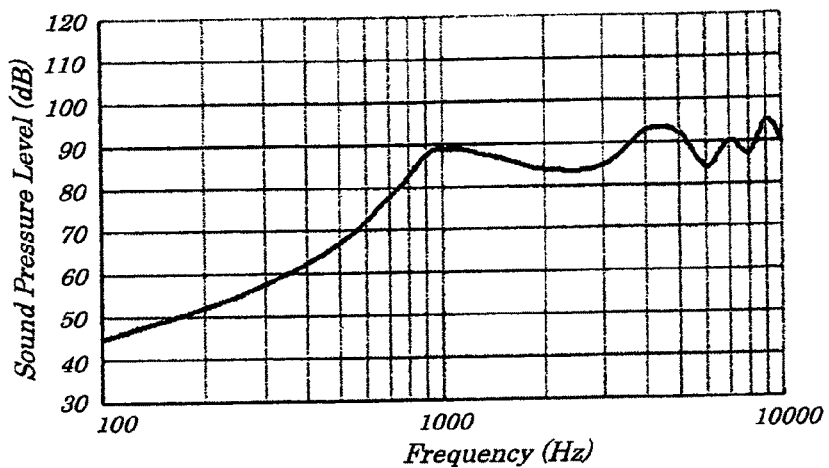
FIG. 36 is a diagram showing acoustic characteristics of the third example.

As is apparent from the measurement results, in the third example, the piezoelectric actuator 61-3 has the same equivalent characteristics as in the first example and, regardless of the outer shape of its reinforcement member 51-3, the sound pressure level frequency characteristics are flat and neither dips nor peaks are observed. Moreover, the vibration amplitude is large at the basic resonant frequency of 1 kHz or less and the piezoelectric actuator 61-3 takes the piston-type vibration mode and it has been demonstrated that the piezoelectric actuator 61-3 has the sound pressure level exceeding 80 dB in a wide frequency band from 1 to 10 kHz (see acoustic characteristic diagram of the third example in FIG. 36). Also, the thickness of the piezoelectric actuator 61-3 (that is, the thickness of the support member 41-3) is 1.5 mm and, therefore, sufficient thinning has been achieved.

Fourth Example

Figure 20A:
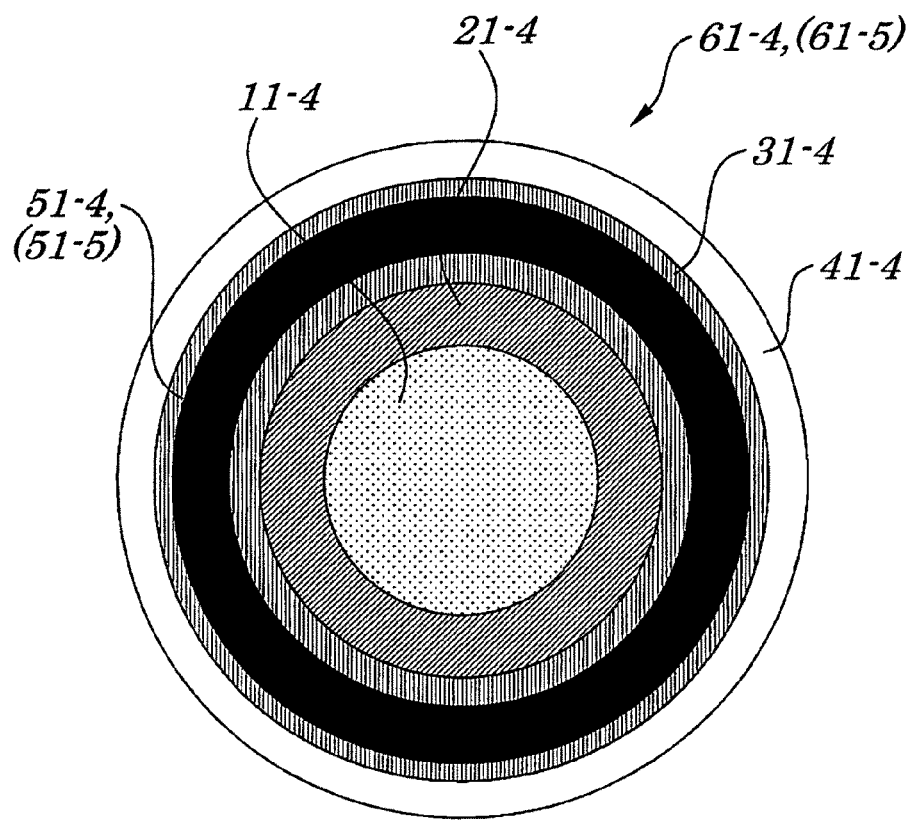
FIGS. 20A and 20B are diagrams showing configurations of a fourth example of the present invention.
Figure 20B:
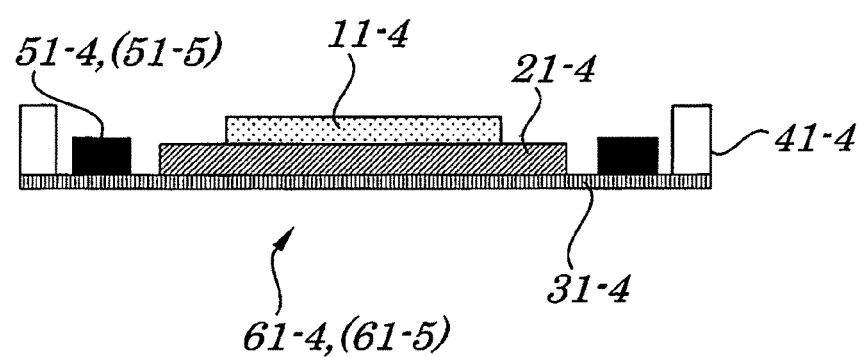

FIGS. 20A and 20B are diagrams showing configurations of a piezoelectric actuator 61-4 of the fourth example; FIG. 20A is its top view and FIG. 20B is its vertical view. As the fourth example, the piezoelectric actuator 61-4 as shown in FIGS. 20A and 20B was fabricated. In the piezoelectric actuator 61-4 according to the fourth example, the shape and placement position of its reinforcement member 51-4 were changed and configurations other than the reinforcement member 51-4 were the same as in the first example.

Concrete configurations of each component of the piezoelectric actuator 61-4 are as follow.
Piezoelectric element 11-4: Same configurations as in the first example.
Pedestal 21-4: Same configurations as in the first example.
Vibration film 31-4: Same configurations as in the first example.
Support member 41-4: Same configurations as in the first example.
Reinforcement member 51-4: Constructed by using hollow-shaped phosphor bronze being 18 mm in outer diameter and being 16.5 mm in inner diameter of the aperture portion, and 0.05 mm in thickness.
[Measurement Result]
Basic resonant frequency: 1075 Hz
Maximum vibration speed amplitude: 215 mm/s
Vibration speed ratio: 0.84
Vibration mode: piston-type
Sound pressure level (1 kHz): 87 dB
Sound pressure level (3 kHz): 84 dB
Sound pressure level (5 kHz): 86 dB
Sound pressure level (10 kHz): 88 dB
Flatness of sound level frequency characteristics: ○
Drop shock stability: ○

Figure 37:
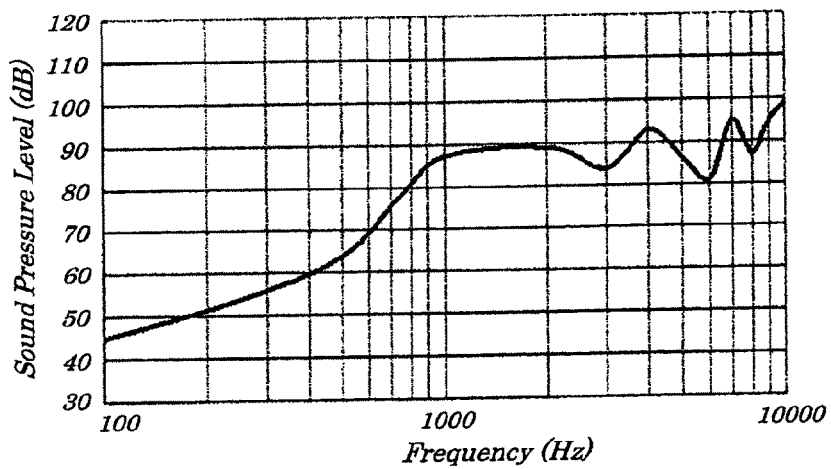
FIG. 37 is a diagram showing acoustic characteristics of the fourth example.
Figure 38:
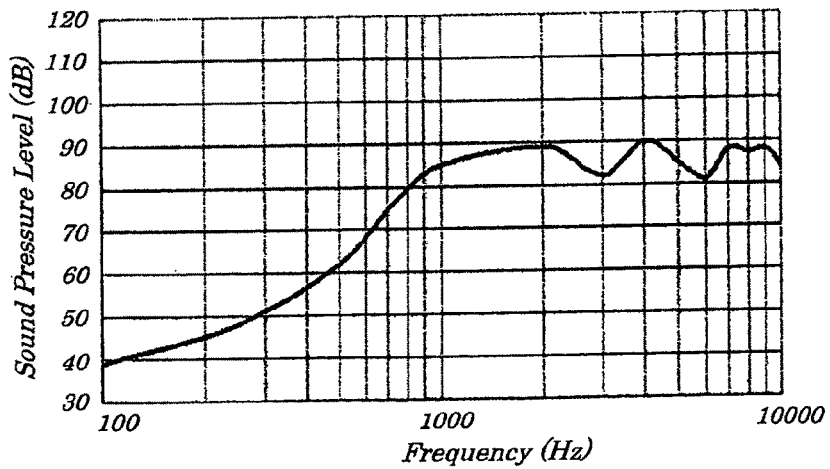
FIG. 38 is a diagram showing acoustic characteristics of the fifth example.

As is apparent from the measurement results, in the fourth example, the piezoelectric actuator 61-4 has the same equivalent characteristics as in the first example and, regardless of the outer shape of its reinforcement member 51-4, the sound pressure level frequency characteristics are flat and neither dips nor peaks are observed. Moreover, the vibration amplitude is large at the basic resonant frequency of 1 kHz or less and the piezoelectric actuator 61-4 takes the piston-type vibration mode and it has been demonstrated that the piezoelectric actuator 61-4 has the sound pressure level exceeding 80 dB in a wide frequency band from 1 to 10 kHz (see acoustic characteristic diagram of the fourth example in FIG. 37). Also, the thickness of the piezoelectric actuator 61-4 (that is, the thickness of the support member 41-4) is 1.5 mm and, therefore, sufficient thinning has been achieved.

Fifth Example

As the fifth example, the piezoelectric actuator 61-5 as shown in FIGS. 20A and 20B was fabricated. In the piezoelectric actuator 61-5 of the fifth example, only the shape of its reinforcement member 51-5 was changed and configurations other than the reinforcement member 51-5 were the same as in the first and fourth examples.

Concrete configurations of each component of the piezoelectric actuator 61-5 are as follow.
Piezoelectric element 11-4: Same configurations as in the first example.
Pedestal 21-4: Same configurations as in the first example.
Vibration film 31-4: Same configurations as in the first example.
Support member 41-4: Same configurations as in the first example.
Reinforcement member 51-5: Constructed by using hollow-shaped phosphor bronze being 18 mm in outer diameter and being 15.0 mm in inner diameter of the aperture portion, and 0.05 mm in thickness.
[Measurement Result]
Basic resonant frequency: 1105 Hz
Maximum vibration speed amplitude: 205 mm/s
Vibration speed ratio: 0.81

Vibration mode: piston-type
Sound pressure level (1 kHz): 86 dB
Sound pressure level (3 kHz): 82 dB
Sound pressure level (5 kHz): 85 dB
Sound pressure level (10 kHz): 84 dB
Flatness of sound level frequency characteristics: ○
Drop shock stability: ○

As is apparent from the measurement results, in the fifth example, the piezoelectric actuator 61-5 has the same equivalent characteristics as in the first example and, regardless of the outer shape of its reinforcement member 51-5, the sound pressure level frequency characteristics are flat and neither dips nor peaks are observed. Moreover, the vibration amplitude is large at the basic resonant frequency of 1 kHz or less and the piezoelectric actuator 61-5 takes the piston-type vibration mode and it has been demonstrated that the piezoelectric actuator 61-5 has the sound pressure level exceeding 80 dB in a wide frequency band from 1 to 10 kHz (see acoustic characteristic diagram of the fifth example in FIG. 37). Also, the thickness of the piezoelectric actuator 61-5 (that is, the thickness of the support member 41-4) is 1.5 mm and, therefore, sufficient thinning has been achieved.

Sixth Example

Figure 21A:
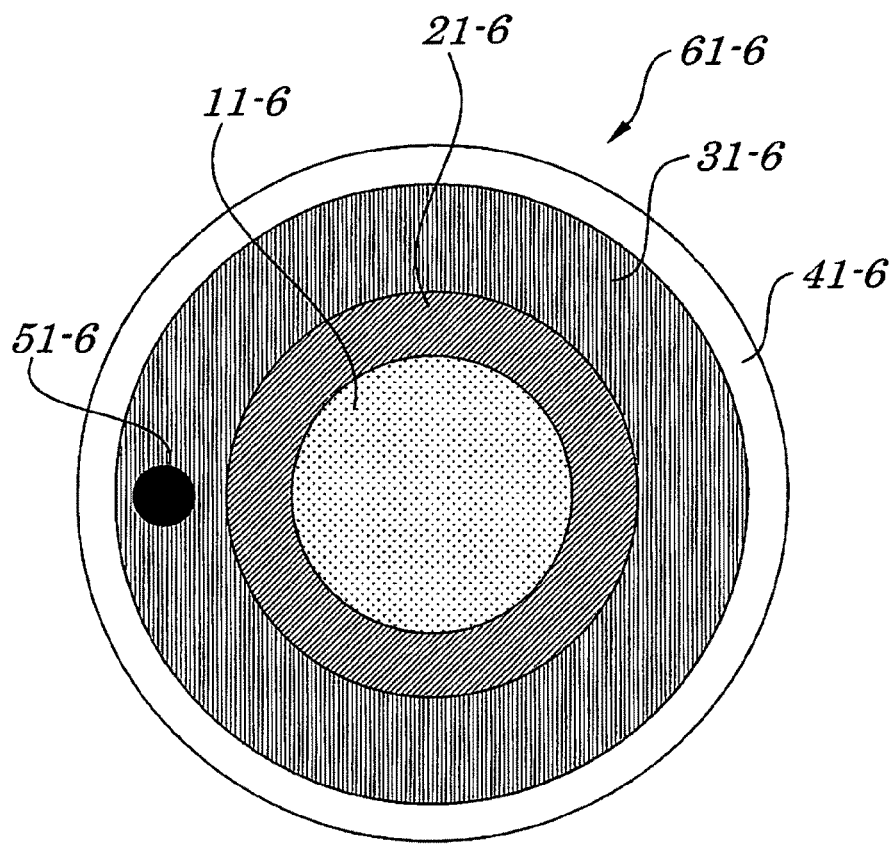
FIGS. 21A and 21B are diagrams showing configurations of a sixth example of the present invention.
Figure 21B:
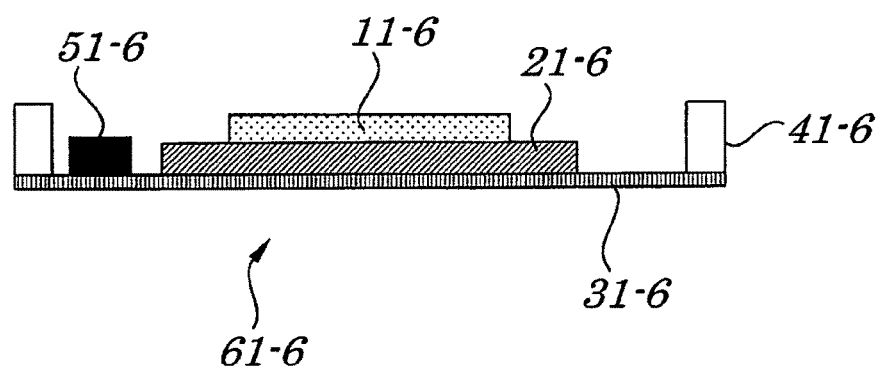

FIGS. 21A and 21B are diagrams showing configurations of the piezoelectric actuator according to the sixth example; FIG. 21A is its top view and FIG. 21B is its vertical cross-sectional view. As the sixth example, the piezoelectric actuator 61-6 as shown in FIGS. 21A and 21B was fabricated. In the piezoelectric actuator 61-6 of the sixth example, only the shape and placement position of its reinforcement member 51-6 were changed and configurations other than the reinforcement member 51-6 were the same as in the first example.

Concrete configurations of each component of the piezoelectric actuator 61-6 are as follow.
Piezoelectric element 11-6: Same configurations as in the first example.
Pedestal 21-6: Same configurations as in the first example.
Vibration film 31-6: Same configurations as in the first example.
Support member 41-6: Same configurations as in the first example.
Reinforcement member 51-6: Constructed by using phosphor bronze being 2.0 mm in outer diameter and being 0.05 mm in thickness.
[Measurement Result]
Basic resonant frequency: 912 Hz
Maximum vibration speed amplitude: 235 mm/s
Vibration speed ratio: 0.86
Vibration mode: piston-type
Sound pressure level (1 kHz): 95 dB
Sound pressure level (3 kHz): 87 dB
Sound pressure level (5 kHz): 93 dB
Sound pressure level (10 kHz): 89 dB
Flatness of sound level frequency characteristics: ○
Drop shock stability: ○

Figure 39:
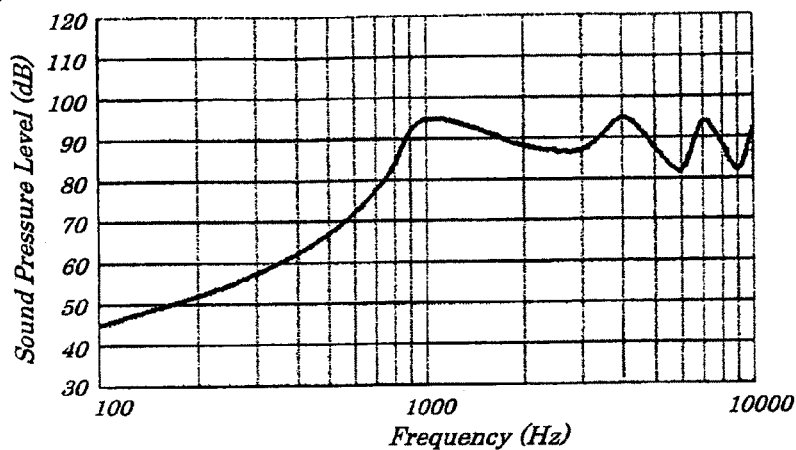
FIG. 39 is a diagram showing acoustic characteristics of the sixth example.

As is apparent from the measurement results, in the sixth example, the piezoelectric actuator 61-6 has the same equivalent characteristics as in the first example and, regardless of the outer shape and placement position of its reinforcement member 51-6, the sound pressure level frequency characteristics are flat and neither dips nor peaks are observed. Moreover, the vibration amplitude is large at the basic resonant frequency of 1 kHz or less and the piezoelectric actuator 61-6 takes the piston-type vibration mode and it has been demonstrated that the piezoelectric actuator 61-6 has the sound pressure level exceeding 80 dB in a wide frequency band from 1 to 10 kHz (see acoustic characteristic diagram of the fifth example in FIG. 39). Also, the thickness of the piezoelectric actuator 61-6 (that is, the thickness of the support member 41-6) is 1.5 mm, thus having achieved sufficient thinning.

Seventh Example

Figure 22A:
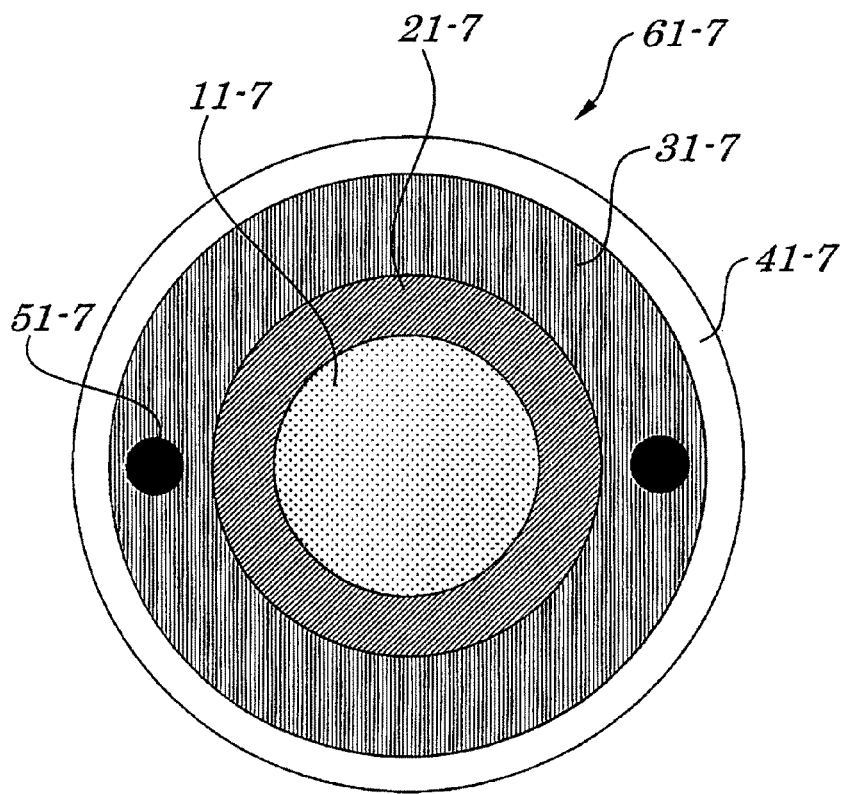
FIGS. 22A and 22B are diagrams showing configurations of a seventh example of the present invention.
Figure 22B:
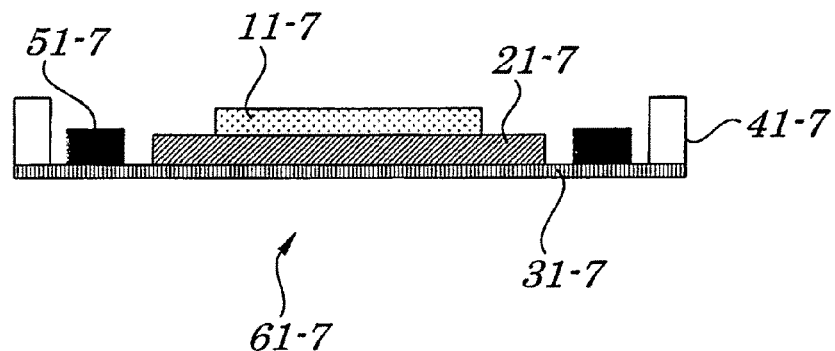

FIGS. 22A and 22B are diagrams showing configurations of the piezoelectric actuator according to the seventh example; FIG. 22A is its top view and FIG. 22B is its vertical cross-sectional view. As the seventh example, the piezoelectric actuator 61-7 as shown in FIGS. 22A and 22B was fabricated. In the piezoelectric actuator 61-7 of the seventh example, only the number of pieces of the reinforcement member 51-7 was changed relative to the configurations of the sixth example (see FIGS. 21A and 21B) and configurations other than the reinforcement member 51-7 were the same as in the first and sixth examples.

Concrete configurations of each component of the piezoelectric actuator 61-7 are as follow.
Piezoelectric element 11-7: Same configurations as in the first example.
Pedestal 21-7: Same configurations as in the first example.
Vibration film 31-7: Same configurations as in the first example.
Support member 41-7: Same configurations as in the first example.
Reinforcement members 51-7: Constructed by using phosphor bronze being 2.0 mm in outer diameter and being 0.05 mm in thickness.
[Measurement Result]
Basic resonant frequency: 931 Hz
Maximum vibration speed amplitude: 225 mm/s
Vibration speed ratio: 0.85
Vibration mode: piston-type
Sound pressure level (1 kHz): 93 dB
Sound pressure level (3 kHz): 88 dB
Sound pressure level (5 kHz): 91 dB
Sound pressure level (10 kHz): 93 dB
Flatness of sound level frequency characteristics: ○
Drop shock stability: ○

Figure 40:
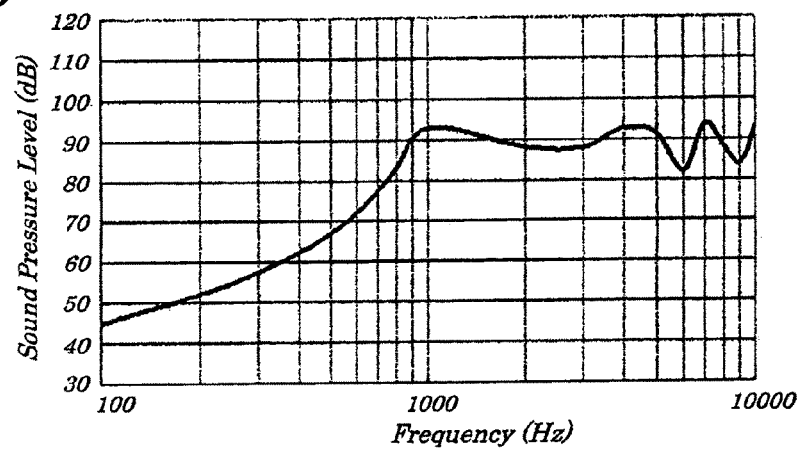
FIG. 40 is a diagram showing acoustic characteristics of the seventh example.
Figure 41:
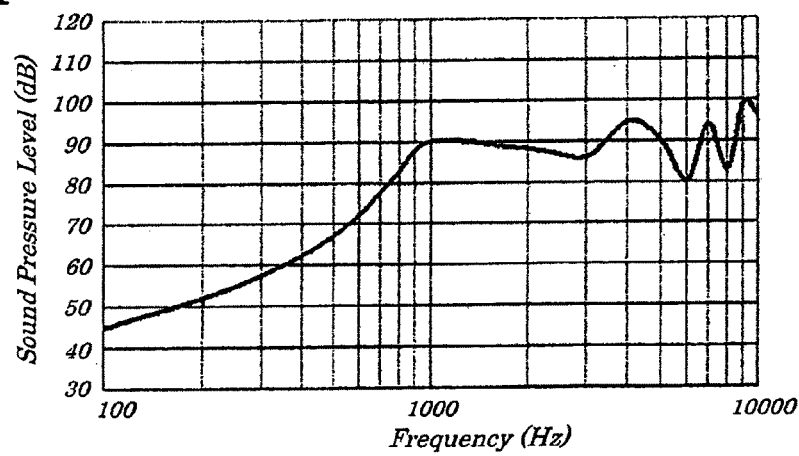
FIG. 41 is a diagram showing acoustic characteristics of the eighth example.

As is apparent from the measurement results, in the seventh example, the piezoelectric actuator 61-7 has the same equivalent characteristics as in the first example and, regardless of the outer shape, placement position, and number of pieces of its reinforcement member 51-7, the sound pressure level frequency characteristics are flat and neither dips nor peaks are observed. Moreover, the vibration amplitude is large at the basic resonant frequency of 1 kHz or less and the piezoelectric actuator 61-7 takes the piston-type vibration mode and it has been demonstrated that the piezoelectric actuator 61-7 has the sound pressure level exceeding 80 dB in a wide frequency band from 1 to 10 kHz (see acoustic characteristic diagram of the seventh example in FIG. 40). Also, the thickness of the piezoelectric actuator 61-7 (that is, the thickness of the support member 41-7) is 1.5 mm and, therefore, sufficient thinning has been achieved.

Eighth Example

Figure 23A:
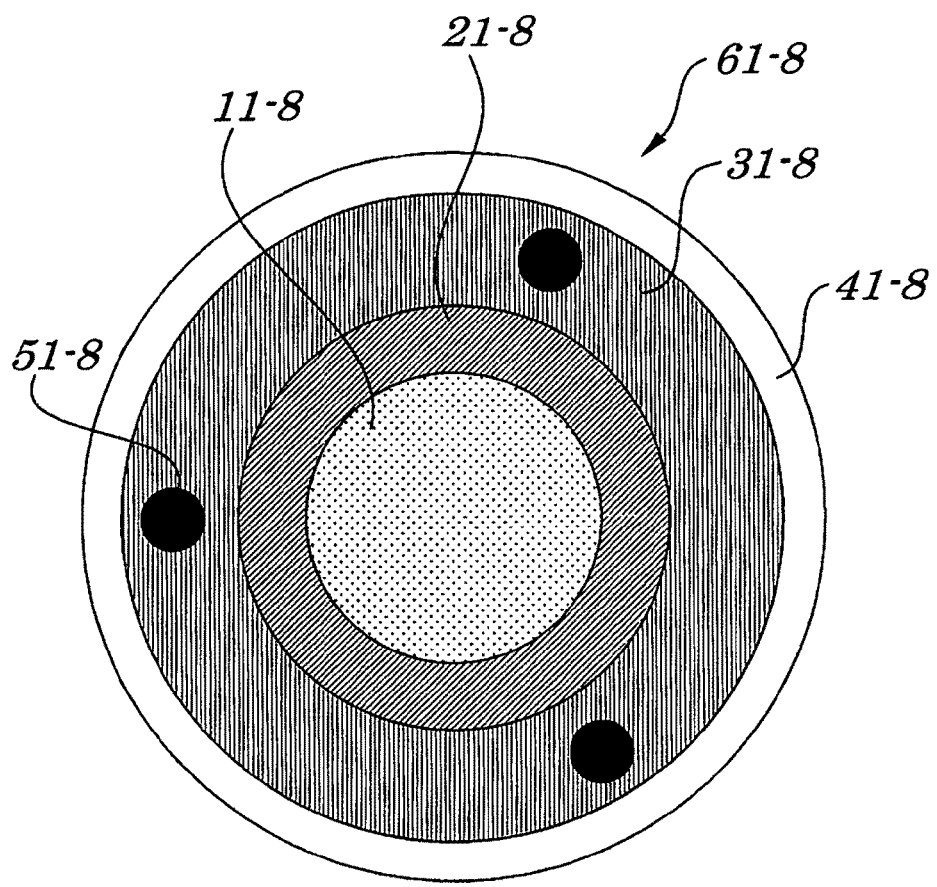
FIGS. 23A and 23B are diagrams showing configurations of an eighth example of the present invention.
Figure 23B:
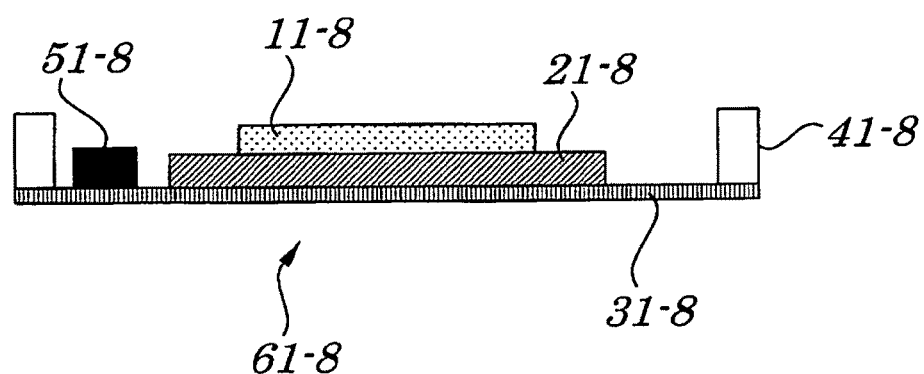

FIGS. 23A and 23B are diagrams showing configurations of the piezoelectric actuator according to the eighth example; FIG. 23A is its top view and FIG. 23B is its vertical cross-sectional view. As the eighth example, the piezoelectric actuator 61-8 as shown in FIGS. 23A and 23B was fabricated. In the piezoelectric actuator 61-8 of the eighth example, only the number of pieces of the reinforcement members 51-8 was changed relative to the configurations of the sixth example (see FIGS. 21A and 21B) and configurations other than the reinforcement member 51-8 were the same as in the first and sixth examples.

Concrete configurations of each component of the piezoelectric actuator 61-8 are as follow.

Piezoelectric element 11-8: Same configurations as in the first example.
Pedestal 21-8: Same configurations as in the first example.
Vibration film 31-8: Same configurations as in the first example.
Support member 41-8: Same configurations as in the first example.
Reinforcement members 51-8: Constructed by using phosphor bronze being 2.0 mm in outer diameter and being 0.05 mm in thickness.
[Measurement Result]
Basic resonant frequency: 951 Hz
Maximum vibration speed amplitude: 215 mm/s
Vibration speed ratio: 0.82
Vibration mode: piston-type
Sound pressure level (1 kHz): 90 dB
Sound pressure level (3 kHz): 86 dB
Sound pressure level (5 kHz): 90 dB
Sound pressure level (10 kHz): 96 dB
Flatness of sound level frequency characteristics: ○
Drop shock stability: ○

As is apparent from the measurement results, in the eighth example, the piezoelectric actuator 61-8 has the same equivalent characteristics as in the first example and, regardless of the outer shape, placement position, and number of pieces of its reinforcement members 51-8, the sound pressure level frequency characteristics are flat and neither dips nor peaks are observed. Moreover, the vibration amplitude is large at the basic resonant frequency of 1 kHz or less and the piezoelectric actuator 61-8 takes the piston-type vibration mode and it has been demonstrated that the piezoelectric actuator 61-8 has the sound pressure level exceeding 80 dB in a wide frequency band from 1 to 10 kHz (see acoustic characteristic diagram of the seventh example in FIG. 40). Also, the thickness of the piezoelectric actuator 61-8 (that is, the thickness of the support member 41-8) is 1.5 mm, thus having achieved sufficient thinning.

Ninth Example

Figure 24A:
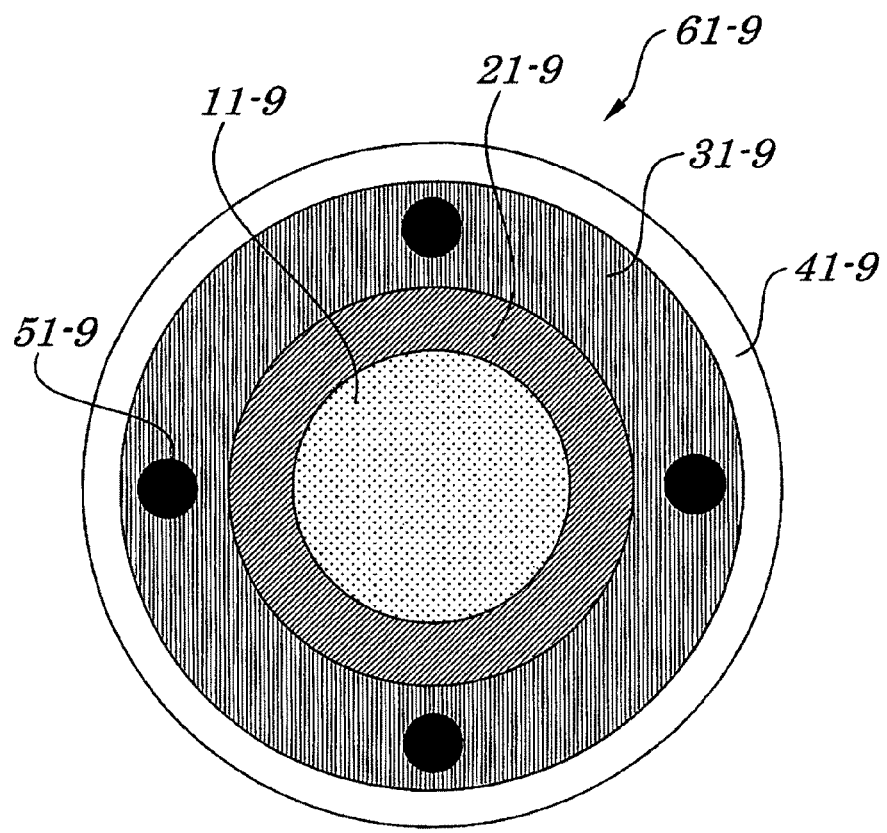
FIGS. 24A and 24B are diagrams showing configurations of a ninth example of the present invention.
Figure 24B:
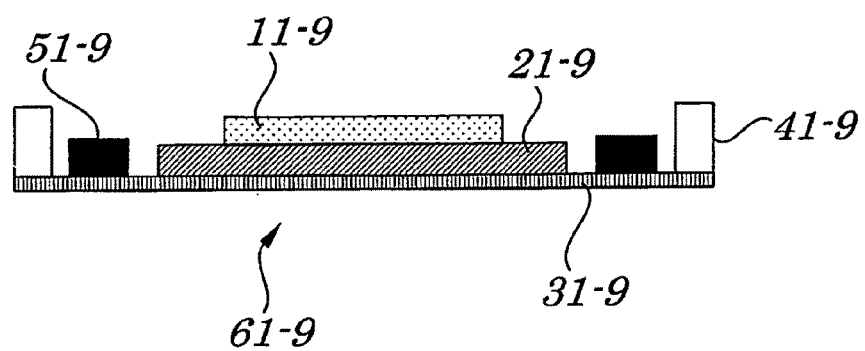

FIGS. 24A and 24B is a diagram showing configurations of the piezoelectric actuator according to the ninth example. FIG. 24A is its top view and FIG. 24B is its vertical cross-sectional view. As the ninth example, the piezoelectric actuator 61-9 as shown in FIGS. 24A and 24B was fabricated. In the piezoelectric actuator 61-9 of the ninth example, only the number of pieces of the reinforcement members 51-9 was changed relative to the configurations of the sixth example (see FIGS. 21A and 21B) and configurations other than the reinforcement member 51-9 were the same as in the first and sixth examples.

Concrete configurations of each component of the piezoelectric actuator 61-9 are as follow.

Piezoelectric element 11-9: Same configurations as in the first example.
Pedestal 21-9: Same configurations as in the first example.
Vibration film 31-9: Same configurations as in the first example.
Support member 41-9: Same configurations as in the first example.
Reinforcement members 51-9: Constructed by using phosphor bronze being 2.0 mm in outer diameter and being 0.05 mm in thickness.
[Measurement Result]
Basic resonant frequency: 975 Hz
Maximum vibration speed amplitude: 210 mm/s
Vibration speed ratio: 0.83
Vibration mode: piston-type
Sound pressure level (1 kHz): 91 dB
Sound pressure level (3 kHz): 88 dB
Sound pressure level (5 kHz): 91 dB
Sound pressure level (10 kHz): 95 dB
Flatness of sound level frequency characteristics: ○
Drop shock stability: ○

Figure 42:
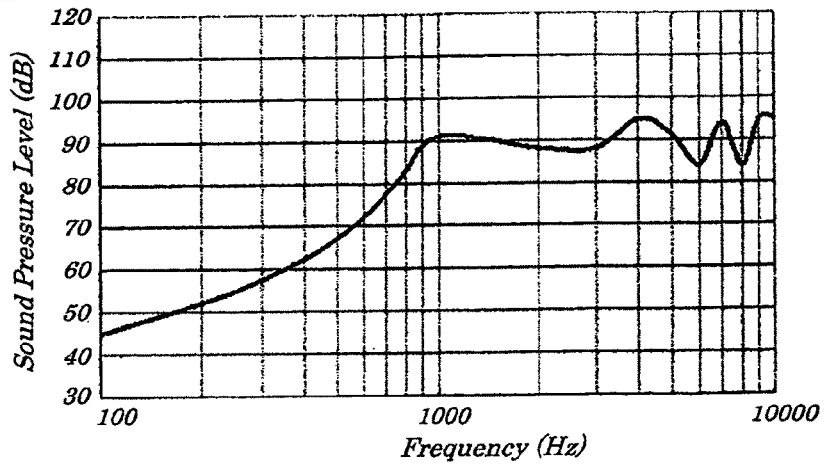
FIG. 42 is a diagram showing acoustic characteristics of the ninth example.

As is apparent from the measurement results, in the eighth example, the piezoelectric actuator 61-9 has the same equivalent characteristics as in the first example and, regardless of the outer shape, placement position, and number of pieces of its reinforcement members 51-9, the sound pressure level frequency characteristics are flat and neither dips nor peaks are observed. Moreover, the vibration amplitude is large at the basic resonant frequency of 1 kHz or less and the piezoelectric actuator 61-9 takes the piston-type vibration mode and it has been demonstrated that the piezoelectric actuator 61-9 has the sound pressure level exceeding 80 dB in a wide frequency band from 1 to 10 kHz (see acoustic characteristic diagram of the ninth example in FIG. 42). Also, the thickness of the piezoelectric actuator 61-9 (that is, the thickness of the support member 41-9) is 1.5 mm and, therefore, sufficient thinning has been achieved.

Tenth Example

Figure 25A:
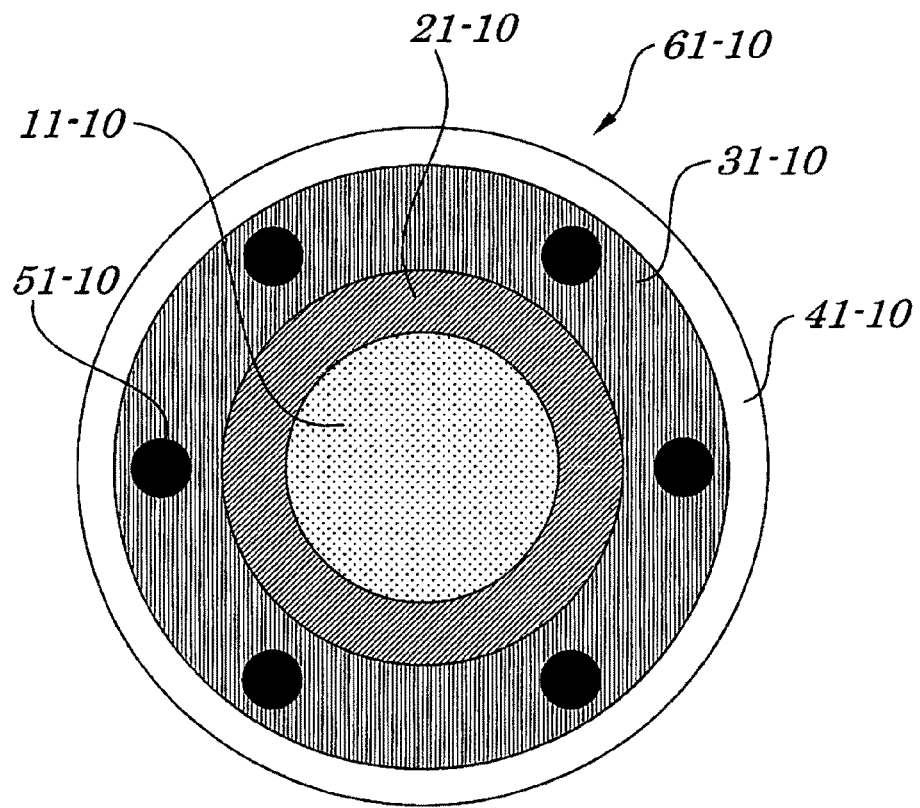
FIGS. 25A and 25B are diagrams showing configurations of a tenth example of the present invention and FIG. 25A is its top view.
Figure 25B:
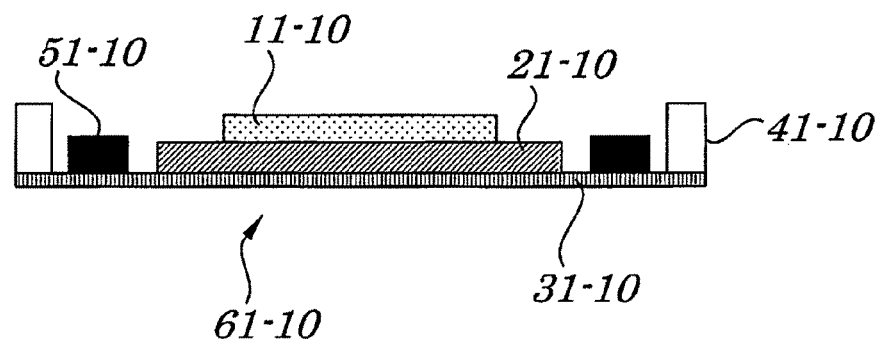

FIGS. 25A and 25B are diagrams showing configurations of the piezoelectric actuator according to the ninth example. FIG. 25A is its top view and FIG. 25B is its vertical cross-sectional view. As the tenth example, the piezoelectric actuator 61-10 as shown in FIGS. 25A and 25B was fabricated. In the piezoelectric actuator 61-10 of the tenth example, only the number of pieces of the reinforcement members 51-10 was changed relative to the configurations of the sixth example and configurations other than the reinforcement member 51-10 were the same as in the first and sixth examples.

Concrete configurations of each component of the piezoelectric actuator 61-10 are as follow.

Piezoelectric element 11-10: Same configurations as in the first example.
Pedestal 21-10: Same configurations as in the first example.
Vibration film 31-10: Same configurations as in the first example.
Support member 41-10: Same configurations as in the first example.
Reinforcement members 51-10: Constructed by using phosphor bronze being 2.0 mm in outer diameter and being 0.05 mm in thickness.
[Measurement Result]
Basic resonant frequency: 995 Hz
Maximum vibration speed amplitude: 215 mm/s
Vibration speed ratio: 0.82
Vibration mode: piston-type
Sound pressure level (1 kHz): 92 dB
Sound pressure level (3 kHz): 89 dB
Sound pressure level (5 kHz): 93 dB
Sound pressure level (10 kHz): 96 dB
Flatness of sound level frequency characteristics: ○
Drop shock stability: ○

Figure 43:
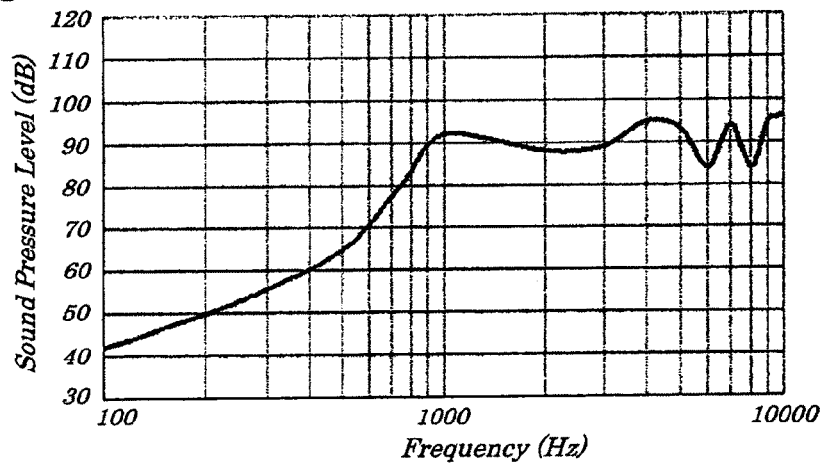
FIG. 43 is a diagram showing acoustic characteristics of the tenth example.

As is apparent from the measurement results, in the tenth example, the piezoelectric actuator 61-10 has the same equivalent characteristics as in the first example and, regardless of the outer shape, placement position, and number of pieces of its reinforcement members 51-10, the sound pressure level frequency characteristics are flat and neither dips nor peaks are observed. Moreover, the vibration amplitude is large at the basic resonant frequency of 1 kHz or less and the piezoelectric actuator 61-10 takes the piston-type vibration mode and it has been demonstrated that the piezoelectric actuator 61-10 has the sound pressure level exceeding 80 dB in a wide frequency band from 1 to 10 kHz (see acoustic characteristic diagram of the tenth example in FIG. 43). Also, the thickness of the piezoelectric actuator 61-10 (that is, the thickness of the support member 41-10) is 1.5 mm and, therefore, sufficient thinning has been achieved.

Eleventh Example

Figure 26A:
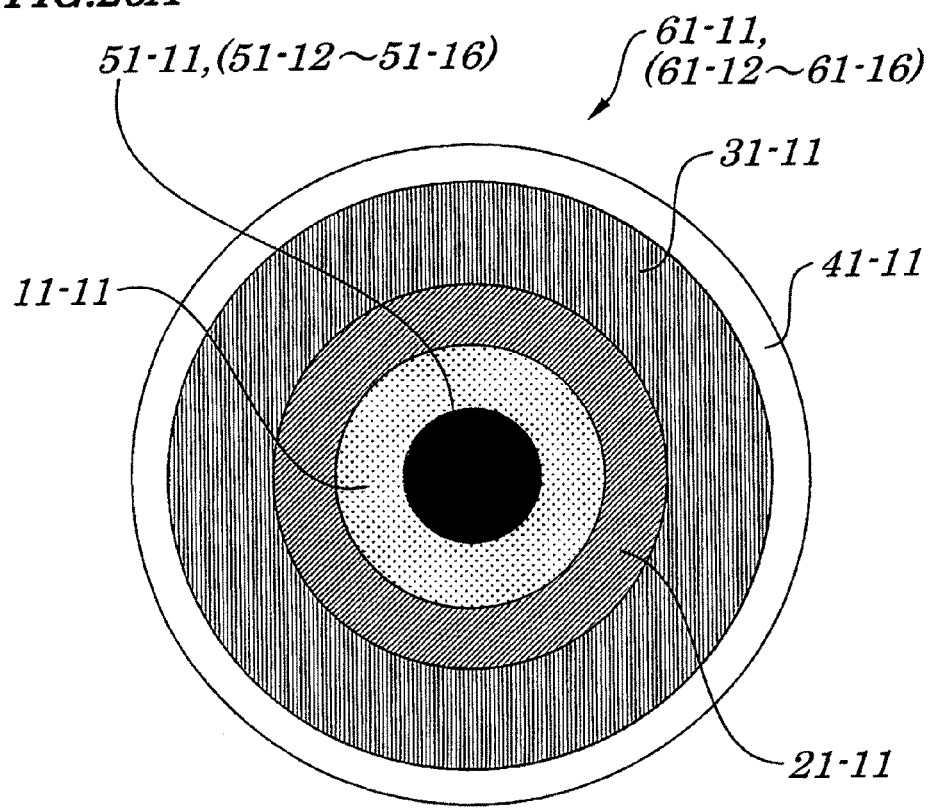
FIGS. 26A and 26B are diagrams showing configurations of an eleventh example of the present invention.
Figure 26B:
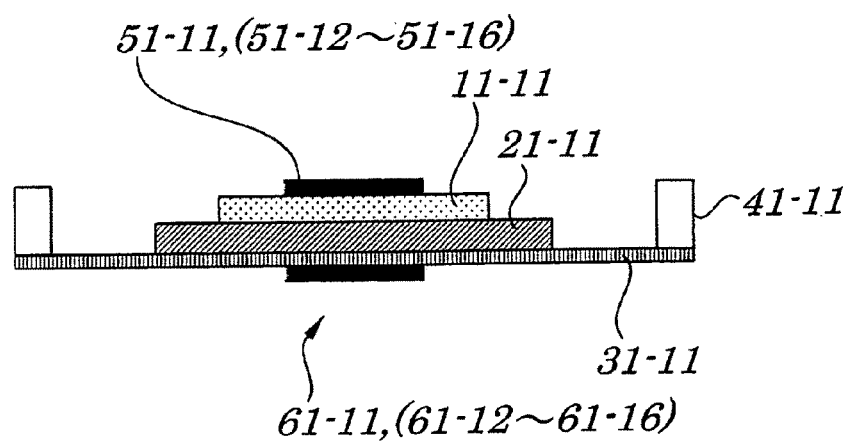

FIGS. 26A and 26B is a diagram showing configurations of the piezoelectric actuator according to the eleventh example; FIG. 26A is its top view, and FIG. 26B is its vertical cross-sectional view. As the eleventh example, the piezoelectric actuator 61-11 as shown in FIGS. 26A and 26B was fabricated. In the piezoelectric actuator 61-11 according to the eleventh example, two pieces of the reinforcement members were bonded with one on the upper side and another on the lower side and configurations other than the reinforcement members 51-11 are the same as in the first example.

Concrete configurations of each component of the piezoelectric actuator 61-11 are as follow.
Piezoelectric element 11-11: Same configurations as in the first example.
Pedestal 21-11: Same configurations as in the first example.
Vibration film 31-11: Same configurations as in the first example.
Support member 41-11: Same configurations as in the first example.
Reinforcement members 51-11: Constructed by using phosphor bronze being 5 mm in outer diameter and being 0.05 mm in thickness.
[Measurement Result]
Basic resonant frequency: 1015 Hz
Maximum vibration speed amplitude: 215 mm/s
Vibration speed ratio: 0.84
Vibration mode: piston-type
Sound pressure level (1 kHz): 89 dB
Sound pressure level (3 kHz): 86 dB
Sound pressure level (5 kHz): 88 dB
Sound pressure level (10 kHz): 90 dB
Flatness of sound level frequency characteristics: ○
Drop shock stability: ○

Figure 44:
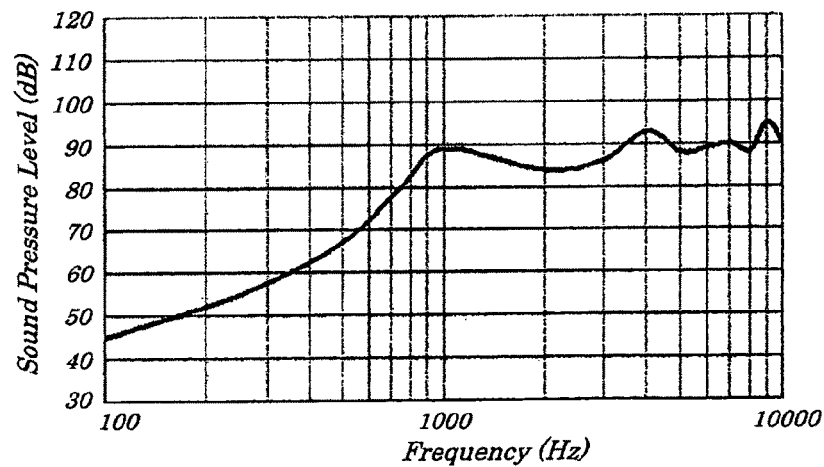
FIG. 44 is a diagram showing acoustic characteristics of the eleventh example.

As is apparent from the measurement results, in the eleventh example, the piezoelectric actuator 61-11 has the same equivalent characteristics as in the first example and, regardless of the placement position of its reinforcement members 51-11, sound pressure level frequency characteristics are flat and neither dips nor peaks are observed. Moreover, the vibration amplitude is large at the basic resonant frequency of 1 kHz or less and the piezoelectric actuator 61-11 takes the piston-type vibration mode and it has been demonstrated that the piezoelectric actuator 61-11 has the sound pressure level exceeding 80 dB in a wide frequency band from 1 to 10 kHz (see acoustic characteristic diagram of the eleventh example in FIG. 44). Also, the thickness of the piezoelectric actuator 61-11 (that is, the thickness of the support member 41-11) is 1.5 mm and, therefore, sufficient thinning has been achieved.

Twelfth Example

As the twelfth example, the piezoelectric actuator 61-12 as shown in FIGS. 26A and 26B was fabricated. In the piezoelectric actuator 61-12 of the twelfth example, only the shape of its reinforcement member 61-12 was changed relative to the configurations of the eleventh example and configurations other than the reinforcement member 51-12 were the same as in the first and eleventh examples.

Concrete configurations of each component of the piezoelectric actuator 61-12 are as follow.
Piezoelectric element 11-11: Same configurations as in the first example.
Pedestal 21-11: Same configurations as in the first example.
Vibration film 31-11: Same configurations as in the first example.
Support member 41-11: Same configurations as in the first example.
Reinforcement member 51-12: Constructed by using phosphor bronze being 3 mm in outer diameter and being 0.05 mm in thickness.
[Measurement Result]
Basic resonant frequency: 995 Hz
Maximum vibration speed amplitude: 225 mm/s
Vibration speed ratio: 0.81
Vibration mode: piston-type
Sound pressure level (1 kHz): 91 dB
Sound pressure level (3 kHz): 88 dB
Sound pressure level (5 kHz): 89 dB
Sound pressure level (10 kHz): 91 dB
Flatness of sound level frequency characteristics: ○
Drop shock stability: ○

Figure 45:
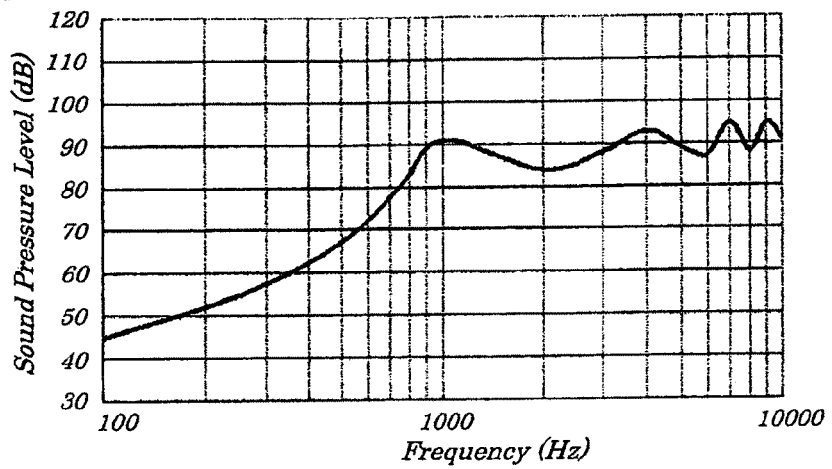
FIG. 45 is a diagram showing acoustic characteristics of the twelfth example.

As is apparent from the measurement results, in the twelfth example, the piezoelectric actuator 61-12 has the same equivalent characteristics as in the first example and, regardless of the outer shape and placement position of its reinforcement member 51-12, sound pressure level frequency characteristics are flat and neither dips nor peaks are observed. Moreover, the vibration amplitude is large at the basic resonant frequency of 1 kHz or less and the piezoelectric actuator 61-12 takes the piston-type vibration mode and it has been demonstrated that the piezoelectric actuator 61-12 has the sound pressure level exceeding 80 dB in a wide frequency band from 1 to 10 kHz (see acoustic characteristic diagram of the twelfth example in FIG. 45). Also, the thickness of the piezoelectric actuator 61-12 (that is, the thickness of the support member 41-12) is 1.5 mm and, therefore, sufficient thinning has been achieved.

Thirteenth Example

As the thirteenth example, the piezoelectric actuator 61-13 as shown in FIGS. 26A and 26B was fabricated. In the piezoelectric actuator 61-13 of the thirteenth example, only the thickness of its reinforcement member 61-13 was changed relative to the configurations of the first example and configurations other than the reinforcement member 51-13 were the same as in the first and eleventh examples.

Concrete configurations of each component of the piezoelectric actuator 61-13 are as follow.
Piezoelectric element 11-11: Same configurations as in the first example.
Pedestal 21-11: Same configurations as in the first example.

Vibration film 31-11: Same configurations as in the first example.
Support member 41-11: Same configurations as in the first example.
Reinforcement member 51-13: Constructed by using phosphor bronze being 5 mm in outer diameter and being 0.75 mm in thickness.
[Measurement Result]
Basic resonant frequency: 1000 Hz
Maximum vibration speed amplitude: 215 mm/s
Vibration speed ratio: 0.81
Vibration mode: piston-type
Sound pressure level (1 kHz): 87 dB
Sound pressure level (3 kHz): 86 dB
Sound pressure level (5 kHz): 83 dB
Sound pressure level (10 kHz): 92 dB
Flatness of sound level frequency characteristics: ○
Drop shock stability: ○

Figure 46:
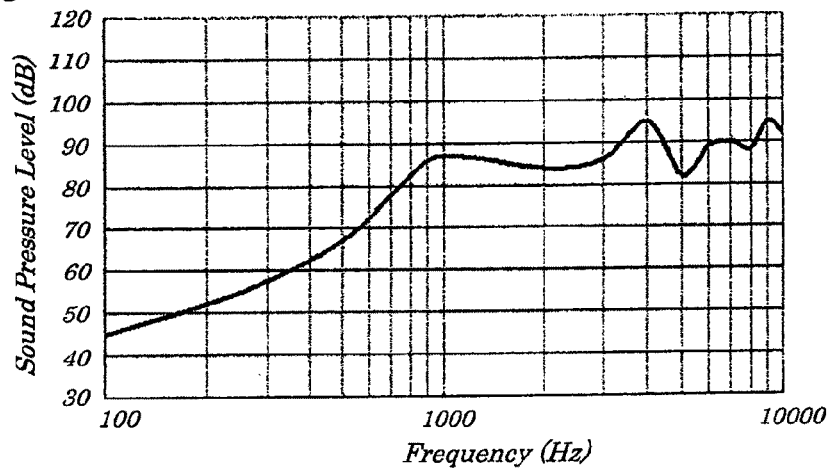
FIG. 46 is a diagram showing acoustic characteristics of the thirteenth example.

As is apparent from the measurement results, in the thirteenth example, the piezoelectric actuator 61-13 has the same equivalent characteristics as in the first example and, regardless of the shape of its reinforcement member 51-13, sound pressure level frequency characteristics are flat and neither dips nor peaks are observed. Moreover, the vibration amplitude is large at the basic resonant frequency of 1 kHz or less and the piezoelectric actuator 61-13 takes the piston-type vibration mode and it has been demonstrated that the piezoelectric actuator 61-13 has the sound pressure level exceeding 80 dB in a wide frequency band from 1 to 10 kHz (see acoustic characteristic diagram of the thirteenth example in FIG. 46). Also, the thickness of the piezoelectric actuator 61-13 (that is, the thickness of the support member 41-13) is 1.5 mm and, therefore, sufficient thinning has been achieved.

Fourteenth Example

As the fourteenth example, the piezoelectric actuator 61-14 as shown in FIGS. 26A and 26B was fabricated. In the piezoelectric actuator 61-14 of the fourteenth example, only the thickness of its reinforcement member 61-14 was changed relative to the configurations of the thirteenth example and configurations other than the reinforcement member 51-14 were the same as in the first and thirteenth examples.

Concrete configurations of each component of the piezoelectric actuator 61-14 are as follow.
Piezoelectric element 11-11: Same configurations as in the first example.
Pedestal 21-11: Same configurations as in the first example.
Vibration film 31-11: Same configurations as in the first example.
Support member 41-11: Same configurations as in the first example.
Reinforcement member 51-14: Constructed by using phosphor bronze being 5 mm in outer diameter and being 0.1 mm in thickness.
[Measurement Result]
Basic resonant frequency: 1000 Hz
Maximum vibration speed amplitude: 215 mm/s
Vibration speed ratio: 0.81
Vibration mode: piston-type
Sound pressure level (1 kHz): 86 dB
Sound pressure level (3 kHz): 84 dB
Sound pressure level (5 kHz): 84 dB
Sound pressure level (10 kHz): 90 dB
Flatness of sound level frequency characteristics: ○
Drop shock stability: ○

Figure 47:
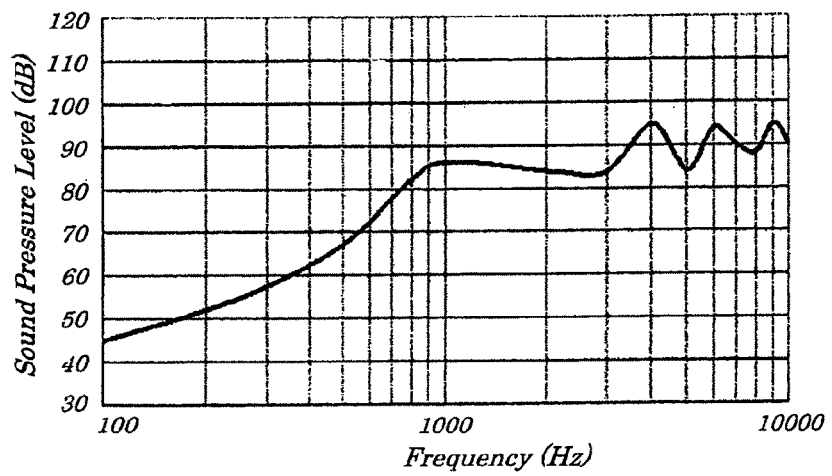
FIG. 47 is a diagram showing acoustic characteristics of the fourteenth example.

As is apparent from the measurement results, in the fourteenth example, the piezoelectric actuator 61-14 has the same equivalent characteristics as in the first example and, regardless of the shape of its reinforcement member 51-14, sound pressure level frequency characteristics are flat and neither dips nor peaks are observed. Moreover, the vibration amplitude is large at the basic resonant frequency of 1 kHz or less and the piezoelectric actuator 61-14 takes the piston-type vibration mode and it has been demonstrated that the piezoelectric actuator 61-14 has the sound pressure level exceeding 80 dB in a wide frequency band from 1 to 10 kHz (see acoustic characteristic diagram of the fourteenth example in FIG. 47). Also, the thickness of the piezoelectric actuator 61-14 (that is, the thickness of the support member 41-14) is 1.5 mm and, therefore, sufficient thinning has been achieved.

Fifteenth Example

As the fifteenth example, the piezoelectric actuator 61-15 as shown in FIGS. 26A and 26B was fabricated. In the piezoelectric actuator 61-15 of the fifteenth example, only the material for its reinforcement member 61-15 was changed relative to the configurations of the fifteenth example and configurations other than the reinforcement member 51-15 were the same as in the first example.

Concrete configurations of each component of the piezoelectric actuator 61-15 are as follow.
Piezoelectric element 11-11: Same configurations as in the first example.
Pedestal 21-11: Same configurations as in the first example.
Vibration film 31-11: Same configurations as in the first example.
Support member 41-11: Same configurations as in the first example.
Reinforcement member 51-15: Constructed by using phosphor bronze being 5 mm in outer diameter and being 0.05 mm in thickness.
[Measurement Result]
Basic resonant frequency: 934 Hz
Maximum vibration speed amplitude: 225 mm/s
Vibration speed ratio: 0.82
Vibration mode: piston-type
Sound pressure level (1 kHz): 93 dB
Sound pressure level (3 kHz): 87 dB
Sound pressure level (5 kHz): 83 dB
Sound pressure level (10 kHz): 89 dB
Flatness of sound level frequency characteristics: ○
Drop shock stability: ○

Figure 48:
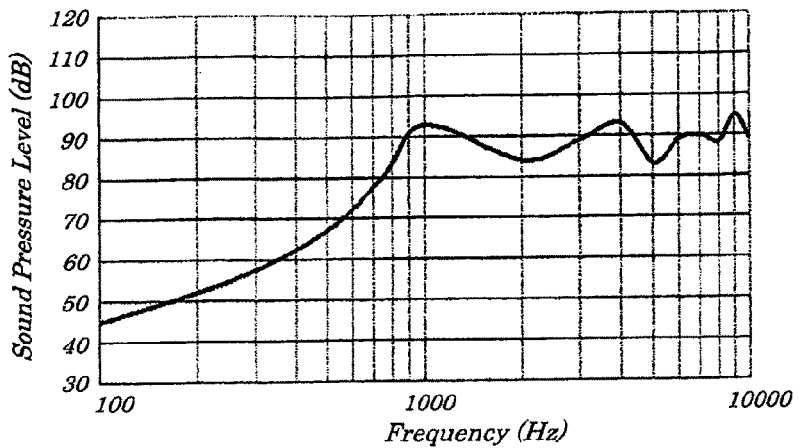
FIG. 48 is a diagram showing acoustic characteristics of the fifteenth example.

As is apparent from the measurement results, in the fifteenth example, the piezoelectric actuator 61-15 has the same equivalent characteristics as in the first example and, regardless of the material for its reinforcement member 51-15, sound pressure level frequency characteristics are flat and neither dips nor peaks are observed. Moreover, the vibration amplitude is large at the basic resonant frequency of 1 kHz or less and the piezoelectric actuator 61-15 takes the piston-type vibration mode and it has been demonstrated that the piezoelectric actuator 61-15 has the sound pressure level exceeding 80 dB in a wide frequency band from 1 to 10 kHz (see acoustic characteristic diagram of the fifteenth example in FIG. 48). Also, the thickness of the piezoelectric actuator 61-15 (that is, the thickness of the support member 41-15) is 1.5 mm and, therefore, sufficient thinning has been achieved.

Sixteenth Example

As the sixteenth example, the piezoelectric actuator 61-16 as shown in FIGS. 26A and 26B was fabricated. In the piezoelectric actuator 61-16 of the sixteenth example, only the material for its reinforcement member 61-16 was changed relative to the configurations of the sixteenth example and configurations other than the reinforcement member 51-16 were the same as in the first example.

Concrete configurations of each component of the piezoelectric actuator 61-16 are as follow.

Piezoelectric element 11-11: Same configurations as in the first example.
Pedestal 21-11: Same configurations as in the first example.
Vibration film 31-11: Same configurations as in the first example.
Support member 41-11: Same configurations as in the first example.
Reinforcement member 51-16: Constructed by using SUS304 being 5 mm in outer diameter and being 0.05 mm in thickness.

[Measurement Result]
Basic resonant frequency: 984 Hz
Maximum vibration speed amplitude: 215 mm/s
Vibration speed ratio: 0.81
Vibration mode: piston-type
Sound pressure level (1 kHz): 91 dB
Sound pressure level (3 kHz): 88 dB
Sound pressure level (5 kHz): 80 dB
Sound pressure level (10 kHz): 89 dB
Flatness of sound level frequency characteristics: ◯
Drop shock stability: ◯

Figure 49:
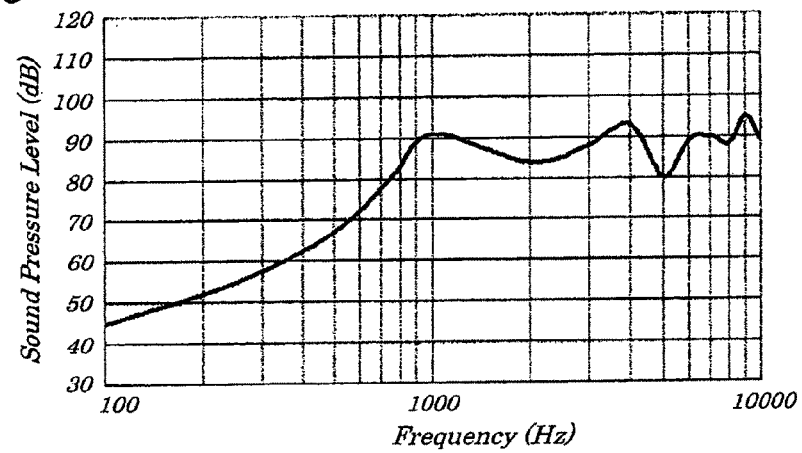
FIG. 49 is a diagram showing acoustic characteristics of the sixteenth example.

As is apparent from the measurement results, in the sixteenth example, the piezoelectric actuator 61-16 has the same equivalent characteristics as in the first example and, regardless of the material for its reinforcement member 51-16, sound pressure level frequency characteristics are flat and neither dips nor peaks are observed. Moreover, the vibration amplitude is large at the basic resonant frequency of 1 kHz or less and the piezoelectric actuator 61-16 takes the piston-type vibration mode and it has been demonstrated that the piezoelectric actuator 61-16 has the sound pressure level exceeding 80 dB in a wide frequency band from 1 to 10 kHz (see acoustic characteristic diagram of the sixteenth example in FIG. 49). Also, the thickness of the piezoelectric actuator 61-16 (that is, the thickness of the support member 41-16) is 1.5 mm and, therefore, sufficient thinning has been achieved.

Seventeenth Example

Figure 27A:
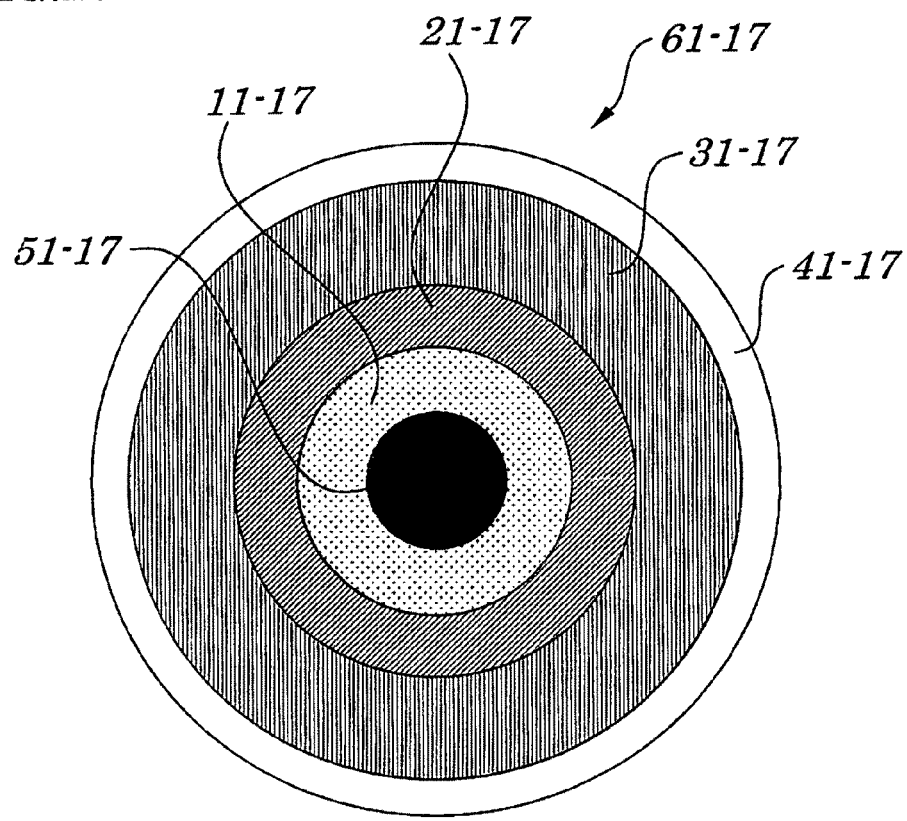
FIGS. 27A and 27B are diagrams showing configurations of a seventeenth example of the present invention.
Figure 27B:
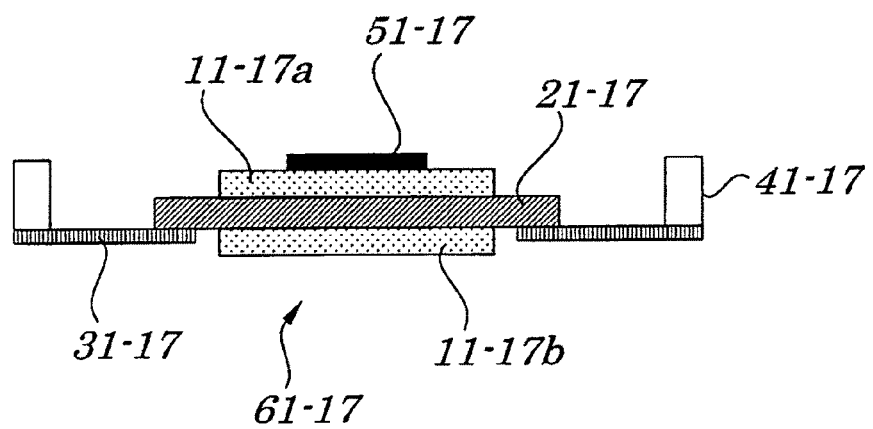

FIGS. 27A and 27B are diagrams showing configurations of the piezoelectric actuator according to the seventeenth example; FIG. 27A is its top view, and FIG. 27B is its vertical cross-sectional view. That is, as the seventeenth example, the bimorph-type piezoelectric actuator 61-17 as shown in FIGS. 27A and 27B was fabricated. In the piezoelectric actuator 61-17 of the seventeenth example, by disposing an additional piezoelectric element 11-17b on the rear of the pedestal 21-1 of the piezoelectric actuator 61-1 according to the first example (see FIGS. 18A and 18B), the bimorph-type actuator was realized. As shown in FIG. 27B, the piezoelectric element 11-17a is mounted on the upper surface of the pedestal 21-17 and the piezoelectric actuator 11-17b on the lower surface of the pedestal 21-17. The vibration film 31-17 is of a hollow-shape type and its drawing diameter is 15 mm. The configurations of the reinforcement member 51-17 are the same as in the first example.

Concrete configurations of each component of the piezoelectric actuator 61-17 are as follow.

Piezoelectric element 11-17a: Same configurations as those of the piezoelectric element 11-1 according to the first example.
Piezoelectric element 11-17b: Its basic configurations are the same as those of the piezoelectric element 11-1 (however, the piezoelectric element 11-17b does a motion reverse to that of the piezoelectric element 11-17a.
Pedestal 21-17: Same configurations as in the first example.
Vibration film 31-17: Same configurations as in the first example (gouged out for an inner diameter of 15 mm).
Support member 41-17: Same configurations as in the first example.
Reinforcement member 51-17: Same configurations as in the first example.

[Measurement Result]
Basic resonant frequency: 897 Hz
Maximum vibration speed amplitude: 360 mm/s
Vibration speed ratio: 0.83
Vibration mode: piston-type
Sound pressure level (1 kHz): 101 dB
Sound pressure level (3 kHz): 93 dB
Sound pressure level (5 kHz): 89 dB
Sound pressure level (10 kHz): 107 dB
Flatness of sound level frequency characteristics: ◯
Drop shock stability: ◯

Figure 50:
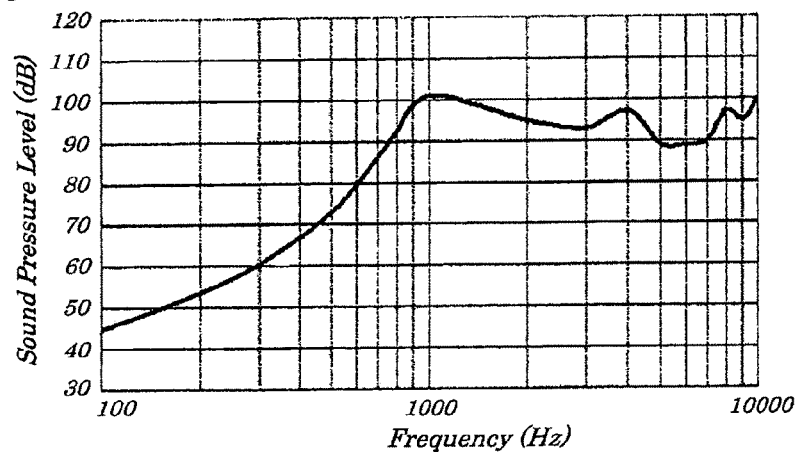
FIG. 50 is a diagram showing acoustic characteristics of the seventeenth example.

As is apparent from the measurement results, in the seventeenth example, the piezoelectric actuator 61-17 has the same equivalent characteristics as in the first example and sound pressure level frequency characteristics are flat and neither dips nor peaks are observed. Moreover, the vibration amplitude is large at the basic resonant frequency of 1 kHz or less and the piezoelectric actuator 61-17 takes the piston-type vibration mode and it has been demonstrated that the piezoelectric actuator 61-17 has the sound pressure level exceeding 80 dB in a wide frequency band from 1 to 10 kHz (see acoustic characteristic diagram of the seventeenth example in FIG. 50). It has been demonstrated that the sound pressure level is increased by employing the bimorph-type structure. Also, the thickness of the piezoelectric actuator 61-17 (that is, the thickness of the support member 41-17) is 1.5 mm and, therefore, sufficient thinning has been achieved.

Eighteenth Example

Figure 28A:
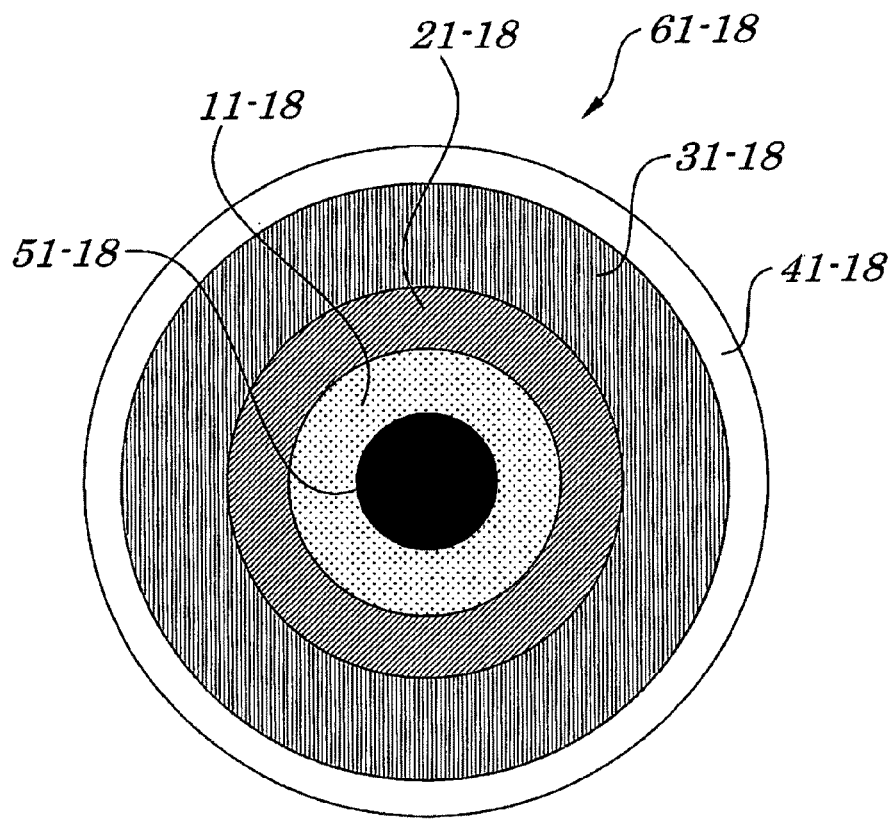
FIGS. 28A and 28B are diagrams showing configurations of an eighteenth example of the present invention.
Figure 28B:
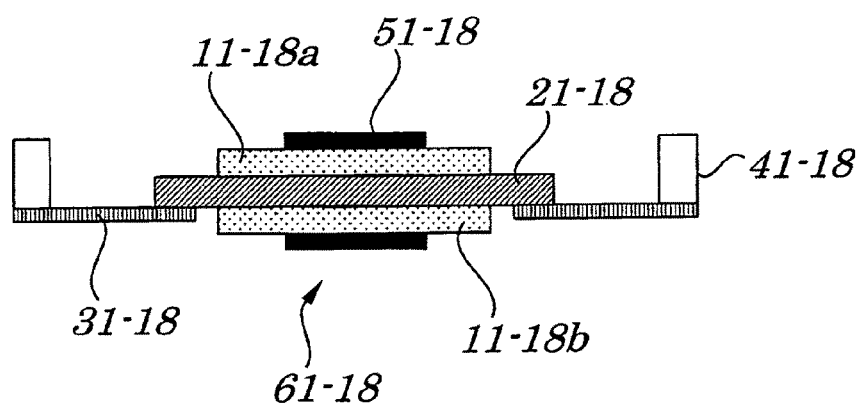

FIGS. 28A and 28B are diagrams showing configurations of the piezoelectric actuator according to the eighteenth example; FIG. 28A is its top view, and FIG. 28B is its vertical cross-sectional view. That is, as the eighteenth example, the bimorph-type piezoelectric actuator 61-18 as shown in FIGS. 28A and 28B was fabricated. In the piezoelectric actuator 61-18 of the eighteenth example, unlike in the case of the seventeenth example, the reinforcement members 51-18 are bonded to both side of the piezoelectric actuator 61-18 and configurations other than the reinforcement members 51-18 are the same as in the seventeenth example.

Concrete configurations of each component of the piezoelectric actuator 61-18 are as follow.

Piezoelectric element 11-18a: Same configurations as those of the piezoelectric element 11-1 according to the first example.
Piezoelectric element 11-18b: Same configurations as those of the piezoelectric element 11-1 according to the first example.
Pedestal 21-18: Same configurations as in the first example.
Vibration film 31-18: Same configurations as in the first example.

Support member 41-18: Same configurations as in the first example.
Reinforcement member 51-18: Constructed by using two pieces of phosphor bronze each being 3 mm in outer diameter and being 0.05 mm in thickness.
[Measurement Result]
Basic resonant frequency: 917 Hz
Maximum vibration speed amplitude: 330 mm/s
Vibration speed ratio: 0.82
Vibration mode: piston-type
Sound pressure level (1 kHz): 97 dB
Sound pressure level (3 kHz): 90 dB
Sound pressure level (5 kHz): 86 dB
Sound pressure level (10 kHz): 101 dB
Flatness of sound level frequency characteristics: ○
Drop shock stability: ○

Figure 51:
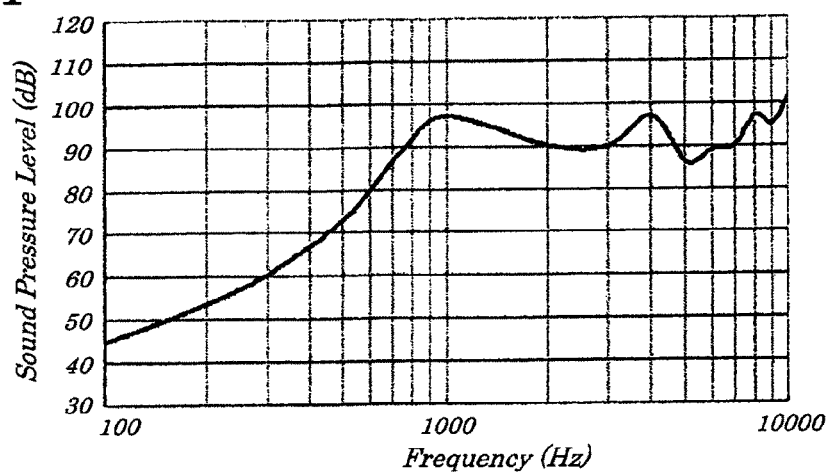
FIG. 51 is a diagram showing acoustic characteristics of the eighteenth example.

As is apparent from the measurement results, in the eighteenth example, the piezoelectric actuator 61-18 has the same equivalent characteristics as in the first example and sound pressure level frequency characteristics are flat and neither dips nor peaks are observed. Moreover, the vibration amplitude is large at the basic resonant frequency of 1 kHz or less and the piezoelectric actuator 61-18 takes the piston-type vibration mode and it has been demonstrated that the piezoelectric actuator 61-18 has the sound pressure level exceeding 80 dB in a wide frequency band from 1 to 10 kHz (see acoustic characteristic diagram of the eighteenth example in FIG. 51). It has been demonstrated that the sound pressure level is increased by employing the bimorph-type structure. Also, the thickness of the piezoelectric actuator 61-18 (that is, the thickness of the support member 41-18) is 1.5 mm and, therefore, sufficient thinning has been achieved.

Nineteenth Example

Figure 29A:
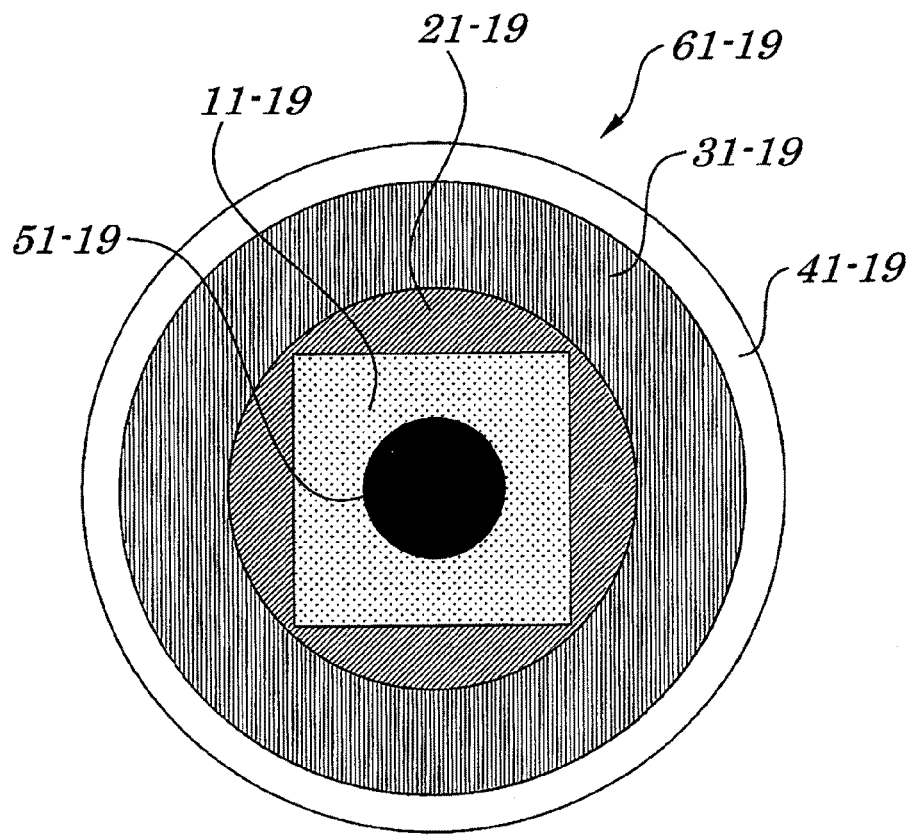
FIGS. 29A and 29B are diagrams showing configurations of an nineteenth example of the present invention.
Figure 29B:
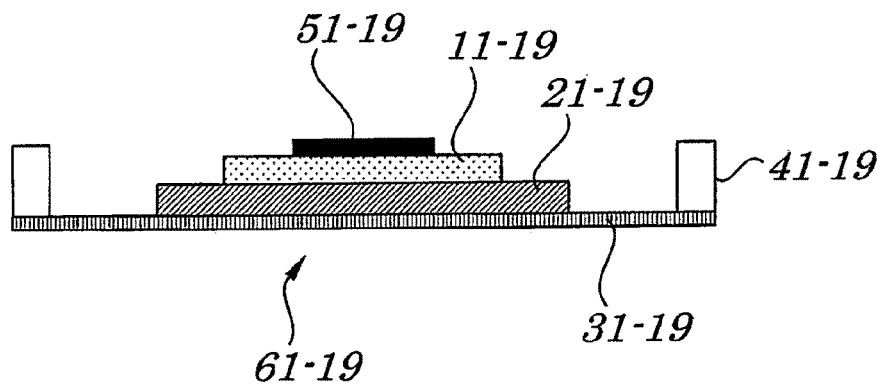

FIGS. 29A and 29B are diagrams showing configurations of the piezoelectric actuator according to the nineteenth example; FIG. 29A is its top view, and FIG. 29B is its vertical cross-sectional view. That is, as the nineteenth example, the piezoelectric actuator 61-19 as shown in FIGS. 29A and 29B was fabricated. In the piezoelectric actuator 61-19 of the nineteenth example, a right rectangular piezoelectric element (piezoelectric ceramic) 61-19 is used and its configurations other than the piezoelectric element 61-19 are the same as in the first example.

Concrete configurations of each component of the piezoelectric actuator 61-19 are as follow.
Piezoelectric element 11-19: Constructed by forming an upper electrode layer with a thickness of 8 μm on one upper surface of a piezoelectric plate being 16×16 mm in outer diameter and 50 μm (0.05 mm) in thickness and a lower electrode layer with a thickness of 8 μm on one lower surface of the piezoelectric plate.
Pedestal 21-19: Same configurations as in the first example.
Vibration 31-19: Same configurations as in the first example.
Support member 41-19: Same configurations as in the first example.
Reinforcement member 51-19: Same configurations as in the first example.
[Measurement Result]
Basic resonant frequency: 944 Hz
Maximum vibration speed amplitude: 205 mm/s
Vibration speed ratio: 0.81
Vibration mode: piston-type
Sound pressure level (1 kHz): 89 dB
Sound pressure level (3 kHz): 87 dB
Sound pressure level (5 kHz): 81 dB
Sound pressure level (10 kHz): 88 dB
Flatness of sound level frequency characteristics: ○
Drop shock stability: ○

Figure 52:
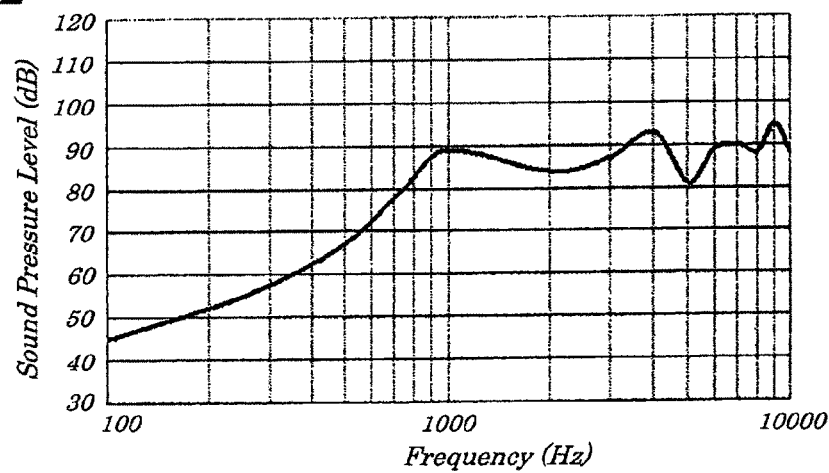
FIG. 52 is a diagram showing acoustic characteristics of the nineteenth example.

As is apparent from the measurement results, in the nineteenth example, the piezoelectric actuator 61-19 has the same equivalent characteristics as in the first example and, regardless of the outer shape of the piezoelectric actuator 61-19, sound pressure level frequency characteristics are flat and neither dips nor peaks are observed. Moreover, the vibration amplitude is large at the basic resonant frequency of 1 kHz or less and the piezoelectric actuator 61-19 takes the piston-type vibration mode and it has been demonstrated that the piezoelectric actuator 61-19 has the sound pressure level exceeding 80 dB in a wide frequency band from 1 to 10 kHz (see acoustic characteristic diagram of the nineteenth example in FIG. 52). Also, the thickness of the piezoelectric actuator 61-19 (that is, the thickness of the support member 41-19) is 1.5 mm and, therefore, sufficient thinning has been achieved.

Twentieth Example

As the twentieth example, the piezoelectric actuator 61-20 as shown in FIGS. 18A and 18B was fabricated. The outer dimensions of the piezoelectric actuator 61-20 of the twentieth example differ from those of the piezoelectric actuator 61-20 of the first example shown in FIGS. 18A and 18B.

Concrete configurations of each component of the piezoelectric actuator 61-20 of the twentieth example are as follow.
Piezoelectric element 21-20: Constructed by forming an upper electrode layer with a thickness of 8 μm on one upper surface of a piezoelectric plate being 10 mm in outer diameter and 50 μm (0.05 mm) in thickness and a lower electrode layer with a thickness of 8 μm on one lower surface of the piezoelectric plate.
Pedestal 21-20: Constructed by using phosphor bronze being 12 mm in outer diameter and 30 μm (0.03 mm) in thickness.
Vibration film 31-20: Formed by using a urethane-based film being 15 mm in outer diameter and 80 μm in thickness.
Support member 41-20: Constructed by using SUS304 being 15 mm in outer diameter, being 14 mm in inner diameter of a frame drawing portion, and being 1.5 mm in thickness.
Reinforcement member 51-20: Constructed by using phosphor being 2 mm in diameter and being 0.05 mm in thickness.
[Measurement Result]
Basic resonant frequency: 1105 Hz
Maximum vibration speed amplitude: 205 mm/s
Vibration speed ratio: 0.84
Vibration mode: piston-type
Sound pressure level (1 kHz): 82 dB
Sound pressure level (3 kHz): 84 dB
Sound pressure level (5 kHz): 80 dB
Sound pressure level (10 kHz): 87 dB
Flatness of sound level frequency characteristics: ○
Drop shock stability: ○

Figure 53:
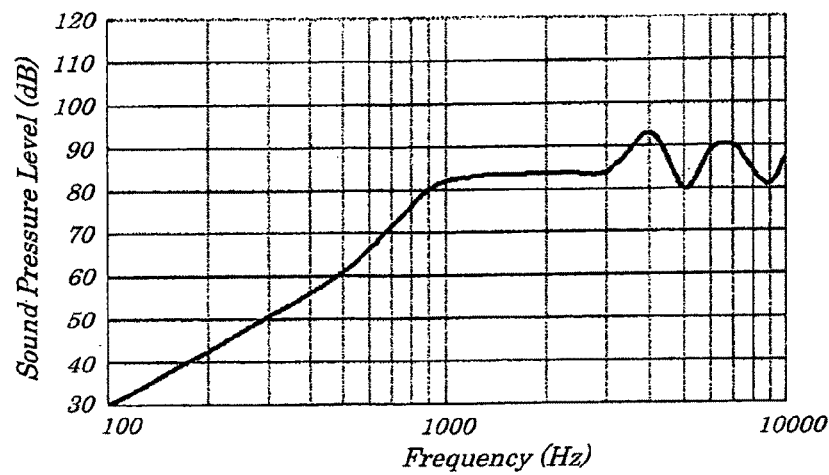
FIG. 53 is a diagram showing acoustic characteristics of the twentieth example.

As is apparent from the measurement results, in the twentieth example, the piezoelectric actuator 61-20 has the same equivalent characteristics as in the first example and, regardless of the outer shape of the piezoelectric actuator 61-20, sound pressure level frequency characteristics are flat and neither dips nor peaks are observed. Moreover, the vibration amplitude is large at the basic resonant frequency of 1 kHz or less and the piezoelectric actuator 61-20 takes the piston-type vibration mode and it has been demonstrated that the piezoelectric actuator 61-20 has the sound pressure level exceeding 80 dB in a wide frequency band from 1 to 10 kHz (see acoustic characteristic diagram of the twentieth example in FIG. 53).

Also, the piezoelectric actuator 61-20 is 15 mm in diameter and 1.5 mm in thickness (that is, the support member 41-20 is 1.5 mm in thickness) and, sufficient miniaturization and thinning have been achieved accordingly.

Twenty-First Example

As the twenty-first example, the piezoelectric actuator whose dimensions of each component were changed relative to each of the piezoelectric actuator according to the twentieth example was fabricated. Therefore, in the twenty-first example, the suffix number for each component following a hyphen shown in FIGS. 18A and 18B used in the twentieth example is to be replaced with "21", for example, in the twenty-first example, the piezoelectric actuator 61-20 shown in FIGS. 18A and 18B is to be replaced with the piezoelectric actuator 61-21 to be used in the twenty-first example.

Concrete configurations of each component of the piezoelectric actuator 61-21 according to the twenty-first example are as follow.

Piezoelectric element 11-21: Constructed by forming an upper electrode layer with a thickness of 8 μm on one upper surface of a piezoelectric plate being 18 mm in outer diameter and 50 μm (0.05 mm) in thickness and a lower electrode layer with a thickness of 8 μm on one lower surface of the piezoelectric plate.
Pedestal 21-21: Constructed by using phosphor bronze being 20 mm in outer diameter and 30 μm (0.03 mm) in thickness.
Vibration film 31-21: Formed by using a urethane-based film being 23 mm in outer diameter and 80 μm in thickness.
Support member 41-21: Constructed by using SUS304 being 23 mm in outer diameter, being 22 mm in inner diameter of a frame drawing portion, and being 1.5 mm in thickness.
Reinforcement member 51-21: Constructed by using phosphor being 5 mm in diameter and being 0.05 mm in thickness.
[Measurement Result]
Basic resonant frequency: 875 Hz
Maximum vibration speed amplitude: 405 mm/s
Vibration speed ratio: 0.83
Vibration mode: piston-type
Sound pressure level (1 kHz): 106 dB
Sound pressure level (3 kHz): 97 dB
Sound pressure level (5 kHz): 108 dB
Sound pressure level (10 kHz): 110 dB
Flatness of sound level frequency characteristics: ◯
Drop shock stability: ◯

Figure 54:
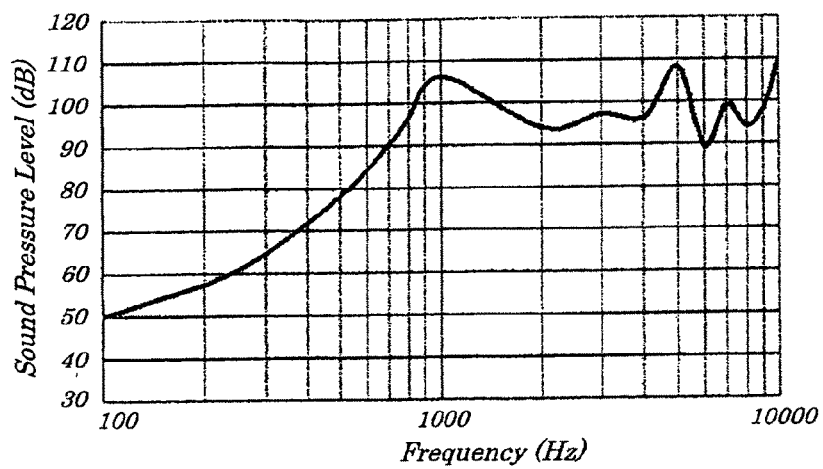
FIG. 54 is a diagram showing acoustic characteristics of the twenty-first example.

As is apparent from the measurement results, in the twenty-first example, the piezoelectric actuator 61-21 has the same equivalent characteristics as in the first example and, regardless of the outer shape of the piezoelectric actuator 61-21, sound pressure level frequency characteristics are flat and neither dips nor peaks are observed. Moreover, the vibration amplitude is large at the basic resonant frequency of 1 kHz or less and the piezoelectric actuator 61-20 takes the piston-type vibration mode and it has been demonstrated that the piezoelectric actuator 61-20 has the sound pressure level exceeding 80 dB in a wide frequency band from 1 to 10 kHz (see acoustic characteristic diagram of the twenty-first example in FIG. 54). Also, the thickness of the piezoelectric actuator 61-21 (that is, thickness of the support member 41-21) is 1.5 mm and, sufficient miniaturization and thinning have been achieved accordingly.

Twenty-Second Example

In the twenty-second example, the suffix number for each component following a hyphen shown in FIGS. 18A and 18B is to be replaced with "22" to be used in the twenty-second example. That is, as the twenty-second example, the piezoelectric actuator 61-22 as shown in FIGS. 18A and 18B was fabricated. In the piezoelectric actuator 61-22 of the twenty-second example, only the material for the vibration film 31-22 was changed relative to the first example and configurations other than the vibration film 31-22 are the same as in the first example.

Concrete configurations of each component of the piezoelectric actuator 61-22 are as follow.

The piezoelectric element 11-22: Same configurations as in the first example.
Pedestal 21-22: Same configurations as in the first example.
Vibration 31-22: Same configurations as in the first example and PET with a thickness of 50 μm was used.
Support member 41-22: Same configurations as in the first example. Reinforcement member 51-22: Constructed by using phosphor bronze being 5 mm in diameter and 0.05 mm in thickness.
[Measurement Result]
Basic resonant frequency: 914 Hz
Maximum vibration speed amplitude: 225 mm/s
Vibration speed ratio: 0.85
Vibration mode: piston-type
Sound pressure level (1 kHz): 93 dB
Sound pressure level (3 kHz): 88 dB
Sound pressure level (5 kHz): 81 dB
Sound pressure level (10 kHz): 87 dB
Flatness of sound level frequency characteristics: ◯
Drop shock stability: ◯

Figure 55:
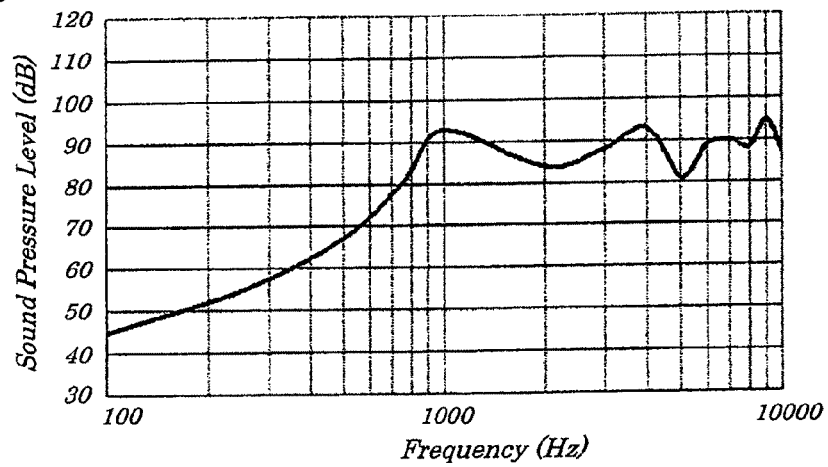
FIG. 55 is a diagram showing acoustic characteristics of the twenty-second example.

As is apparent from the measurement results, in the twenty-first example, the piezoelectric actuator 61-22 has the same equivalent characteristics as in the first example and, regardless of the material for the vibration film 31-22, sound pressure level frequency characteristics are flat and neither dips nor peaks are observed. Moreover, the vibration amplitude is large at the basic resonant frequency of 1 kHz or less and the piezoelectric actuator 61-20 takes the piston-type vibration mode and it has been demonstrated that the piezoelectric actuator 61-22 has the sound pressure level exceeding 80 dB in a wide frequency band from 1 to 10 kHz (see acoustic characteristic diagram of the twenty-second example in FIG. 55). Also, the thickness of the piezoelectric actuator 61-22 (that is, the thickness of the support member 41-22) is 1.5 mm and, sufficient miniaturization and thinning have been achieved accordingly.

Twenty-Third Example

In the twenty-third example, the suffix number for each component following a hyphen shown in FIGS. 18A and 18B is to be replaced with "23" to be used in the twenty-third example. That is, as the twenty-third example, the piezoelectric actuator 61-23 as shown in FIGS. 18A and 18B was fabricated. In the piezoelectric actuator 61-23 of the twenty-third example, the bonding agent was changed relative to the first example and an acrylic bonding agent was used and configurations other than the bonding agent are the same as in the first example.

Concrete configurations of each component of the piezoelectric actuator 61-23 are as follow.
Piezoelectric element 11-23: Same configurations as in the first example.
Pedestal 21-23: Same configurations as in the first example.
Vibration film 31-23: Same configurations as in the first example.

Support member 41-23: Same configurations as in the first example.

Reinforcement member 51-23: Same configurations as in the first example.

[Measurement Result]
Basic resonant frequency: 921 Hz
Maximum vibration speed amplitude: 215 mm/s
Vibration speed ratio: 0.85
Vibration mode: piston-type
Sound pressure level (1 kHz): 93 dB
Sound pressure level (3 kHz): 88 dB
Sound pressure level (5 kHz): 81 dB
Sound pressure level (10 kHz): 88 dB
Flatness of sound level frequency characteristics: ○
Drop shock stability: ○

As is apparent from the measurement results, in the twenty-third example, the piezoelectric actuator 61-23 has the same equivalent characteristics as in the first example and, regardless of the material for the bonding agent to bond each component, sound pressure level frequency characteristics are flat and neither dips nor peaks are observed. Moreover, the vibration amplitude is large at the basic resonant frequency of 1 kHz or less and the piezoelectric actuator 61-23 takes the piston-type vibration mode and it has been demonstrated that the piezoelectric actuator 61-23 has the sound pressure level exceeding 80 dB in a wide frequency band from 1 to 10 kHz. Also, the thickness of the piezoelectric actuator 61-23 (that is, thickness of the support member 41-23) is 1.5 mm, thus having achieved sufficient thinning.

Twenty-Fourth Example

In the twenty-fourth example, the suffix number for each component following a hyphen shown in FIGS. 18A and 18B is to be replaced with "24" to be used in the twenty-fourth example. That is, as the twenty-fourth example, the piezoelectric actuator 61-24 as shown in FIGS. 18A and 18B was fabricated. In the piezoelectric actuator 61-24 of the twenty-fourth example, the material for the piezoelectric element 11-1 used in the first example was changed and, as the material for the piezoelectric element 11-24, barium titanate-based ceramics were used. Configurations other than the materials for the piezoelectric element 11-24 are the same as in the first example.

[Measurement Result]
Basic resonant frequency: 961 Hz
Maximum vibration speed amplitude: 235 mm/s
Vibration speed ratio: 0.81
Vibration mode: piston-type
Sound pressure level (1 kHz): 94 dB
Sound pressure level (3 kHz): 89 dB
Sound pressure level (5 kHz): 84 dB
Sound pressure level (10 kHz): 87 dB
Flatness of sound level frequency characteristics: ○
Drop shock stability: ○

As is apparent from the measurement results, in the twenty-third example, the piezoelectric actuator 61-24 has the same equivalent characteristics as in the first example and, regardless of the material for the piezoelectric element 11-24, sound pressure level frequency characteristics are flat and neither dips nor peaks are observed. Moreover, the vibration amplitude is large at the basic resonant frequency of 1 kHz or less and the piezoelectric actuator 61-24 takes the piston-type vibration mode and it has been demonstrated that the piezoelectric actuator 61-24 has the sound pressure level exceeding 80 dB in a wide frequency band from 1 to 10 kHz. Also, the thickness of the piezoelectric actuator 61-24 (that is, thickness of the support member 41-24) is 1.5 mm, thus having achieved sufficient thinning.

Twenty-Fifth Example

In the twenty-fifth example, the suffix number for each component following a hyphen shown in FIGS. 18A and 18B is to be replaced with "25" to be used in the twenty-fifth example. That is, as the twenty-fifth example, the piezoelectric actuator 61-25 as shown in FIGS. 18A and 18B was fabricated. In the piezoelectric actuator 61-25 of the twenty-fifth example, the electrode material used in the piezoelectric plate in the first example was changed to silver. Configurations other than the materials for the piezoelectric element 11-24 are the same as in the first example.

[Measurement Result]
Basic resonant frequency: 941 Hz
Maximum vibration speed amplitude: 205 mm/s
Vibration speed ratio: 0.83
Vibration mode: piston-type
Sound pressure level (1 kHz): 92 dB
Sound pressure level (3 kHz): 88 dB
Sound pressure level (5 kHz): 83 dB
Sound pressure level (10 kHz): 89 dB
Flatness of sound level frequency characteristics: ○
Drop shock stability: ○

As is apparent from the measurement results, in the twenty-fifth example, the piezoelectric actuator 61-25 has the same equivalent characteristics as in the first example and, regardless of the material for the electrode to be used for the piezoelectric element, sound pressure level frequency characteristics are flat and neither dips nor peaks are observed. Moreover, the vibration amplitude is large at the basic resonant frequency of 1 kHz or less and the piezoelectric actuator 61-25 takes the piston-type vibration mode and it has been demonstrated that the piezoelectric actuator 61-25 has the sound pressure level exceeding 80 dB in a wide frequency band from 1 to 10 kHz. Also, the thickness of the piezoelectric actuator 61-25 (that is, thickness of the support member 41-25) is 1.5 mm, thus achieving sufficient thinning.

Twenty-Sixth Example

Figure 30:
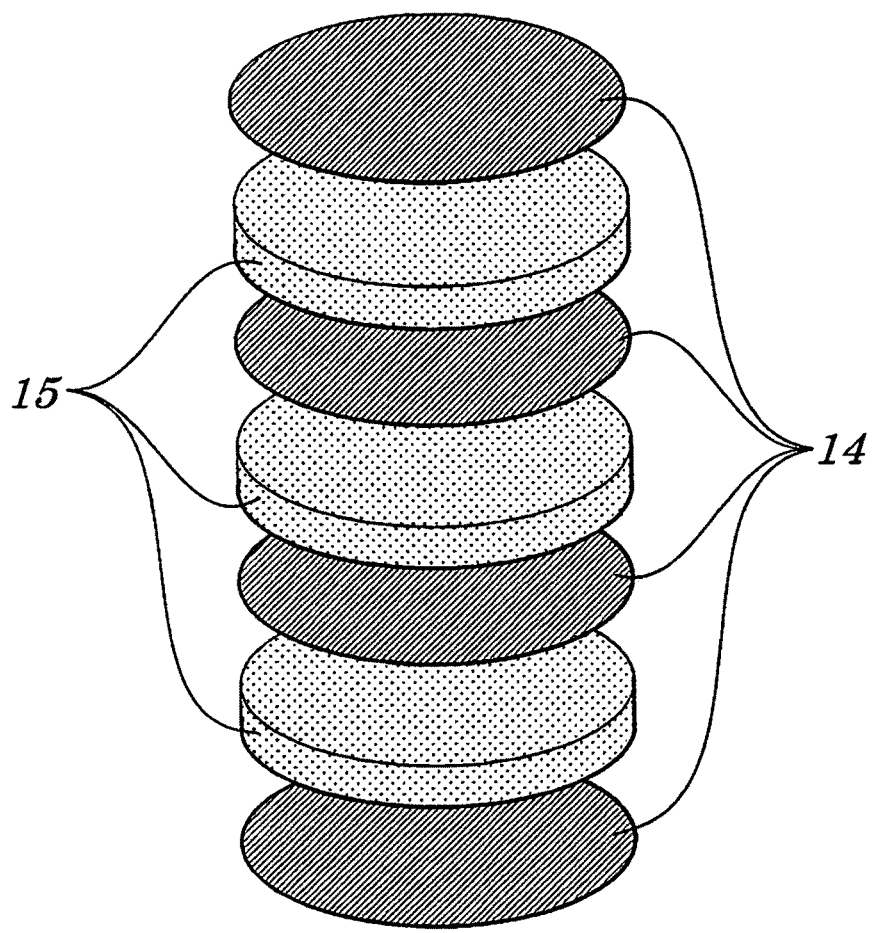
FIG. 30 is a perspective view showing configurations of a layered-type piezoelectric element to be used in the twenty-sixth example.

In the twenty-sixth example, the suffix number for each component following a hyphen shown in FIGS. 18A and 18B is to be replaced with "26" to be used in the twenty-fifth example. That is, as the twenty-sixth example, the piezoelectric actuator 61-26 as shown in FIGS. 18A and 18B was fabricated. In the piezoelectric actuator 61-26, the piezoelectric element 11-1 used in the first example was changed to a layered-type ceramic element. Configurations other than the above are the same as those in the first example. FIG. 30 is a perspective view showing configurations of the layered-type piezoelectric element to be used in the twenty-sixth example. That is, the layered ceramic element (layered piezoelectric element), as shown in FIG. 30, is so configured that three pieces of the piezoelectric layers 15 each with a thickness of 50 μm and four pieces of the piezoelectric layers 14 each with a thickness of 3 μm are alternately stacked. The material for the piezoelectric layer includes barium titanate-based ceramic and the material for the electrode includes a silver/paradigm alloy (weight ratio of 70%:30%).

[Measurement Result]
Basic resonant frequency: 941 Hz
Maximum vibration speed amplitude: 205 mm/s
Vibration speed ratio: 0.83

Vibration mode: piston-type
Sound pressure level (1 kHz): 97 dB
Sound pressure level (3 kHz): 91 dB
Sound pressure level (5 kHz): 93 dB
Sound pressure level (10 kHz): 104 dB
Flatness of sound level frequency characteristics: ○
Drop shock stability: ○

As is apparent from the measurement results, in the twenty-sixth example, the piezoelectric actuator 61-26 has the same equivalent characteristics as in the first example and, even if the material for the piezoelectric element was changed to the layered-type ceramic element, sound pressure level frequency characteristics are flat and neither dips nor peaks are observed. Moreover, the vibration amplitude is large at the basic resonant frequency of 1 kHz or less and the piezoelectric actuator 61-26 takes the piston-type vibration mode and it has been demonstrated that the piezoelectric actuator 61-26 has the sound pressure level exceeding 80 dB in a wide frequency band from 1 to 10 kHz. Also, it has been demonstrated that, by employing the layered-type piezoelectric element, the sound pressure level is improved. Furthermore, the thickness of the piezoelectric actuator 61-26 (that is, thickness of the support member 41-26) is 1.5 mm, thus achieving sufficient thinning.

Second Comparative Example

Figure 31A:
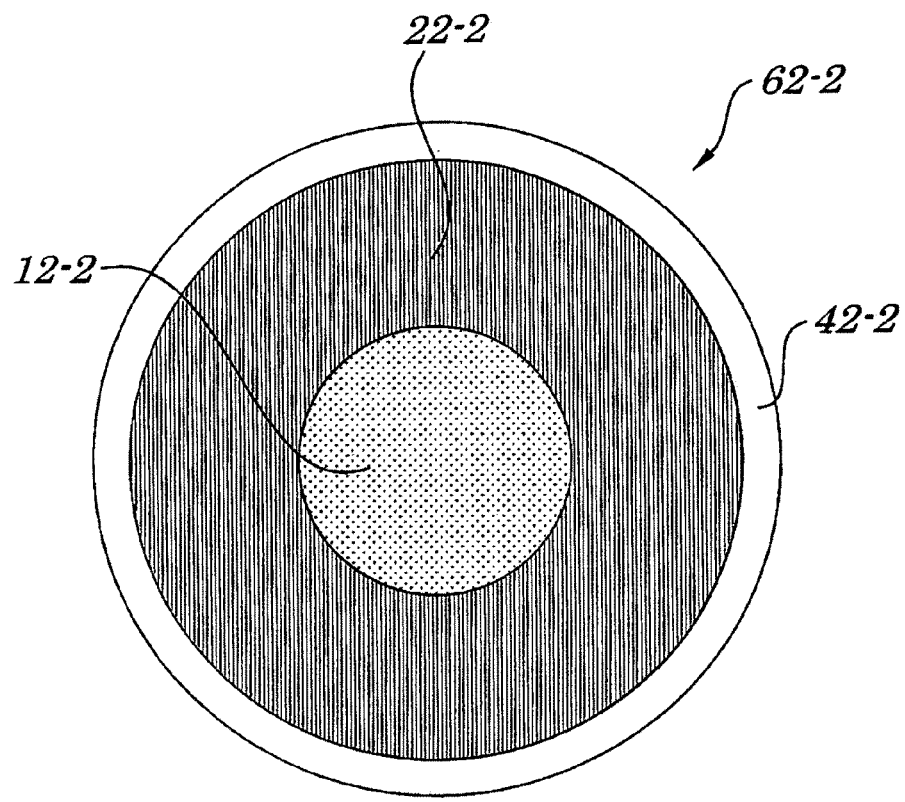
FIGS. 31A and 31B are diagrams showing configurations of the piezoelectric actuator according to the second comparative example corresponding to the twenty-sixth example.
Figure 31B:
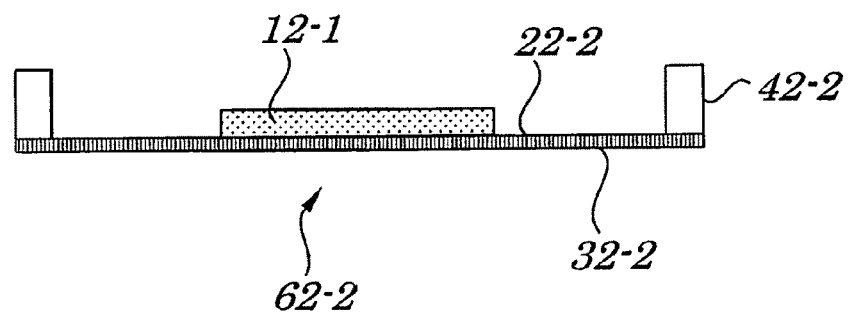

FIGS. 31A and 31B are diagrams showing configurations of the piezoelectric actuator according to the second comparative example; FIG. 31A is its top view, and FIG. 31B is its vertical cross-sectional view. That is, as the second comparative example of the twenty-sixth example, the piezoelectric actuator 62-2 as shown in FIGS. 31A and 31B was fabricated. The piezoelectric actuator 62-2 is related to a actuator according to the related art, and is made up of a piezoelectric element 12-2, pedestal 22-2, and support member 42-2.

Figure 56:
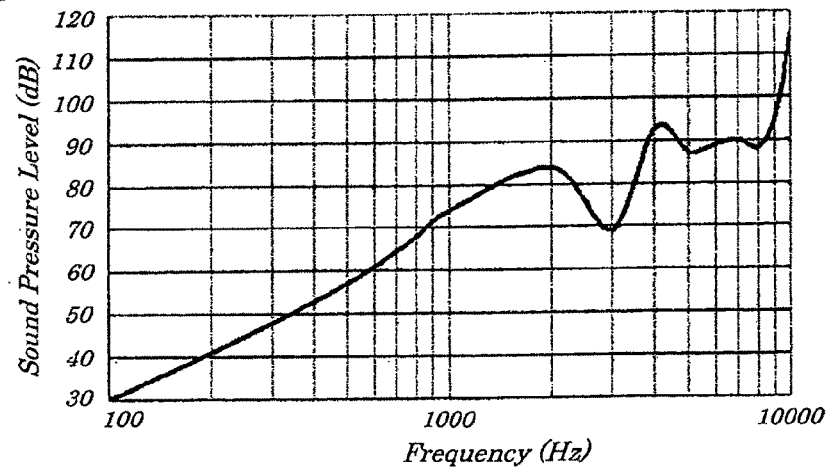
FIG. 56 is a diagram showing acoustic characteristics of the second comparative example corresponding to the twenty-sixth example.

Concrete configurations of each component of the piezoelectric actuator 62-2 are as follow.
Piezoelectric element 12-2: Same configurations as in the first example.
Pedestal 22-2: Made of phosphor bronze being 21 mm in diameter and being 0.05 mm in thickness.
Support member 22-2: Same configurations as in the first example.
[Measurement Result]
Basic resonant frequency: 1479 Hz
Maximum vibration speed amplitude: 115 mm/s
Vibration speed ratio: 0.67
Vibration mode: piston-type
Sound pressure level (1 kHz): 74 dB
Sound pressure level (3 kHz): 69 dB
Sound pressure level (5 kHz): 87 dB
Sound pressure level (10 kHz): 115 dB
Flatness of sound level frequency characteristics: ○
Drop shock stability: ○
(see the acoustic characteristic diagram of the second comparative example shown in FIG. 56)

Next, examples in which acoustic elements using piezoelectric actuators have been installed in mobile phones are described hereinafter by referring to twenty-seventh example to thirtieth example and fourth comparative example.

Twenty-Seventh Example

Figure 32:
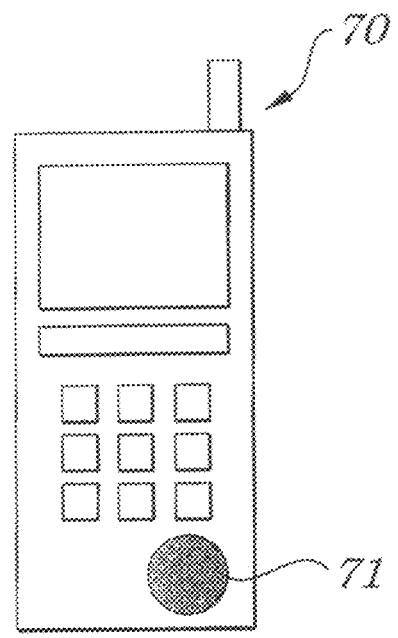
FIG. 32 is a concept diagram showing a state in which an acoustic element using the piezoelectric actuator according to the twenty-seventh example is installed on a mobile phone.

A first mobile phone according to the twenty-seventh example is described. FIG. 32 is a concept diagram showing the state in which an acoustic element using a piezoelectric actuator is installed on a mobile phone in the twenty-seventh example. That is, according to the twenty-seventh example, the mobile phone 70 as shown in FIG. 32 was prepared and the piezoelectric actuator 61-1 according to the first example (see FIGS. 18A and 18B) was installed within its enclosure. More specifically, the mobile phone 70 was configured that the piezoelectric actuator 61-1 was bonded to the side surface of the enclosure of the speaker portion 71 of the mobile phone 70.

For evaluation, the sound pressure level and frequency characteristics were measured by a microphone disposed at a position being 10 cm away from the piezoelectric element (that is, piezoelectric actuator 61-1). Also, a drop shock test was performed.
[Measurement Result]
Resonant frequency: 775 Hz
Sound pressure level (1 kHz): 85 dB
Sound pressure level (3 kHz): 84 dB
Sound pressure level (5 kHz): 89 dB
Sound pressure level (10 kHz): 86 dB
Drop shock test: No crack in the piezoelectric element was observed even after 5 times drop. After the drop shock test, the sound pressure level (1 kHz) was measured to be 84 dB.
Flatness of sound level frequency characteristics: ○

Twenty-Eighth Example

A second mobile phone according to the twenty-eighth example is described. That is, as the twenty-eighth example, as in the case of the above twenty-seventh example, the piezoelectric actuator 61-4 of the fourth example (see FIGS. 20A and 20B) was installed within the mobile phone 70. The evaluation contents were the same as for the above twenty-seventh example.
[Measurement Result]
Resonant frequency: 795 Hz
Sound pressure level (1 kHz): 86 dB
Sound pressure level (3 kHz): 86 dB
Sound pressure level (5 kHz): 92 dB
Sound pressure level (10 kHz): 85 dB
Drop shock test: No crack in the piezoelectric element was observed even after 5 times drop. After the drop shock test, the sound pressure level (1 kHz) was measured to be 86 dB.
Flatness of sound level frequency characteristics: ○

Twenty-Ninth Example

A third mobile phone according to the twenty-ninth example is described. That is, as the twenty-ninth example, as in the case of the above twenty-seventh example, the piezoelectric actuator 61-7 of the seventh example (see FIGS. 22A and 22B) was installed within the mobile phone 70. The evaluation contents were the same as for the above twenty-seventh example.
[Measurement Result]
Resonant frequency: 725 Hz
Sound pressure level (1 kHz): 83 dB
Sound pressure level (3 kHz): 85 dB
Sound pressure level (5 kHz): 86 dB
Sound pressure level (10 kHz): 84 dB
Drop shock test: No crack in the piezoelectric element was observed even after 5 times drop. After the drop shock test, the sound pressure level (1 kHz) was measured to be 82 dB.
Flatness of sound level frequency characteristics: ○

Thirtieth Example

A fourth mobile phone according to the thirtieth example is described. That is, as the thirtieth example, as in the case of the above twenty-seventh example, the piezoelectric actuator 61-10 of the tenth example (see FIGS. 25A and 25B) was installed within the mobile phone 70. The evaluation contents were the same as for the above twenty-seventh example.

[Measurement Result]
Resonant frequency: 765 Hz
Sound pressure level (1 kHz): 84 dB
Sound pressure level (3 kHz): 86 dB
Sound pressure level (5 kHz): 95 dB
Sound pressure level (10 kHz): 87 dB
Drop shock test: No crack in the piezoelectric element was observed even after 5 times drop. After the drop shock test, the sound pressure level (1 kHz) was measured to be 83 dB.
Flatness of sound level frequency characteristics: ○

Third Comparative Example

Fifth Mobile Phone

Next, as the comparative example 3 of the thirtieth example 30, as in the case of each of the above examples, the piezoelectric actuator 62-2 of the second comparative example (see FIGS. 31A and 31B) was installed within the mobile phone 70. For evaluation, the sound pressure level and frequency characteristics were measured by a microphone disposed at a position being 10 cm away from the piezoelectric element (that is, piezoelectric actuator 62-2). Also, drop shock test was performed.

[Measurement Result]
Resonant frequency: 1520 Hz
Sound pressure level: 66 dB
Drop shock test: Crack in the piezoelectric element was observed after 2 times drop. At the time of the drop shock test, the sound pressure level was measured to be 50 dB or less.
Flatness of sound level frequency characteristics: X Forth Comparative Example Electromagnetic Actuator As the fourth comparative example, the acoustic element using the generally-used electromagnetic actuator was fabricated. Though such an acoustic element is publicly known and is not shown in drawings, the generally-used electromagnetic actuator is so configured that it has a permanent magnet, voice coil, and vibration plate where magnetic force is generated by supplying a current to the voice coil through an electric terminal and sound is produced by making the vibration plate absorb and repel the vibration by the generated magnetic force. The acoustic element fabricated here is 20 mm in outer diameter and 4.0 mm in thickness.

For evaluation, the sound pressure level and frequency characteristics were measured by a microphone disposed at a position being 30 cm away from the piezoelectric element configured as above.

[Measurement Result]
Resonant frequency: 810 Hz
Sound pressure level (1 kHz): 83 dB
Sound pressure level (3 kHz): 85 dB
Sound pressure level (5 kHz): 84 dB
Sound pressure level (10 kHz): 81 dB Thirty-First Example A laptop-type personal computer of the thirty-first example is described. As the thirty-first example, the laptop-type personal computer (not shown) on which the piezoelectric actuator 61-1 according to the first example was installed was fabricated. More specifically, as in the case of the mobile phone of the previous example, the piezoelectric actuator 61-1 was bonded to the side surface in the enclosure of the laptop-type personal computer.

For evaluation, the sound pressure level and frequency characteristics were measured by a microphone disposed at a position being 30 cm away from the piezoelectric element (piezoelectric actuator 61-1) configured as above. Moreover, the drop shock test was performed.

[Measurement Result]
Resonant frequency: 815 Hz
Sound pressure level (1 kHz): 81 dB
Sound pressure level (3 kHz): 85 dB
Sound pressure level (5 kHz): 89 dB
Sound pressure level (10 kHz): 84 dB
Drop shock test: No crack in the piezoelectric element was observed even after 5 times drop. After the drop shock test, the sound pressure level (1 kHz) was measured to be 80 dB.
Flatness of sound level frequency characteristics: X

CONCLUSION

As explained above, the piezoelectric actuator according to the exemplary embodiments of the present invention is made up of the piezoelectric element that expands and contracts according to the state of an electric field in which a vibration mode is changed by selectively disposing one or more reinforcement members in a region where a node of vibration occurs, divided vibration occurring in a high frequency band is suppressed. In the piezoelectric actuator configured as above, the divided vibration causing hills and valleys (peaks and dips) in the frequency sound pressure level can be effectively suppressed, which enables the realization of flat frequency sound pressure level characteristics and reproduction of excellent sound.

Moreover, the reinforcement member is disposed in accordance with the vibration mode of the piezoelectric element, which enables specified peaks or dips to be selectively suppressed and adjustment for desired acoustic characteristics to be realized. Furthermore, the region for the node of vibration in which stress concentrates at time of vibration is reinforced by members and, therefore, shock stability is improved at time of drop and reliability is improved. Also, only part of the piezoelectric actuator is reinforced and, therefore, whole changes in components and/or members or the like making up the actuator are not required, thus making it easy to manufacture the actuator. The improvement of acoustic characteristics is made possible at low costs and industrial application values are made large.

Moreover, the piezoelectric actuator according to the present invention includes the piezoelectric element that expands and contracts according to the state of an electric field, to the pedestal at least one surface of which the piezoelectric element is bonded, and support member to support the piezoelectric element and pedestal and wherein, in the piezoelectric actuator in which the piezoelectric element and pedestal vibrate in a thickness of the piezoelectric element in accordance with the expanding and contracting movements of the piezoelectric element, the pedestal is connected to the support member with the vibration film having stiffness lower than that of the pedestal interposed between the pedestal and support member. In the piezoelectric actuator configured as above, the pedestal is connected to the support member with the vibration film having stiffness being lower than that of the pedestal and the connecting portion between the pedestal and support member is liable to be deformed when compared with the portion of the pedestal and, therefore, the vibration amplitude can be improved. The fact that the connecting portion (vibration portion) is liable to be deformed means that the vibration becomes large in this portion and the vibration mode approaches more the piston-type vibration mode (vibration mode being the same as the electromagnetic actuator) when compared with the configurations of the related art accordingly.

The shock occurring at time of drop is absorbed by the vibration film interposed between the pedestal and support member and, therefore, the piezoelectric actuator according to the present invention can provide excellent drop shock stability and can be applied to mobile phones or the like. That is, the piezoelectric actuator according to the present invention can function as the acoustic element, as it is, without using an additional vibration film or the like.

The piezoelectric actuators of the above first to twenty-sixth examples exhibit flat frequency sound pressure level characteristics being close to the frequency characteristics in the fourth comparative example (electromagnetic actuator) and has high sound pressure levels in a wide frequency band of 1 to 10 kHz. On the other hand, in the piezoelectric actuator according to the second comparative example, sharp convex and concave portions are observed in its graph showing frequency characteristics. From this point of view, it has been demonstrated that, in the piezoelectric actuator according to the present invention, the frequency characteristics (that is, flatness of sound pressure level frequency characteristics) have been improved. Particularly, in each of the above examples, the resonant frequency f0 is lower than the basic resonant frequency f0 of the comparative examples, which means that it has been demonstrated that the frequency band of the acoustic element using the piezoelectric actuator according to the present invention has been expanded. In the examples 27, 28, 29, 30 in which the piezoelectric actuators of the present invention are installed in mobile phones, their basic resonant frequencies are lower than those of the third comparative example and the improvement of their sound pressure levels has been achieved.

Though various exemplary embodiments have been described in detail with reference to the figures, it is understood that the invention is not limited to these exemplary embodiments but may be changed and modified without departing from the scope and spirit of the invention.

INDUSTRIAL APPLICABILITY

By using the piezoelectric actuator according to the present invention, stable frequency sound level characteristics can be obtained in a wide frequency band and, therefore, the actuator can be widely used in high-quality acoustic devices.

The invention claimed is:
1. A piezoelectric actuator, comprising:
a piezoelectric element expanding and contracting according to a state of an electric field;
a reinforcement member to suppress divided vibration caused by driving of said piezoelectric element;
a pedestal bonded to at least one surface of said piezoelectric element;
a vibration film having stiffness lower than that of said pedestal to amplify amplitudes of vibration toward a direction of thicknesses of said piezoelectric element and said pedestal; and
a support member to support said piezoelectric element and said pedestal through said vibration film, with said pedestal disposed between said piezoelectric element and said vibration film,
wherein said reinforcement member is disposed on one surface of said vibration film, overlapping with neither of said pedestal and said piezoelectric element toward a direction of thicknesses of said vibration film, said direction of the thicknesses of said vibration film extending from a top surface of the piezoelectric actuator to a bottom surface of the piezoelectric actuator.

2. The piezoelectric actuator according to claim 1, wherein said reinforcement member is disposed in a region where a node of said divided vibration caused by driving of said piezoelectric actuator occurs.

3. The piezoelectric actuator according to claim 1, wherein said vibration film, said pedestal, said piezoelectric element, and said reinforcement member are formed in this order in a manner in which an area of each of these components becomes smaller.

4. The piezoelectric actuator according to claim 1, wherein said reinforcement member comprises a resin material or a metal material.

5. The piezoelectric actuator according to claim 1, wherein said reinforcement member comprises a same material as said one of said piezoelectric element, said pedestal, and said vibration film.

6. The piezoelectric actuator according to claim 1, wherein a material for said vibration film comprises a material having an elastic rate higher than that of said pedestal.

7. The piezoelectric actuator according to claim 1, wherein said vibration film comprises a resin material.

8. The piezoelectric actuator according to claim 6, wherein a material for said vibration film comprises one of a urethane film, polyethylene terephthalate film, and polyethylene film.

9. The piezoelectric actuator according to claim 1, wherein at least two pieces of said piezoelectric elements are stacked in a layer to form a bimorph-type piezoelectric element.

10. The piezoelectric actuator according to claim 1, wherein said piezoelectric element comprises a layered-type structure in which a piezoelectric material layer and an electrode layer are alternately stacked on one another.

11. An electronic device comprises the piezoelectric actuator stated in claim 1, as an acoustic element.

12. The piezoelectric actuator according to claim 1, wherein the reinforcement member, which is hollow in shape, is disposed in a region where a node of said divided vibration occurs.

13. The piezoelectric actuator according to claim 1, wherein a plurality of reinforcement members is disposed in a region where a node of said divided vibration occurs in a manner to be symmetric about a midpoint of said piezoelectric actuator.

14. The piezoelectric actuator according to claim 1, wherein a plurality of said reinforcement members is disposed in a region where a node of said divided vibration occurs in a manner to be asymmetric about a midpoint of said piezoelectric actuator.

15. The piezoelectric actuator according to claim 1, wherein the reinforcement member being semicircular and hollow in shape is disposed in a region where a node of said divided vibration occurs.

16. The piezoelectric actuator according to claim 1, wherein a plurality of said reinforcement members is disposed on both sides of said piezoelectric element and in a region where a node of said divided vibration occurs.

17. The piezoelectric actuator according to claim 4, wherein said reinforcement member comprises one selected from urethane, epoxy, acryl, polyimide, polycarbonate, polyethylene terephthalate, polyester, polypropylene, aluminum alloys, phosphor bronze, titanium, titanium alloys, iron-nickel alloys, copper-nickel alloys, and magnesium alloys.

18. The piezoelectric actuator according to claim 1, wherein said reinforcement member and said pedestal abut an upper surface of said vibration film.

19. A piezoelectric actuator, comprising:
a piezoelectric element expanding and contracting according to a state of an electric field;
a reinforcement member to suppress divided vibration caused by driving of said piezoelectric element;
a pedestal bonded to at least one surface of said piezoelectric element;
a vibration film having stiffness lower than that of said pedestal to amplify amplitudes of vibration toward a direction of thicknesses of said piezoelectric element and said pedestal; and
a support member to support said piezoelectric element and said pedestal through said vibration film, with said pedestal disposed between said piezoelectric element and said vibration film,
wherein said reinforcement member and said pedestal are disposed together on a same surface of said vibration film which comprises one of a bottom surface and a top surface of said vibration film, and
wherein said piezoelectric element is disposed on a surface of said pedestal which comprises one of a bottom surface and a top surface of said pedestal different from said same surface of said vibration film.

20. A piezoelectric actuator, comprising:
a piezoelectric element expanding and contracting according to a state of an electric field;
a reinforcement member to suppress divided vibration caused by driving of said piezoelectric element;
a pedestal bonded to at least one surface of said piezoelectric element;
a vibration film that amplifies amplitudes of vibration toward a direction of thicknesses of said piezoelectric element and said pedestal that is disposed between said piezoelectric element and said vibration film; and
a support member to support said piezoelectric element and said pedestal through said vibration film,
wherein said reinforcement member and said pedestal are disposed on a top surface of said vibration film, and
wherein said piezoelectric element is disposed on a top surface of said pedestal.

* * * * *